(12) United States Patent
Kubota et al.

(10) Patent No.: US 9,337,214 B2
(45) Date of Patent: May 10, 2016

(54) DISPLAY DEVICE

(71) Applicant: Semiconductor Energy Laboratory Co., Ltd., Atsugi-shi, Kanagawa-ken (JP)

(72) Inventors: Daisuke Kubota, Atsugi (JP); Ryo Hatsumi, Hadano (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/479,684

(22) Filed: Sep. 8, 2014

(65) Prior Publication Data

US 2015/0076492 A1 Mar. 19, 2015

(30) Foreign Application Priority Data

Sep. 13, 2013 (JP) .................................. 2013-190864
Dec. 3, 2013 (JP) .................................. 2013-249904
Mar. 11, 2014 (JP) .................................. 2014-047241
May 22, 2014 (JP) .................................. 2014-106477

(51) Int. Cl.
*H01L 27/12* (2006.01)
*G02F 1/1337* (2006.01)
*G02F 1/1343* (2006.01)
*G02F 1/1362* (2006.01)

(52) U.S. Cl.
CPC ............ *H01L 27/124* (2013.01); *G02F 1/1362* (2013.01); *G02F 1/133707* (2013.01); *G02F 1/134309* (2013.01); *H01L 27/1225* (2013.01); *H01L 27/1248* (2013.01)

(58) Field of Classification Search
CPC .............. G02F 1/134363; G02F 2001/134372; H01L 27/124; H01L 27/1248; H01L 27/1225
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 101900913 A 12/2010
CN 102062976 A 5/2011
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

Primary Examiner — Roy Potter
Assistant Examiner — Paul Patton
(74) Attorney, Agent, or Firm — Robinson Intellectual Property Law Office; Eric J. Robinson

(57) ABSTRACT

To provide a display device with excellent display quality, in a display device including a signal line, a scan line, a transistor, a pixel electrode, and a common electrode in a pixel, the common electrode is included in which an extending direction of a region overlapping with the signal line differs from an extending direction of a region overlapping with the pixel electrode in a planar shape and the extending directions intersect with each other between the signal line and the pixel electrode. Thus, a change in transmittance of the pixel can be suppressed; accordingly, flickers can be reduced.

18 Claims, 44 Drawing Sheets

(56) References Cited

U.S. PATENT DOCUMENTS

| | | |
|---|---|---|
| 6,281,953 B1 | 8/2001 | Lee et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,544,528 B2 | 6/2009 | Lee et al. |
| 7,674,650 B2 | 3/2010 | Akimoto et al. |
| 7,732,819 B2 | 6/2010 | Akimoto et al. |
| 7,902,558 B2 | 3/2011 | Lee et al. |
| 8,294,864 B2 | 10/2012 | Itou |
| 8,654,292 B2 | 2/2014 | Kubota et al. |
| 8,724,064 B2 | 5/2014 | Son et al. |
| 2001/0046027 A1 | 11/2001 | Tai et al. |
| 2002/0056838 A1* | 5/2002 | Ogawa ............... G02F 1/13439 257/59 |
| 2002/0132454 A1 | 9/2002 | Ohtsu et al. |
| 2002/0154262 A1* | 10/2002 | Yamakita ........... G02F 1/134363 349/141 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0001232 A1 | 1/2008 | Lee et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0279474 A1* | 11/2010 | Akimoto ............ H01L 29/7869 438/158 |
| 2010/0302492 A1 | 12/2010 | Kubota et al. |
| 2011/0109861 A1* | 5/2011 | Son .................. G02F 1/136209 349/141 |
| 2011/0216280 A1* | 9/2011 | Itou .................. G02F 1/134363 349/143 |
| 2012/0211745 A1 | 8/2012 | Ueda et al. |
| 2014/0034954 A1 | 2/2014 | Yamazaki et al. |
| 2014/0042443 A1 | 2/2014 | Yamazaki |
| 2014/0070209 A1 | 3/2014 | Yamazaki et al. |
| 2014/0160414 A1 | 6/2014 | Kubota et al. |
| 2014/0175432 A1 | 6/2014 | Yamazaki et al. |
| 2015/0062477 A1 | 3/2015 | Hatsumi et al. |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-089255 A | 3/2000 |
| JP | 2000-150900 A | 5/2000 |
| JP | 2000-310786 A | 11/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-015487 A | 1/2008 |
| JP | 2010-102284 A | 5/2010 |
| JP | 2011-008239 A | 1/2011 |
| JP | 2011-107678 A | 6/2011 |
| JP | 2011-186010 A | 9/2011 |
| KR | 2008-0003706 A | 1/2008 |
| KR | 2010-0129200 A | 12/2010 |
| KR | 2011-0052228 A | 5/2011 |
| TV | 201107820 | 3/2011 |

(56) References Cited

FOREIGN PATENT DOCUMENTS

| TW | 200805665 | 1/2008 |
|---|---|---|
| TW | 201116908 | 5/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.
Clark.S et al., "First Principles Methods Using Castep", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05; Technical Digest of International Electron Devices Meeting, Dec. 5, 2005, pp. 1067-1069.
Fortunato.E et al., "Wide-Bandgap High-Mobility ZnO Thin-Film Transistors Produced At Room Temperature", Appl. Phys. Lett. (Applied Physics Letters), Sep. 27, 2004, vol. 65, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters), 2005, vol. 87, pp. 122102-1-122102-3.
Jeong.J et al., "3,1: Distinguished Paper: 12.1-Inch WXGA Amoled Display Driven by Indium—Gallium—Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission Amoled Display on Plastic Film and its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Display of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YBFE2O4, and YB2FE3O7 Types of Structures for Compounds in the In2O3 and Sc2O3—A2O3—Bo Systems [A; Fe. Ga, or Al; B: Mg, Mn, Fe, Ni, Cu,or Zn] at Temperatures Over 1000° C", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO Systems", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=in,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y at al., "Amorphous Oxide TFT Backplanes for Large Size Amoled Displays", IDW '08 : Proceedings of the 6th International Display Workshops, Dec. 3, 2008, pp. 581-584.

(56) References Cited

OTHER PUBLICATIONS

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2; Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA Amoled Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA Amoled Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide Tfts and Their Application for Large Size Amoled", AM-FPD '08 Digest of Technical Papers, Jul. 2, 2008, pp. 275-278.

Park.J et al., "Dry etching of ZnO films and plasma-induced damage to optical properties", J. Vac. Sci, Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prism.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. Amoled Display.With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA Amoled Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2014/073271) Dated Dec. 2, 2014.

Written Opinion (Application No. PCT/JP2014/073271) Dated Dec. 2, 2014.

Amano.S et al., "Low Power Lc Display Using In-Ga-Zn-Oxide TFTs Based on Variable Frame Frequency", SID.

Hatsumi.R et al., "Driving Method of Ffs-Mode Os-LCD for Reducing Eye Strain", SID Digest '13 : SID.

* cited by examiner

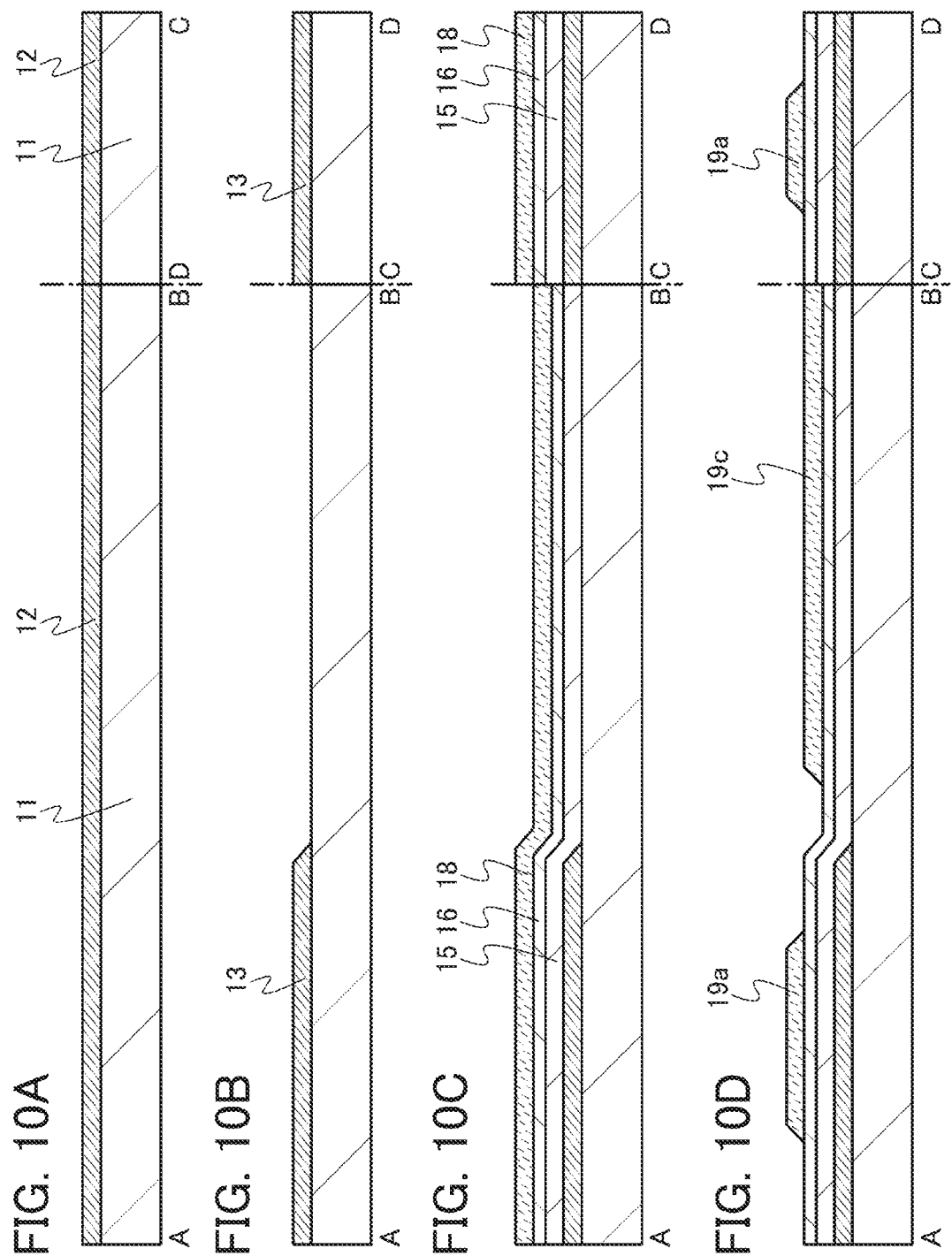

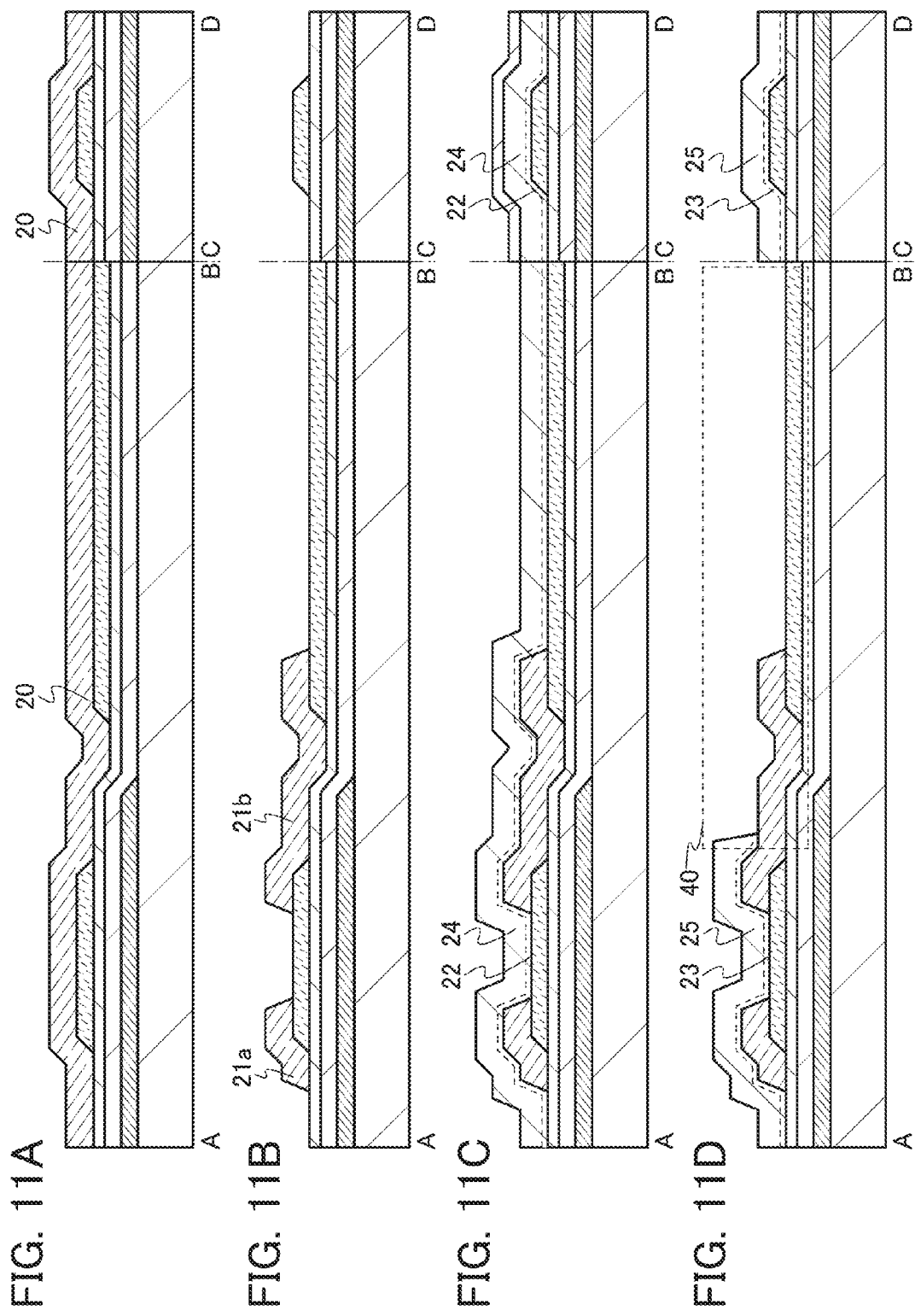

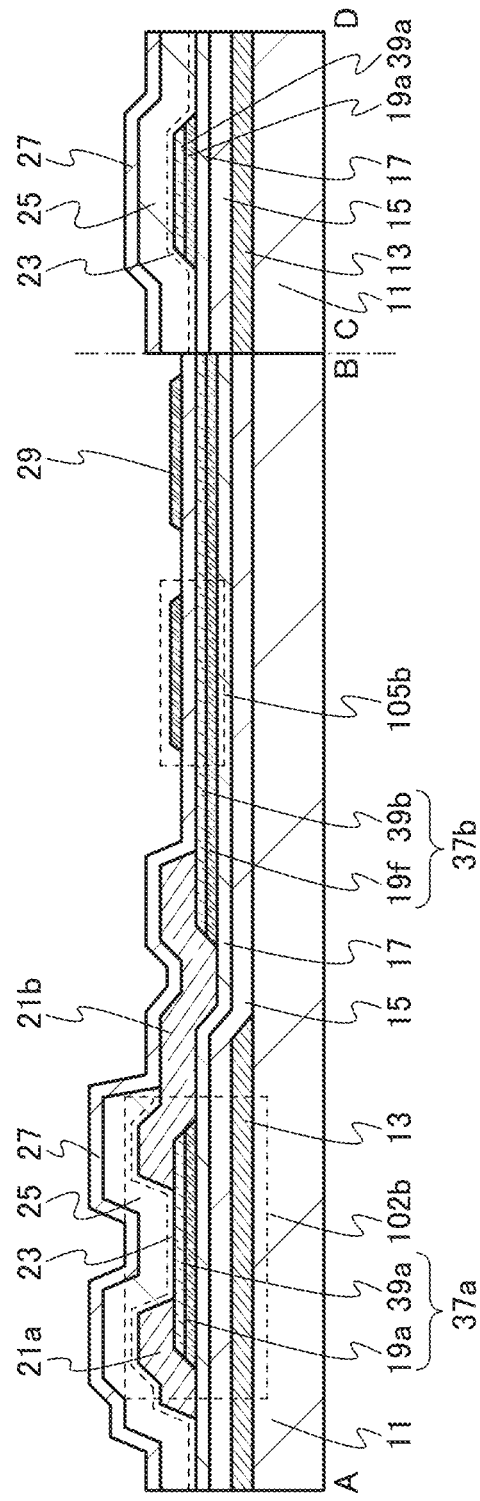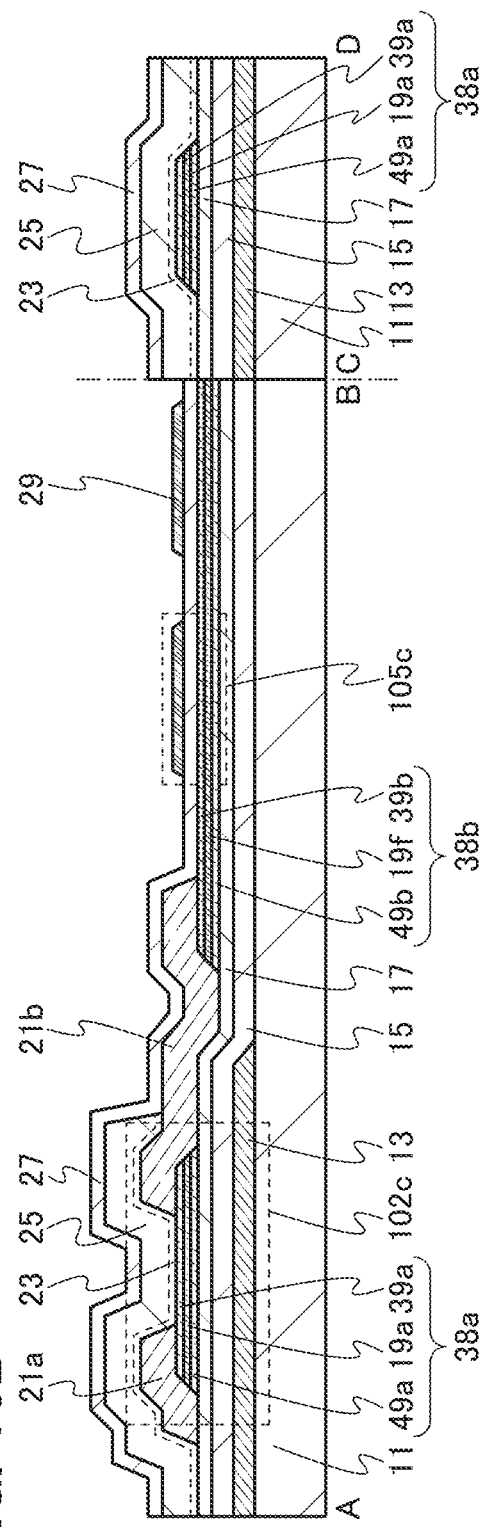

Signal line : 0 [V]

Signal line : 6 [V]

Signal line : 0 [V]

Signal line : 6 [V]

DISPLAY DEVICE

TECHNICAL FIELD

The present invention relates to an object, a method, or a manufacturing method. In addition, the present invention relates to a process, a machine, manufacture, or a composition of matter. One embodiment of the present invention particularly relates to a semiconductor device, a display device, a light-emitting device, a power storage device, a driving method thereof, or a manufacturing method thereof. Specifically, one embodiment of the present invention relates to a display device and a manufacturing method thereof.

BACKGROUND ART

In recent years, liquid crystal has been used for a variety of devices; in particular, a liquid crystal display device (liquid crystal display) having features of thinness and lightness has been used for displays in a wide range of fields.

As a method for applying an electric field to a liquid crystal included in a liquid crystal display device, a vertical electric field mode and a horizontal electric field mode can be given. As a horizontal electric field mode of a liquid crystal display panel, there are an in-plane switching (IPS) mode in which a pixel electrode and a common electrode are provided without overlapping with each other and a fringe field switching (FFS) mode in which a pixel electrode and a common electrode overlap with each other with an insulating film provided therebetween.

A liquid crystal display device of an FFS mode has a slit-shaped opening in a pixel electrode, and alignment of liquid crystal molecules is controlled by applying an electric field generated between the pixel electrode and a common electrode to the liquid crystal in the opening.

The liquid crystal display device of an FFS mode has a high aperture ratio, a wide viewing angle, and an effect of improving an image contrast, and has been widely used recently (see Patent Document 1).

In a display device, a displayed image is changed several tens of times per second. The number of times an image is changed per second is called a refresh rate. The refresh rate is also referred to as driving frequency. Such high-speed screen switching that is hard for human eyes to be recognized is considered as a cause of eye strain. Thus, Non-Patent Documents 1 and 2 have proposed that the refresh rate of an LCD is lowered to reduce the number of image rewriting operations. Moreover, driving with a lowered refresh rate enables the power consumption of the display device to be reduced.

REFERENCE

Patent Document

[Patent Document 1] Japanese Published Patent Application No. 2000-089255

Non-Patent Document

[Non-Patent Document 1] S. Amano et al., "Low Power LC Display Using In—Ga—Zn-Oxide TFTs Based On Variable Frame Frequency", *SID International Symposium Digest of Technical Papers,* 2010, pp 626-629

[Non-Patent Document 2] R. Hatsumi et al., "Driving Method of FFS-Mode OS-LCD for Reducing Eye Strain", *SID International Symposium Digest of Technical Papers.* 2013, pp 338-341

DISCLOSURE OF INVENTION

In a liquid crystal display device which is an example of a display device, a change in transmittance of a pixel in a period in which one image is held is preferably small. A change in voltage to be applied to a display element is reduced by maintaining charge stored between electrodes, so that transmittance of a pixel can be held.

Furthermore, in driving of the liquid crystal display device at a low refresh rate, when a change in transmittance of a pixel is larger than that allowed as a deviation in a gray scale for displaying one image, a user perceives a flicker of the image. That is, this results in a reduction in display quality of the display device.

Thus, an object of one embodiment of the present invention is to provide a display device with excellent display quality. Another object of one embodiment of the present invention is to provide a display device in which wiring delay due to parasitic capacitance is reduced. Another object of one embodiment of the present invention is to provide a display device with little light leakage and excellent contrast. Another object of one embodiment of the present invention is to provide a display device having a high aperture ratio and including a capacitor which can increase charge capacity. Another object of one embodiment of the present invention is to provide a display device with low power consumption. Another object of one embodiment of the present invention is to provide a display device including a transistor having excellent electrical characteristics. Another object of one embodiment of the present invention is to provide a novel display device. Another object of one embodiment of the present invention is to provide a method for manufacturing a display device having a high aperture ratio and a wide viewing angle in fewer steps. Another object of one embodiment of the present invention is to provide a novel method for manufacturing a display device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

According to one embodiment of the present invention, in a display device including a signal line, a scan line, a transistor, a pixel electrode, and a common electrode in a pixel, the common electrode is included in which an extending direction of a region overlapping with the signal line differs from an extending direction of a region overlapping with the pixel electrode in a planar shape and the extending directions intersect with each other between the signal line and the pixel electrode.

In the common electrode, the extending direction of the region overlapping with the signal line differs from the extending direction of the region overlapping with the pixel electrode and the extending directions intersect with each other between the signal line and the pixel electrode, whereby the direction of an electric field generated between the signal line and the common electrode intersects with the direction of an electric field generated between the pixel electrode and the common electrode. Thus, the alignment direction of first liquid crystal molecules provided in a region overlapping with the signal line differs from that of second liquid crystal molecules provided in a region overlapping with the pixel electrode; therefore, alignment of the first liquid crystal molecules and alignment of the second liquid crystal molecules are less likely to be affected by each other.

The alignment direction of the first liquid crystal molecules provided in the region overlapping with the signal line changes every time a different voltage is applied to the signal line. On the other hand, the second liquid crystal molecules provided in the region overlapping with the pixel electrode to which a constant voltage is applied are not affected by the change in the alignment direction of the first liquid crystal molecules and the second liquid crystal molecules align in a certain direction. Thus, a change in transmittance of the pixel can be suppressed; accordingly, flickers can be reduced.

According to another embodiment of the present invention, a display device includes a conductive film functioning as a signal line, a conductive film functioning as a scan line, a transistor, a pixel electrode, and a common electrode over an insulating surface. The transistor is electrically connected to the conductive film functioning as a signal line, the conductive film functioning as a scan line, and the pixel electrode. The common electrode includes a first region overlapping with the conductive film functioning as a signal line and a second region overlapping with the pixel electrode. The extending direction of the first region differs from the extending direction of the second region, an angle formed by the first region and the second region has a first angle in an upper surface shape, and an angle formed by the first region and a perpendicular of the conductive film functioning as a signal line has a second angle in the upper surface shape. The first angle is greater than 90° and less than 180°, the second angle is greater than 0° and less than 90°, and the sum of the first angle and the second angle is greater than 135° and less than 180°.

Note that the display device may include an oxide insulating film over the transistor and a nitride insulating film over the oxide insulating film, and the oxide insulating film may have an opening through which part of the pixel electrode is exposed.

Furthermore, the pixel electrodes are provided in matrix.

In the common electrode, the first regions and the second regions are alternately disposed in a direction parallel or substantially parallel to the conductive film functioning as a scan line. The common electrode may intersect with the conductive film functioning as a scan line and may include a region connected to the first region or the second region.

A semiconductor film and the pixel electrode are in contact with a gate insulating film. The semiconductor film and the pixel electrode include an In—Ga oxide film, an In—Zn oxide film, or an In-M-Zn oxide film (M is Al, Ga, Y, Zr, Sn, La, Ce, or Nd). The semiconductor film and the pixel electrode may have a multilayer structure including a first film and a second film, and the first film may differ from the second film in the atomic ratio of metal elements.

According to one embodiment of the present invention, a display device with excellent display quality can be provided. A display device in which wiring delay due to parasitic capacitance is reduced can be provided. A display device with little light leakage and excellent contrast can be provided. A display device having a high aperture ratio and including a capacitor which can increase charge capacity can be provided. A display device with low power consumption can be provided. A display device including a transistor having excellent electrical characteristics can be provided. A display device having a high aperture ratio and a wide viewing angle in fewer steps can be manufactured. A novel display device can be provided. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF DRAWINGS

FIGS. 10A to 10D are cross-sectional views illustrating one embodiment of a method for manufacturing a display device.

FIGS. 11A to 11D are cross-sectional views illustrating one embodiment of a method for manufacturing a display device.

FIGS. 16A and 16B are cross-sectional views illustrating one embodiment of a display device.

BEST MODE FOR CARRYING OUT THE INVENTION

Figure 1A:
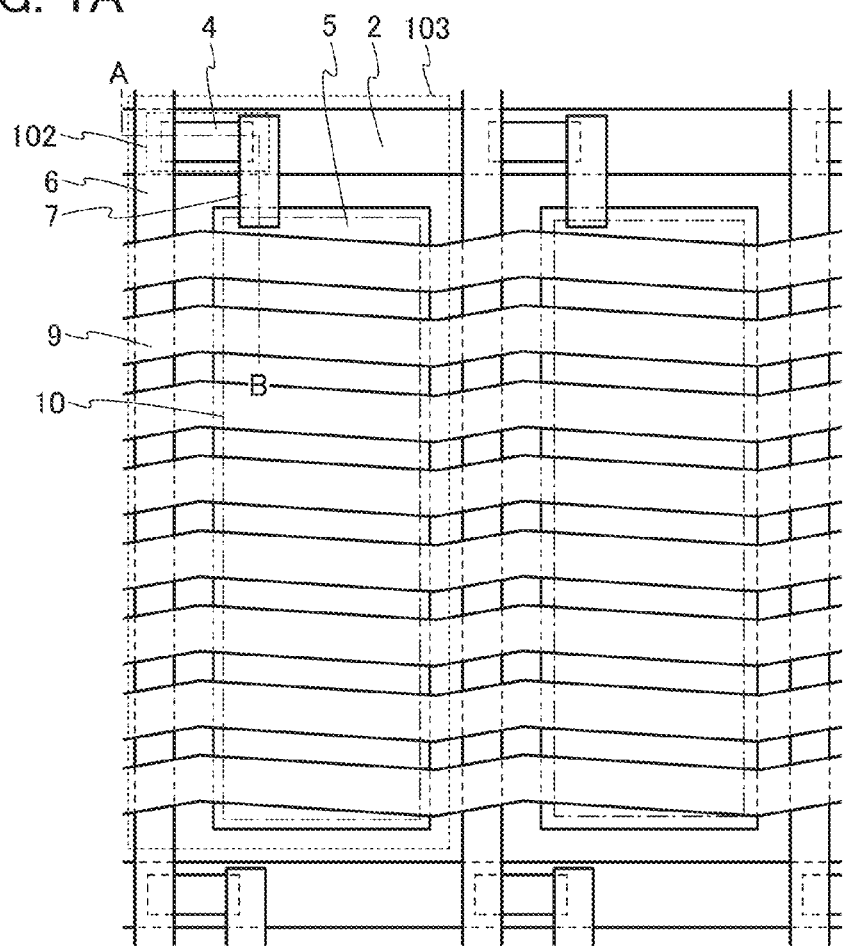
FIGS. 1A and 1B are a cross-sectional view and a top view illustrating one embodiment of a display device.

Embodiments and examples of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential is merely called a potential or a voltage, and a potential and a voltage are used as synonymous words in many cases. Thus, in this specification, a potential may be rephrased as a voltage and a voltage may be rephrased as a potential unless otherwise specified.

Note that in this specification and the like, the term "electrically connected" includes the case where components are connected through an object having any electric function. There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Embodiment 1

In this embodiment, a display device which is one embodiment of the present invention is described with reference to drawings.

Figure 1B:
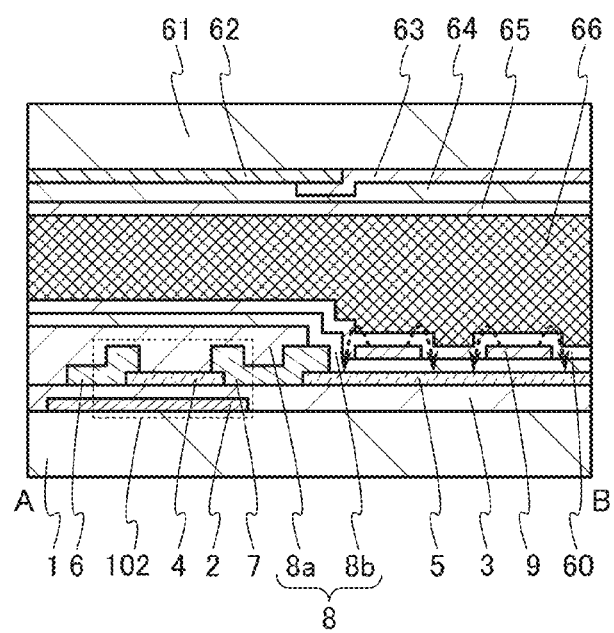

FIG. 1A is a top view of a pixel 103 of a display portion included in an FFS mode liquid crystal display device, and FIG. 1B is a cross-sectional view taken along dashed-dotted line A-B in FIG. 1A. In FIG. 1A, a substrate 1, an insulating film 3, an insulating film 8, an insulating film 60, a substrate 61, a light-blocking film 62, a coloring film 63, an insulating film 64, an insulating film 65, and a liquid crystal layer 66 are omitted.

As illustrated in FIGS. 1A and 1B, the FFS mode liquid crystal display device is an active matrix liquid crystal display device and includes a transistor 102 and a pixel electrode 5 in each pixel 103 provided in the display portion.

As illustrated in FIG. 1B, the liquid crystal display device includes the transistor 102 over the substrate 1, the pixel electrode 5 connected to the transistor 102, the insulating film 8 in contact with the transistor 102 and the pixel electrode 5, a common electrode 9 in contact with the insulating film 8, and the insulating film 60 which is in contact with the insulating film 8 and the common electrode 9 and functions as an alignment film.

In addition, the light-blocking film 62 and the coloring film 63 which are in contact with the substrate 61; the insulating film 64 which is in contact with the substrate 61, the light-blocking film 62, and the coloring film 63; and the insulating film 65 which is in contact with the insulating film 64 and functions as an alignment film are provided. The liquid crystal layer 66 is provided between the insulating film 60 and the insulating film 65. Note that although not illustrated, a polarizing plate is provided outside each of the substrate 1 and the substrate 61.

The transistor 102 can be a staggered transistor, an inverted staggered transistor, a coplanar transistor, or the like as appropriate. In addition, as the transistor 102, a FIN-type transistor in which a semiconductor film is surrounded with a gate insulating film and a gate electrode in a U shape can be used. In the case of an inverted staggered transistor, a channel-etched structure, a channel protective structure, or the like can be used as appropriate.

The transistor 102 in this embodiment is an inverted staggered transistor having a channel-etched structure. The transistor 102 includes a conductive film 2 functioning as a gate electrode over the substrate 1, the insulating film 3 functioning as a gate insulating film over the substrate 1 and the conductive film 2, a semiconductor film 4 overlapping with the conductive film 2 with the insulating film 3 provided therebetween, and a conductive film 6 and a conductive film 7 both in contact with the semiconductor film 4. The conductive film 2 functions as both a conductive film functioning as a scan line and a gate electrode. In other words, the gate electrode is part of the scan line. The conductive film 6 functions as both a conductive film functioning as a signal line and one of a source electrode and a drain electrode. In other words, one of the source electrode and the drain electrode is part of the signal line. The conductive film 7 functions as the other of the source electrode and the drain electrode. Accordingly, the transistor 102 is electrically connected to the conductive film 2 functioning as a scan line and the conductive film 6 functioning as a signal line. Although the conductive film 2 functions as the scan line and the gate electrode here, the gate electrode and the scan line may be separately formed. The conductive film 6 functions as both the signal line and the one of the source electrode and the drain electrode, but the signal line and the one of the source electrode and the drain electrode may be separately formed.

In the transistor 102, a semiconductor material such as silicon, silicon germanium, or an oxide semiconductor can be used as appropriate for the semiconductor film 4. The semiconductor film 4 can have as appropriate an amorphous structure, a microcrystalline structure, a polycrystalline structure, a single crystalline structure, or the like.

The pixel electrode 5 is provided over the insulating film 3 functioning as a gate insulating film. The pixel electrode 5 is connected to the conductive film 7. In other words, the pixel electrode 5 is electrically connected to the transistor 102.

As illustrated in FIG. 1A, the pixel electrode 5 is rectangular in the pixel 103. Since the display device of this embodiment is an active matrix liquid crystal display device, the pixel electrodes 5 are arranged in a matrix. The pixel electrode 5 and the common electrode 9 are each formed using a film having a light-transmitting property.

The shape of the pixel electrode 5 is not limited to a rectangular shape, and can be various shapes in accordance with the shape of the pixel 103. It is preferable that the pixel electrode 5 be widely formed in a region surrounded by the conductive film 2 functioning as a scan line and the conductive film 6 functioning as a signal line in the pixel 103. Thus, the aperture ratio of the pixel 103 can be increased.

The insulating film 8 is provided over the transistor 102 and the pixel electrode 5. Here, as the insulating film 8, an insulating film 8a covering the transistor 102 and having an opening (a dashed-dotted line 10 in FIG. 1A) through which the pixel electrode 5 is partly exposed and an insulating film 8b over the insulating film 8a and the pixel electrode 5 are illustrated. Note that as the insulating film 8, only the insulating film 8b or another insulating film having planarity may be provided instead of the insulating film 8a and the insulating film 8b.

The upper surface of the common electrode 9 may have a zigzag shape. When the direction of the common electrode 9 in which a repeating unit of the zigzag shape is repeated corresponds to the extending direction of the common electrode 9, the extending direction of the conductive film 6 functioning as a signal line intersects with the extending direction of the common electrode 9.

The upper surface of the common electrode 9 may have a wavy shape. When the direction of the common electrode 9 in which a repeating unit of the wavy shape is repeated corresponds to the extending direction of the common electrode 9, the extending direction of the conductive film 6 functioning as a signal line intersects with the extending direction of the common electrode 9.

An angle at which the extending direction of the common electrode 9 and the extending direction of the conductive film 6 functioning as a signal line intersect with each other is preferably greater than or equal to 45° and less than or equal to 135°. When the extending directions intersect with each other at the angle within the above range, flickers can be reduced.

In one pixel, the common electrode 9 has a stripe shape pattern. A parabolic electric field is generated between the pixel electrode 5 and the common electrode 9 as indicated by dashed arrows in FIG. 1B when voltage is applied to the pixel electrode 5. Accordingly, liquid crystal molecules included in the liquid crystal layer 66 can be aligned.

The pixel electrode provided in a pixel of an m-th row and an n-th column is provided between a conductive film functioning as a signal line in an n-th column and a conductive film functioning as a signal line in an (n+1)-th column. The common electrode 9 preferably has bent portions between the pixel electrode and the conductive film functioning as a signal line in the n-th column and between the pixel electrode and the conductive film functioning as a signal line in the (n+1)-th column. Accordingly, in the common electrode 9, the directions intersecting with the conductive film 6 functioning as a signal line in each column are parallel or substantially parallel to one another. Then, the directions intersecting with the pixel electrode 5 in each pixel are parallel or substantially parallel to one another. Accordingly, the shape of the common electrode 9 in one pixel is the same or substantially the same as that in another pixel; therefore, irregularity in alignment of liquid crystal molecules in each pixel can be reduced.

Figure 2A:
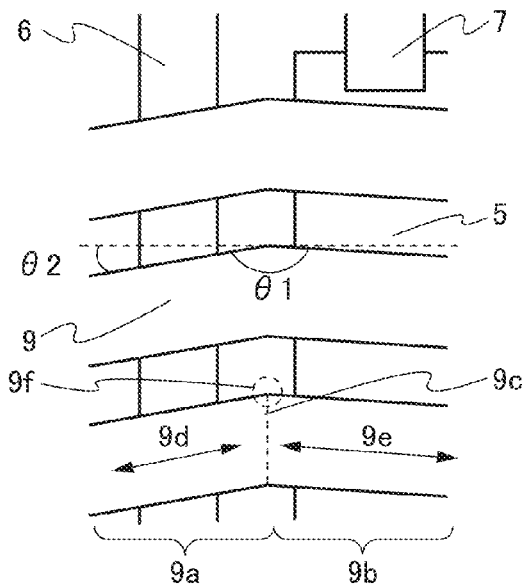
FIGS. 2A to 2D are top views each illustrating one embodiment of a display device.

Here, the planar shape of the common electrode 9 is described in detail with reference to FIG. 2A. FIGS. 2A to 2D are enlarged top views each in the vicinities of the conductive film 6 functioning as a signal line and the pixel electrode 5.

The common electrode 9 includes a first region 9a and a second region 9b. In one pixel, a plurality of first regions 9a and a plurality of second regions 9b are provided. Moreover, in the one pixel, the plurality of first regions 9a are arranged parallel or substantially parallel to each other, and the plurality of second regions 9b are arranged parallel or substantially parallel to each other. In the common electrode 9, the first region 9a and the second region 9b are connected to each other at a connection portion 9c. The first region 9a partly overlaps with the conductive film 6 functioning as a signal line, and the second region 9b partly overlaps with the pixel electrode 5. In the planar shape, the connection portion 9c is located between the conductive film 6 functioning as a signal line and the pixel electrode 5. Note that the connection portion 9c may overlap with one or more of an end portion of the pixel electrode 5 and an end portion of the conductive film 6 functioning as a signal line. The first regions 9a and the second regions 9b are alternately provided in a direction intersecting with the conductive film 6 functioning as a signal line.

The first region 9a extends in a first direction 9d, and the second region 9b extends in a second direction 9e. The first direction 9d and the second direction 9e are different directions and intersect with each other.

In the planar shape of the common electrode 9, a bent portion 9f is located between the conductive film 6 functioning as a signal line and the pixel electrode 5. Note that the bent portion 9f may overlap with one or more of the end portion of the pixel electrode 5 and the end portion of the conductive film 6 functioning as a signal line.

An angle between the first region 9a and the second region 9b, that is, the angle between the first direction 9d and the second direction 9e, in other words, the angle θ1 of the bent portion 9f is greater than 90° and less than 180°, preferably greater than 135° and less than 180°.

An angle between the first region 9a and a perpendicular of the conductive film 6 functioning as a signal line (illustrated in a dashed line in FIG. 2A), that is, the angle between the extending direction of the first region 9a and the perpendicular of the conductive film 6 functioning as a signal line, in other words, the angle θ2 at the bent portion 9f between the first region 9a and the conductive film 6 functioning as a signal line is greater than 0° and less than 90°, preferably greater than 0° and less than 45°.

Within the above ranges of the angle θ1 and the angle θ2, the alignment direction of the liquid crystal molecules provided in the first region 9a and the alignment direction of liquid crystal molecules provided in the second region 9b can be made different at the time of voltage application. When the alignment direction is different, the alignment state in the first region 9a and the alignment state in the second region 9b which are generated by a wiring potential are less likely to affect each other. That is, the alignment state in the second region 9b is less likely to be affected by the alignment state in the first region 9a generated by the wiring potential. Thus, the pixel electrode 5 can be made to be less likely to be affected by the electric field generated between the conductive film 6 functioning as a signal line and the common electrode 9, and flickers can be reduced.

When the common electrode 9 has a stripe shape within the above range of the angle θ2, the common electrode 9 extends in a direction intersecting with the conductive film 6 functioning as a signal line. Thus, an area overlapping with the conductive film 6 functioning as a signal line and parasitic capacitance between the common electrode 9 and the conductive film 7 can be reduced. When the angle θ2 is greater than or equal to 45°, the common electrode 9 gets narrower and has higher resistance; therefore, the angle θ2 is preferably less than 45°.

The sum of the angle θ1 and the angle θ2 is greater than or equal to 135° and less than 180°.

When the sum of the angle θ1 and the angle θ2 is within the above range, the directions which the first region 9a of the common electrode 9 intersects with the conductive film 6 functioning as a signal line in each column are parallel or substantially parallel to one another. The directions which the second region 9b of the common electrode 9 intersects with the pixel electrode 5 in each pixel are parallel or substantially parallel to one another. Accordingly, the shape of the common electrode 9 in one pixel is the same or substantially the same as that in another pixel; therefore, irregularity in alignment of liquid crystal molecules in each pixel can be reduced.

In a region where the pixel electrode 5 and the common electrode 9 overlap with each other, the pixel electrode 5, the insulating film 8b, and the common electrode 9 form a capacitor. Since the pixel electrode 5 and the common electrode 9 are each formed using a film having a light-transmitting property, the aperture ratio and the capacitance of the capacitor can be increased. Furthermore, when the insulating film 8b provided between the pixel electrode 5 and the common electrode 9 is formed using a material having a high dielectric constant, a large amount of charges can be accumulated in the capacitor. As the material having a high dielectric constant, silicon nitride, aluminum oxide, gallium oxide, yttrium oxide, hafnium oxide, hafnium silicate ($HfSiO_x$), hafnium silicate to which nitrogen is added ($HfSi_xO_yN_z$), hafnium aluminate to which nitrogen is added ($HfAl_xO_yN_z$), or the like can be given.

The light-blocking film 62 functions as a black matrix. The coloring film 63 functions as a color filter. The coloring film 63 is not necessarily provided in the case where the liquid crystal display device is a monochrome display device, for example.

The coloring film 63 is a coloring film that transmits light in a specific wavelength range. For example, a red (R) film for transmitting light in a red wavelength range, a green (G) film for transmitting light in a green wavelength range, a blue (B) film for transmitting light in a blue wavelength range, or the like can be used.

The light-blocking film 62 preferably has a function of blocking light in a specific wavelength range, and can be a metal film or an organic insulating film including a black pigment or the like, for example.

The insulating film 65 functions as a planarization layer or suppresses diffusion of impurities in the coloring film 63 to the liquid crystal element side.

Although not illustrated, a sealant is provided between the substrate 1 and the substrate 61. The liquid crystal layer 66 is enclosed by the substrate 1, the substrate 61, and the sealant. A spacer for keeping the thickness of the liquid crystal layer 66 (also referred to as a cell gap) may be provided between the insulating film 60 and the insulating film 64.

Next, a method for driving the liquid crystal display device of this embodiment is described with reference to FIGS. 2A to 2D.

A method for driving a display element in a pixel, in which black display in an initial state is turned into white display by application of voltage to a pixel electrode, i.e., a method for driving a display element of a normally black mode, is described. Note that a display element here is the pixel electrode 5, the common electrode 9, and a liquid crystal molecule included in the liquid crystal layer 66. Although a method for driving a display element of a normally black mode is described in this embodiment, a method for driving a display element of a normally white mode can be used as appropriate.

In the case of black display, voltage at which a transistor is turned on is applied to the conductive film functioning as a scan line, and 0 V is applied to the conductive film functioning as a single line and the common electrode. As a result, 0 V is applied to the pixel electrode. In other words, an electric field is not generated between the pixel electrode and the common electrode, and thus liquid crystal molecules do not operate.

In the case of white display, voltage at which a transistor is turned on is applied to the conductive film functioning as a scan line, voltage at which liquid crystal molecules operate, e.g., 6 V, is applied to the conductive film functioning as a signal line, and 0 V is applied to a common electrode. As a result, 6 V is applied to the pixel electrode. In other words, an electric field is generated between the pixel electrode and the common electrode, and thus the liquid crystal molecules operate.

Here, description is made using a negative liquid crystal material. The liquid crystal molecules are aligned in a direction parallel or substantially parallel to the conductive film functioning as a signal line in an initial state. The alignment of the liquid crystal molecules in an initial state is referred to as initial alignment. The liquid crystal molecules rotate in a plane parallel to a substrate by application of voltage between the pixel electrode and the common electrode. Although the negative liquid crystal material is used in this embodiment, a positive liquid crystal material can be used as appropriate.

The polarizing plate is provided outside each of the substrate 1 and the substrate 61 in FIG. 1B. A polarizer of the polarizing plate provided outside the substrate 1 and a polarizer of the polarizing plate provided outside the substrate 61 are placed to intersect with each other at right angles, that is, placed in a crossed Nicols state. Therefore, when the liquid crystal molecules are aligned in a direction parallel to the conductive film 2 functioning as a scan line and the conductive film 6 functioning as a signal line, light is absorbed by the polarizing plates and black is displayed. Although the description is made using the polarizing plates in a crossed Nicols state in this embodiment, polarizing plates in a parallel Nicols state can be used as appropriate.

Here, description is made on electric fields generated between the conductive film 6 functioning as a signal line and the common electrode 9 and between the pixel electrode 5 and the common electrode 9 in the case where different voltages are applied to the pixel electrode 5 and the common electrode 9. In the first region 9a of the common electrode 9, an electric field F1a indicated by a broken line arrow in FIG. 2B is generated between the conductive film 6 functioning as a signal line and the common electrode 9, and in the second region 9b of the common electrode 9, an electric field F1b indicated by a broken line arrow therein is generated between the pixel electrode 5 and the common electrode 9.

The directions of the electric field F1a and the electric field F1b are different. In other words, the directions of the electric fields differ in the first region 9a and the second region 9b and further the difference between the directions of the electric field is large. Thus, alignment of liquid crystal molecules in the first region 9a and alignment of liquid crystal molecules in the second region 9b are not easily affected by each other.

Generally, a liquid crystal display device having a low refresh rate has a retention period and a refresh period. Here, description is made with reference to FIG. 2D. The retention period is a period during which 0 V or an arbitrary fixed potential is applied to the conductive film 6 functioning as a signal line to retain the potential of the pixel electrode 5. The refresh period is a period during which a writing voltage is applied to the conductive film 6 functioning as a signal line to rewrite (refresh) the potential of the pixel electrode 5. During the refresh period and the retention period, different voltages are thus applied to the conductive film 6 functioning as a signal line. Thus, alignment of liquid crystal molecules in the vicinity of the conductive film 6 functioning as a signal line differs between the refresh period and the retention period. Therefore, the alignment state of the liquid crystal molecules in the second region 9b which is generated by an electric field between the pixel electrodes 5 provided in adjacent pixels and the common electrode 9 is affected in a different manner by liquid crystal molecules in the vicinity of the conductive film 6 functioning as a signal line in the refresh period and the retention period. Thus, the transmittance of the pixels is changed, resulting in a flicker.

Figure 2B:
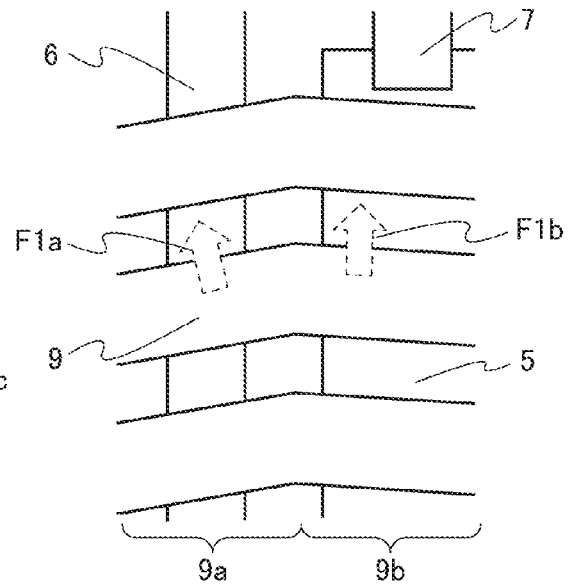

However, since the directions of the electric fields differs in the first region 9a and the second region 9b with the use of the common electrode having the shape shown in this embodiment, the alignment state of the liquid crystal molecules in the vicinity of the conductive film 6 functioning as a signal line and the alignment state of the liquid crystal molecules in the vicinity of the pixel electrode 5 which is generated by an electric field between the pixel electrodes 5 provided in adjacent pixels and the common electrode 9 are less likely to be affected by each other as illustrated in FIG. 2B. Thus, a change in the transmittance of the pixels is suppressed. Accordingly, flickers in an image can be reduced.

Figure 2C:
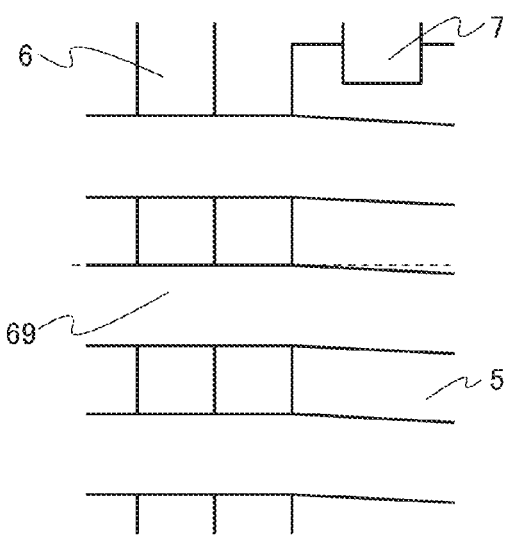

Here, as a comparison example, FIG. 2C illustrates an example in which a region of a common electrode 69 which overlaps with the conductive film 6 functioning as a signal line extends parallel to the perpendicular of the conductive film 7 (indicated by a broken line in FIG. 2C). The common electrode 69 has a predetermined angle between a region overlapping with the pixel electrode 5 and the perpendicular of the conductive film 7. Note that in the common electrode 69, the region overlapping with the pixel electrode 5 may be parallel to the perpendicular of the conductive film 7.

Figure 2D:
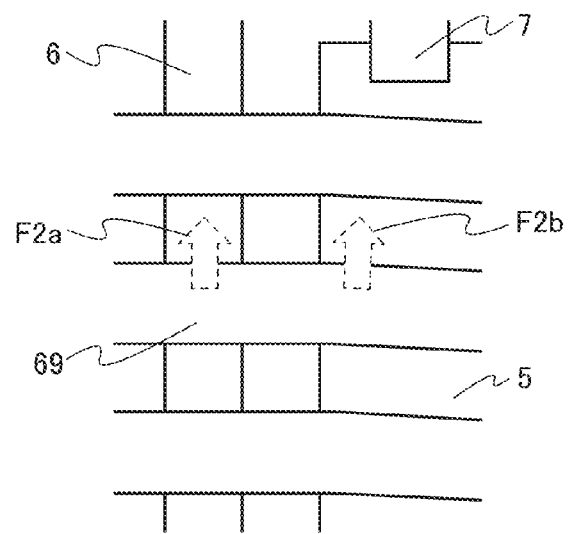

Here, with reference to FIG. 2D, description is made on an electric field generated between the pixel electrode 5 and the common electrode 69 in FIG. 2C in the case where different voltages are applied to the pixel electrode 5 and the common electrode 69. In the common electrode 69, in a region overlapping with the conductive film 6 functioning as a signal line, an electric field F2a indicated by a broken line arrow in FIG. 2D is generated between the conductive film 6 functioning as a signal line and the common electrode 69, and in the region overlapping with the pixel electrode 5, an electric field F2b indicated by a broken line arrow therein is generated between the pixel electrode 5 and the common electrode 69.

The directions of the electric field F2a and the electric field F2b are different; however, the difference between the directions of the electric fields is small. Thus, a liquid crystal molecule in a region overlapping with the conductive film 6 functioning as a signal line is likely to be affected by the voltages of the conductive film functioning as a signal line and pixel electrodes in adjacent pixels and has a mono-domain structure. Thus, a flicker is generated in an image. Particularly when the signal line and the common electrode are perpendicularly intersect with each other, the rotating direction of liquid crystal molecules is not specified; therefore, the alignment state of the liquid crystal molecules in the vicinity of the pixel electrode is easily affected by liquid crystal molecules in the vicinity of the conductive film 6 functioning as a signal line; accordingly, a flicker is generated easily.

Accordingly, a display device having a zigzag-shaped common electrode like the common electrode 9 described in this embodiment has few flickers and is a display device with excellent display quality.

Next, an effect in that the common electrode 9 has a stripe shape is described with reference to FIGS. 3A and 3B.

Figure 3A:
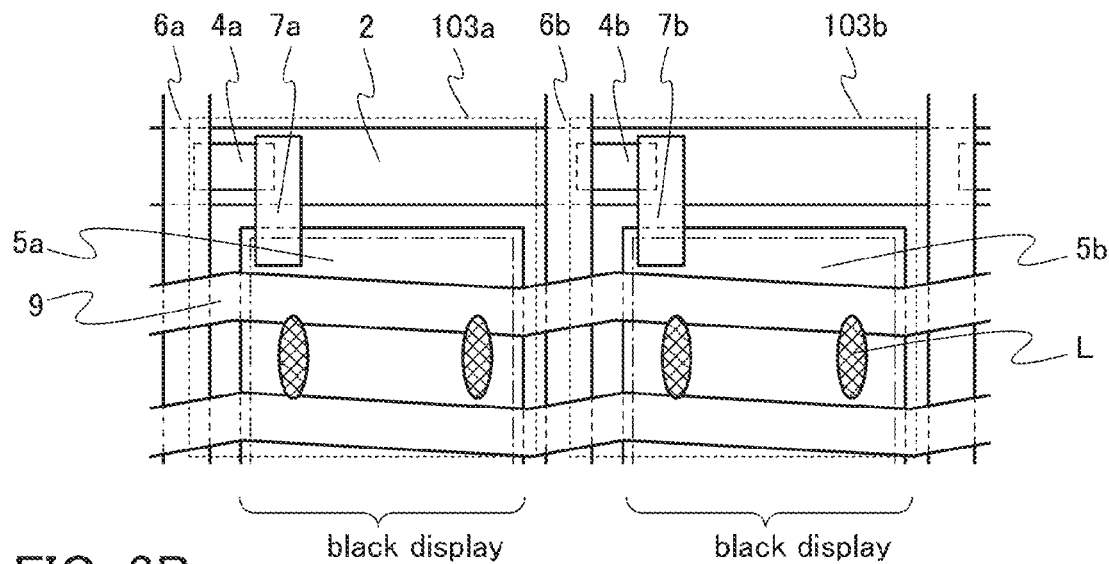
FIGS. 3A and 3B are top views illustrating one embodiment of a display device.
Figure 3B:
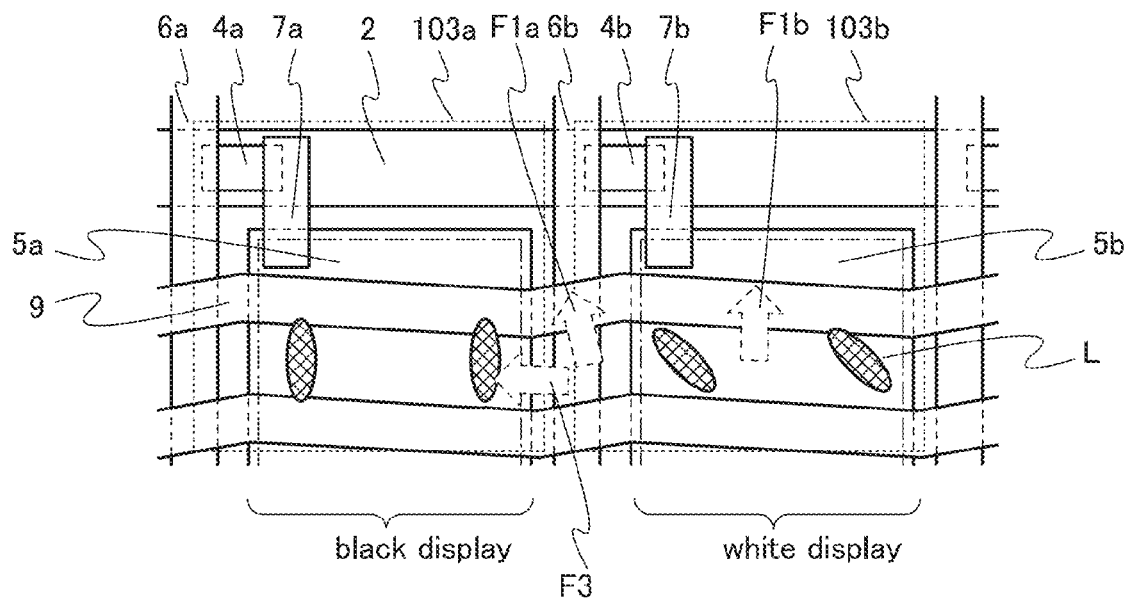

FIGS. 3A and 3B are each a top view of pixels included in the pixel portion of the FFS mode liquid crystal display device. In each of FIGS. 3A and 3B, two adjacent pixels 103a and 103b are illustrated.

The pixel 103a includes the conductive film 2 functioning as a scan line, a semiconductor film 4a, a conductive film 6a functioning as a signal line, a conductive film 7a, a pixel electrode 5a, and the common electrode 9. The pixel 103b includes the conductive film 2 functioning as a scan line, a semiconductor film 4b, a conductive film 6b functioning as a signal line, a conductive film 7b, a pixel electrode 5b, and the common electrode 9.

In FIGS. 3A and 3B, the upper surface of the common electrode 9 has a zigzag shape and extends in a direction intersecting with the conductive films 6a and 6b functioning as a signal lines. In other words, the common electrode 9 is laid across the pixels 103a and 103b.

FIG. 3A illustrates an initial state (black display), and FIG. 3B illustrates a driving state.

In the pixels 103a and 103b in each of FIGS. 3A and 3B, the common electrode 9 extends in a direction intersecting with the conductive films 6a and 6b functioning as signal lines; therefore, liquid crystal molecules L are aligned in a direction parallel or substantially parallel to the conductive films 6a and 6b functioning as signal lines in an initial state (black display).

Next, the case where the pixel 103a performs black display and the pixel 103b performs white display, as in FIG. 3B, is described. To the common electrode 9 and the conductive film 6a functioning as a signal line, 0 V is applied. To the conductive film 6b functioning as a signal line, 6 V is applied. As a result, 6 V is applied to the pixel electrode 5b in the pixel 103b, an electric field F1a indicated by a broken line arrow in FIG. 3B is generated between the conductive film 6b functioning as a signal line and the common electrode 9, an electric field F1b indicated by a broken line arrow therein is generated between the pixel electrode 5 and the common electrode 9, and the liquid crystal molecules L are aligned accordingly. Here, the liquid crystal molecules L rotate by 45°.

The pixel electrode 5a is at 0 V in the pixel 103a and the conductive film 6b functioning as a signal line, which is provided in the vicinity of the pixel electrode 5a, is at 6 V. However, since the common electrode 9 and the conductive film 6b functioning as a signal line intersect with each other, an electric field F3 is generated between the pixel electrode 5a and the conductive film 6b functioning as a signal line. The direction of the electric field F3 is substantially perpendicular to that of initial alignment of liquid crystal molecules. Here, since a negative liquid crystal material is used, the liquid crystal molecules L do not operate easily and thus flickers can be suppressed even when the electric field F3 is generated.

Accordingly, in the liquid crystal display device having the common electrode described in this embodiment, differences in directions between the electric field between the conductive film functioning as a signal line and the common electrode and the electric field between the pixel electrode and the common electrode arise and the differences form a large angle. Therefore, the liquid crystal molecules provided in the vicinity of the conductive film functioning as a signal line are less likely to be affected by the voltages of pixel electrodes of adjacent pixels and the conductive film functioning as a signal line, so that alignment disorder of liquid crystal molecules can be reduced.

In the liquid crystal display device having a low refresh rate, alignment of liquid crystal molecules in the vicinity of the conductive film 6 functioning as a signal line is less likely to be affected by the electric field between the pixel electrodes in the adjacent pixels and the common electrode even during the retention period. Thus, the transmittance of the pixels in the retention period can be held and flickers can be reduced.

Furthermore, when a common electrode extending in a direction intersecting with the conductive film functioning as a signal line is provided, the liquid crystal display device can have little light leakage and excellent contrast.

The common electrode of this embodiment is not formed over the entire surface of the substrate. Therefore, a region where the common electrode overlaps with the conductive films functioning as signal lines can be reduced and thus parasitic capacitance generated between the conductive film functioning as a signal line and the common electrode can be reduced. As a result, wiring delay can be reduced in a display device formed using a large substrate.

Note that the structures, methods, and the like described in this embodiment can be used as appropriate in combination with any of the structures, methods, and the like described in the other embodiments.

Modification Example 1

A modification example of the liquid crystal display device in FIGS. 1A and 1B is described with reference to FIG. 4. The liquid crystal display device illustrated in FIG. 4 includes a conductive film 67 on the substrate 61. Specifically, the conductive film 67 is provided between the insulating film 64 and the insulating film 65.

The conductive film 67 is formed using a light-transmitting conductive film. The potential of the conductive film 67 is preferably the same as that of the common electrode 9. In other words, a common potential is preferably applied to the conductive film 67.

When a voltage for driving the liquid crystal molecules is applied to the conductive film 6, an electric field is generated between the conductive film 6 and the common electrode 9. The electric field is a vertical electric field. In an FFS mode, liquid crystal molecules align in a direction parallel to the substrate owing to a horizontal electric field. However, when a vertical electric field is generated, liquid crystal molecules between the conductive film 6 and the common electrode 9 align in a direction perpendicular to the substrate due to the effect of the vertical electric field and thus a flicker is generated.

However, it is possible to suppress an alignment change of liquid crystal molecules in a direction perpendicular to the substrate due to an electric field between the conductive film 6 and the common electrode 9 in such a manner that the conductive film 67 is provided on the side facing the common electrode 9 through the liquid crystal layer 66 so that the common electrode 9 and the conductive film 67 have the same potential. Accordingly, the alignment state of the liquid crystal molecules in the region is stabilized. Thus, flickers can be reduced.

Modification Example 2

Figure 6:
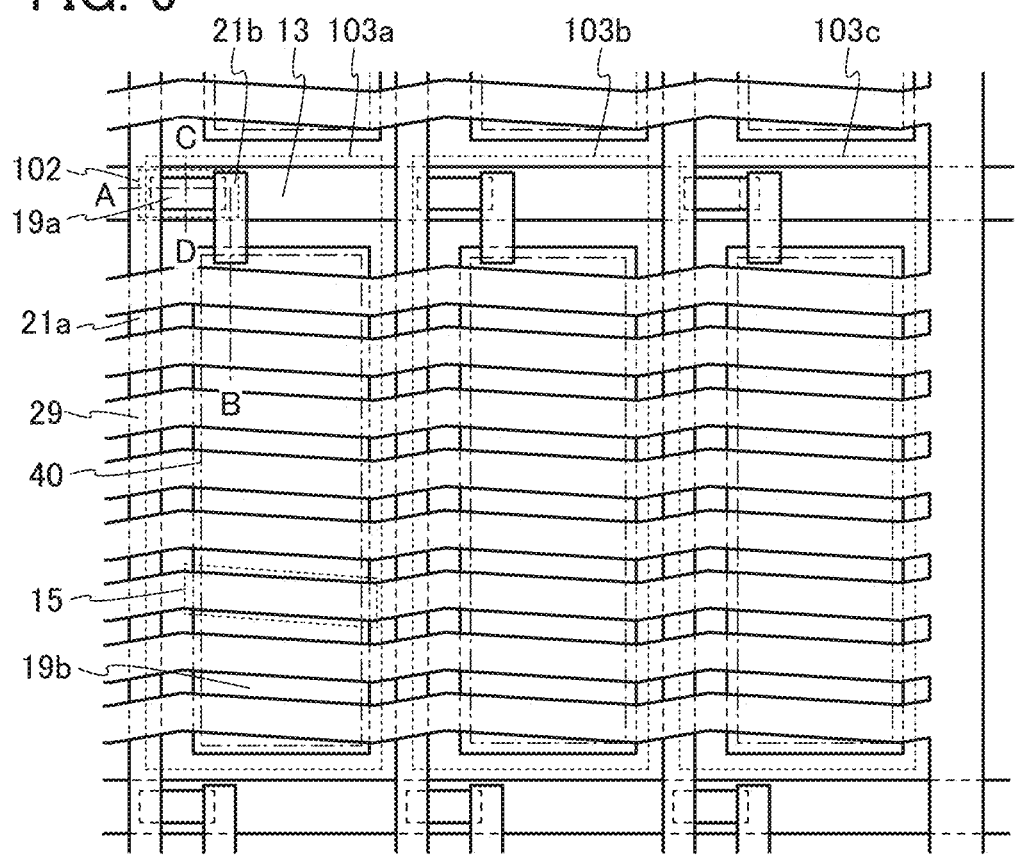
FIG. 6 is a top view illustrating one embodiment of a display device.

In a common electrode 29 illustrated in FIG. 6, a first region and a second region are connected to each other. The first region has a stripe shape, is bent in a zigzag state, and intersects with an extending direction of a conductive film 21a functioning as a signal line. The second region is a region extending in a direction parallel or substantially parallel to the conductive film 21a functioning as a signal line. The common electrode 29 in FIG. 6 does not overlap with the conductive film 21a functioning as a signal line; therefore, parasitic capacitance of the common electrode 29 can be reduced.

However, the second region does not serve as a display region. Therefore, areas of the pixel 103a, the pixel 103b, and a pixel 103c get smaller, resulting in a low aperture ratio.

Figure 28:
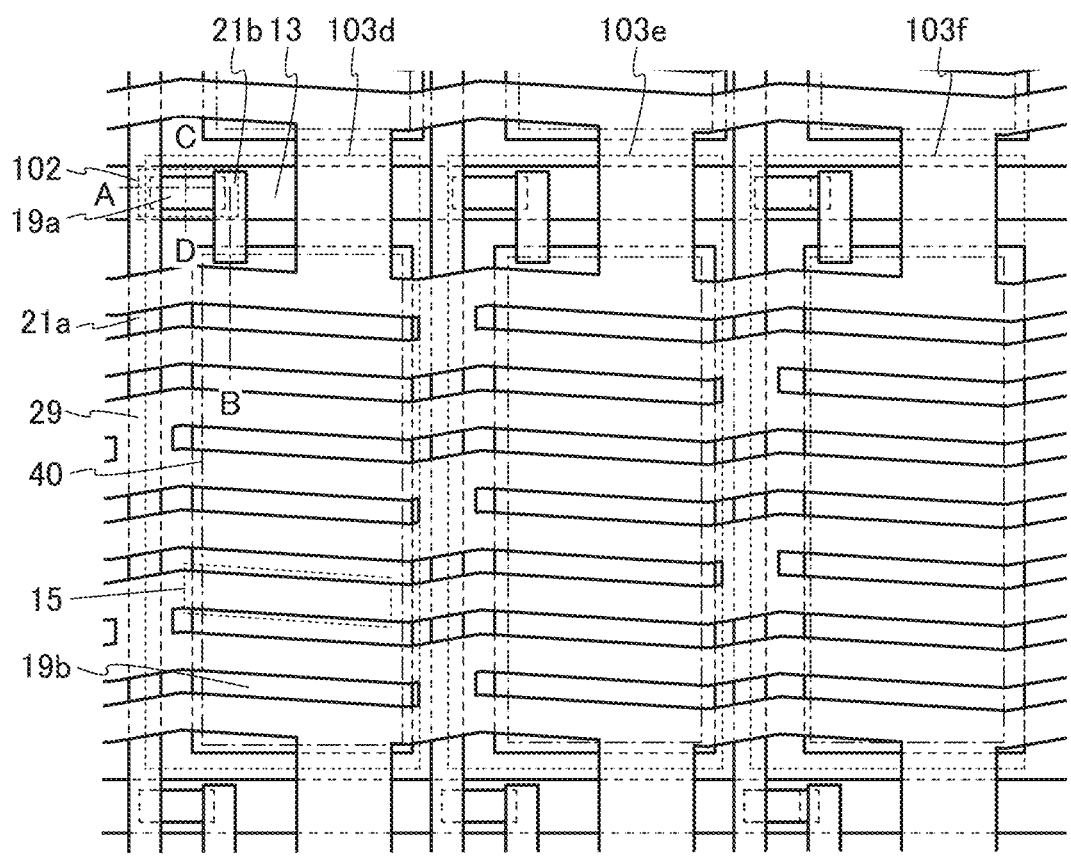
FIG. 28 is a top view illustrating one embodiment of a display device.

Thus, areas of a pixel 103d, a pixel 103e, and a pixel 103f can be increased by providing the second region connected to the first region over the conductive film 21a functioning as a signal line as in the common electrode 29 illustrated in FIG. 28. Note that the second region does not extend in a direction parallel or substantially parallel to the conductive film 21a functioning as a signal line and overlaps with part of the conductive film 21a. Accordingly, parasitic capacitance generated between the conductive film 21a functioning as a signal line and the common electrode 29 can be reduced, and the areas and the aperture ratios of the pixels can be reduced. Note that the pixels in FIG. 28 can have aperture ratios of 50% or more, for example, 50.8%.

Note that in the common electrode 29 in FIG. 28, the second region is regularly bonded to the first region but may be randomly connected to the first region.

Note that the structures, methods, and the like described in this embodiment can be used as appropriate in combination with any of the structures, methods, and the like described in the other embodiments.

Embodiment 2

In this embodiment, a display device which is one embodiment of the present invention is described with reference to drawings. In addition, in this embodiment, an oxide semiconductor film is used as a semiconductor film included in a transistor.

Figure 5A:
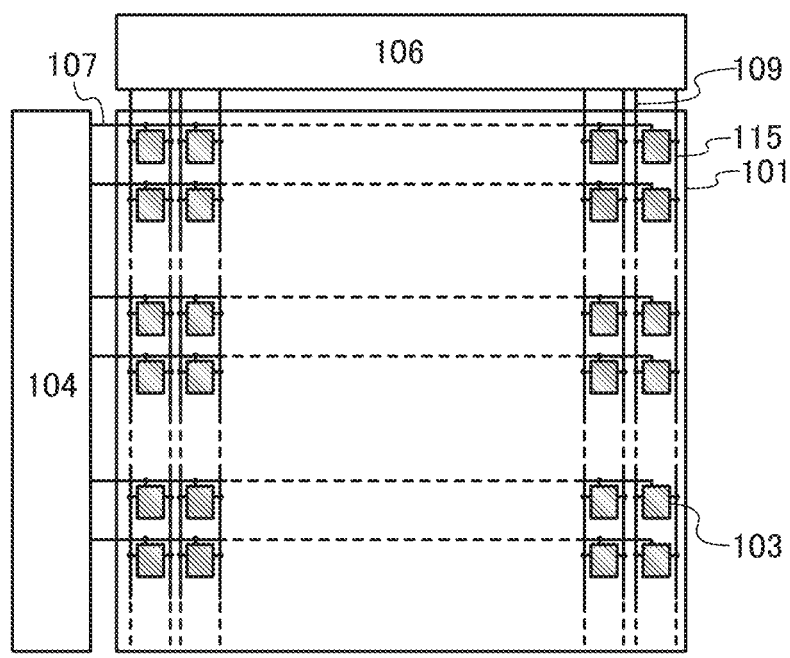
FIGS. 5A and 5B are a block diagram and a circuit diagram illustrating one embodiment of a display device.

A display device illustrated in FIG. 5A includes a pixel portion 101; a scan line driver circuit 104; a signal line driver circuit 106; m conductive films 107 functioning as scan lines which are arranged parallel or substantially parallel to each other and whose potentials are controlled by the scan line driver circuit 104; and n conductive films 109 functioning as signal lines which are arranged parallel or substantially parallel to each other and whose potentials are controlled by the signal line driver circuit 106. The pixel portion 101 further includes a plurality of pixels 103 arranged in a matrix. Furthermore, common lines 115 arranged parallel or substantially parallel to each other are provided along the conductive films 109 functioning as signal lines. The scan line driver circuit 104 and the signal line driver circuit 106 are collectively referred to as a driver circuit portion in some cases.

Each conductive film 107 functioning as a scan line is electrically connected to the n pixels 103 in the corresponding row among the pixels 103 arranged in m rows and n columns in the pixel portion 101. Each conductive film 109 functioning as a signal line is electrically connected to the m pixels 103 in the corresponding column among the pixels 103 arranged in m rows and n columns. Note that m and n are each an integer of 1 or more. Each common line 115 is electrically connected to the m pixels 103 in the corresponding column among the pixels 103 arranged in m rows and n columns.

Figure 5B:
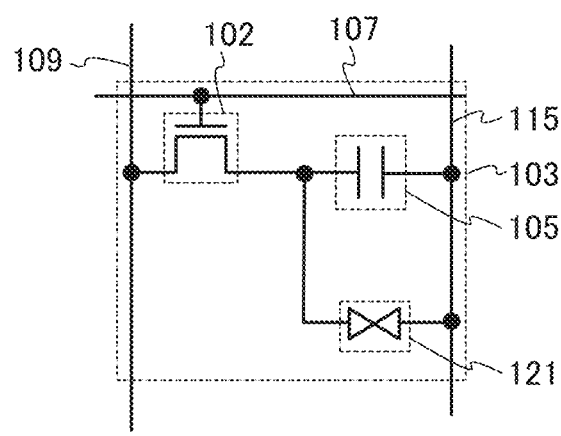

FIG. 5B illustrates an example of a circuit configuration that can be used for the pixels 103 in the display device illustrated in FIG. 5A.

The pixel 103 in FIG. 5B includes a liquid crystal element 121, a transistor 102, and a capacitor 105.

One of a pair of electrodes of the liquid crystal element 121 is connected to the transistor 102 and the potential thereof is set as appropriate according to the specifications of the pixel 103. The other of the pair of electrodes of the liquid crystal element 121 is connected to the common line 115 and a common potential is applied thereto. The alignment state of liquid crystal molecules of the liquid crystal element 121 is controlled in accordance with data written to the transistor 102.

The liquid crystal element 121 is an element that controls transmission or non-transmission of light utilizing an optical modulation action of a liquid crystal molecule. Note that the optical modulation action of the liquid crystal molecule is controlled by an electric field applied to the liquid crystal molecule (including a horizontal electric field, a vertical electric field, and a diagonal electric field). Examples of the liquid crystal element 121 are a nematic liquid crystal, a cholesteric liquid crystal, a smectic liquid crystal, a thermotropic liquid crystal, a lyotropic liquid crystal, a ferroelectric liquid crystal, and an anti-ferroelectric liquid crystal.

An FFS mode is used as a method for driving the display device including the liquid crystal element 121.

The liquid crystal element may be formed using a liquid crystal composition including a liquid crystal material exhibiting a blue phase and a chiral material. The liquid crystal exhibiting a blue phase has a short response time of 1 msec or less and is optically isotropic; therefore, alignment treatment is not necessary and viewing angle dependence is small.

In the structure of the pixel 103 illustrated in FIG. 5B, one of a source electrode and a drain electrode of the transistor 102 is electrically connected to the conductive film 109 functioning as a signal line, and the other is electrically connected to the one of the pair of electrodes of the liquid crystal element 121. A gate electrode of the transistor 102 is electrically connected to the conductive film 107 functioning as a scan line. The transistor 102 has a function of controlling whether to write a data signal by being turned on or off.

In the pixel 103 in FIG. 5B, one of a pair of electrodes of the capacitor 105 is connected to the transistor 102. The other of the pair of electrodes of the capacitor 105 is electrically connected to the common line 115. The potential of the common line 115 is set as appropriate in accordance with the specifications of the pixel 103. The capacitor 105 functions as a storage capacitor for storing written data. In this embodiment, the one of the pair of electrodes of the capacitor 105 is partly or entirely the one of the pair of electrodes of the liquid crystal element 121. The other of the pair of electrodes of the capacitor 105 is partly or entirely the other of the pair of electrodes of the liquid crystal element 121.

A specific structure of an element substrate included in the display device is described. FIG. 6 is a top view of a plurality of pixels 103a, 103b, and 103c.

In FIG. 6, a conductive film 13 functioning as a scan line extends in a direction substantially perpendicularly to a conductive film functioning as a signal line (in the lateral direction in the drawing). The conductive film 21a functioning as the signal line extends in a direction substantially perpendicularly to the conductive film functioning as a scan line (in the longitudinal direction in the drawing). Note that the conductive film 13 functioning as a scan line is electrically connected to the scan line driver circuit 104 (see FIG. 5A), and the conductive film 21a functioning as a signal line is electrically connected to the signal line driver circuit 106 (see FIG. 5A).

The transistor 102 is provided in a region where the conductive film functioning as a scan line and the conductive film functioning as a signal line intersect with each other. The transistor 102 includes the conductive film 13 functioning as a gate electrode; a gate insulating film (not illustrated in FIG. 6); an oxide semiconductor film 19a where a channel region is formed, over the gate insulating film; and the conductive film 21a and a conductive film 21b functioning as a source electrode and a drain electrode. The conductive film 13 also functions as a conductive film functioning as a scan line, and a region of the conductive film 13 that overlaps with the oxide semiconductor film 19a serves as the gate electrode of the transistor 102. In addition, the conductive film 21a also functions as a conductive film functioning as a signal line, and a region of the conductive film 21a that overlaps with the oxide semiconductor film 19a functions as the source electrode or the drain electrode of the transistor 102. Furthermore, in the top view of FIG. 6, an end portion of the conductive film functioning as a scan line is located on the outer side of an end portion of the oxide semiconductor film 19a. Thus, the conductive film functioning as a scan line functions as a light-blocking film for blocking light from a light source such as a backlight. For this reason, the oxide semiconductor film 19a included in the transistor is not irradiated with light, so that a variation in the electrical characteristics of the transistor can be suppressed.

The conductive film 21b is electrically connected to a pixel electrode 19b. The common electrode 29 is provided over the pixel electrode 19b with an insulating film provided therebetween. An opening 40 indicated by a dashed-dotted line is provided in the insulating film provided over the pixel electrode 19b. The pixel electrode 19b is in contact with a nitride insulating film (not illustrated in FIG. 6) in the opening 40.

The common electrode 29 includes stripe regions (first regions) extending in a direction intersecting with the conductive film functioning as a signal line. The stripe regions (first regions) are connected to a region (second region) extending in a direction parallel or substantially parallel to the conductive film functioning as a signal line. Accordingly, the stripe regions (first regions) of the common electrode 29 are at the same potential in pixels.

The capacitor 105 is formed in a region where the pixel electrode 19b and the common electrode 29 overlap with each other. The pixel electrode 19b and the common electrode 29 each have a light-transmitting property. That is, the capacitor 105 has a light-transmitting property.

As illustrated in FIG. 6, the liquid crystal display device described in this embodiment is an FFS mode liquid crystal display device and is provided with the common electrode including the stripe regions extending in a direction intersecting with the conductive film functioning as a signal line. Thus, the display device can have excellent contrast.

Owing to the light-transmitting property of the capacitor 105, the capacitor 105 can be formed large (in a large area) in the pixel 103. Thus, a display device with a large-capacitance capacitor as well as an aperture ratio increased to typically 50% or more, preferably 60% or more can be provided. For example, in a high-resolution display device such as a liquid crystal display device, the area of a pixel is small and accordingly the area of a capacitor is also small. For this reason, the amount of charges accumulated in the capacitor is small in the high-resolution display device. However, since the capacitor 105 of this embodiment has a light-transmitting property, when the capacitor 105 is provided in a pixel, sufficient capacitance can be obtained in the pixel and the aperture ratio can be improved. Typically, the capacitor 105 can be favorably used for a high-resolution display device with a pixel density of 200 pixels per inch (ppi) or more, 300 ppi or more, or furthermore, 500 ppi or more.

In a liquid crystal display device, as the capacitance value of a capacitor is increased, a period during which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption. Furthermore, according to the structure of this embodiment, the aperture ratio can be improved even in a high-resolution display device, which makes it possible to use light from a light source such as a backlight efficiently, so that power consumption of the display device can be reduced.

Note that a top view of one embodiment of the present invention is not limited to FIG. 6. The display device can have a variety of different structures. For example, connection regions (second regions) of the common electrode 29 may be formed over conductive films functioning as signal lines as illustrated in FIG. 28.

Figure 7:
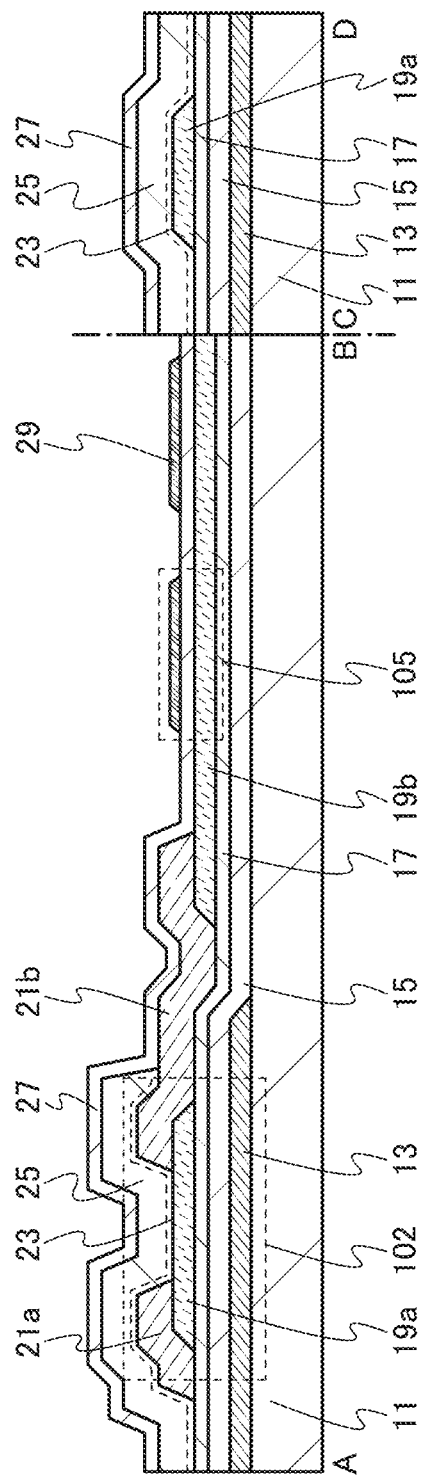
FIG. 7 is a cross-sectional view illustrating one embodiment of a display device.

Next, FIG. 7 is a cross-sectional view taken along dashed-dotted lines A-B and C-D in FIG. 6. The transistor 102 illustrated in FIG. 7 is a channel-etched transistor. Note that the transistor 102 in the channel length direction and the capacitor 105 are illustrated in the cross-sectional view taken along dashed-dotted line A-B, and the transistor 102 in the channel width direction is illustrated in the cross-sectional view taken along dashed-dotted line C-D.

The transistor 102 in FIG. 7 has a single-gate structure and includes the conductive film 13 functioning as a gate electrode over a substrate 11. In addition, the transistor 102 includes a nitride insulating film 15 formed over the substrate 11 and the conductive film 13 functioning as a gate electrode, an oxide insulating film 17 formed over the nitride insulating film 15, the oxide semiconductor film 19a overlapping with the conductive film 13 functioning as a gate electrode with the nitride insulating film 15 and the oxide insulating film 17 provided therebetween, and the conductive films 21a and 21b functioning as a source electrode and a drain electrode which are in contact with the oxide semiconductor film 19a. Moreover, an oxide insulating film 23 is formed over the oxide insulating film 17, the oxide semiconductor film 19a, and the conductive films 21a and 21b functioning as a source electrode and a drain electrode, and an oxide insulating film 25 is formed over the oxide insulating film 23. A nitride insulating film 27 is formed over the nitride insulating film 15, the oxide insulating film 23, the oxide insulating film 25, and the conductive film 21b. The pixel electrode 19b is formed over the oxide insulating film 17. The pixel electrode 19b is connected to one of the conductive films 21a and 21b functioning as a source electrode and a drain electrode, here, connected to the conductive film 21b. The common electrode 29 is formed over the nitride insulating film 27.

A region where the pixel electrode 19b, the nitride insulating film 27, and the common electrode 29 overlap with one another functions as the capacitor 105.

Figure 8:
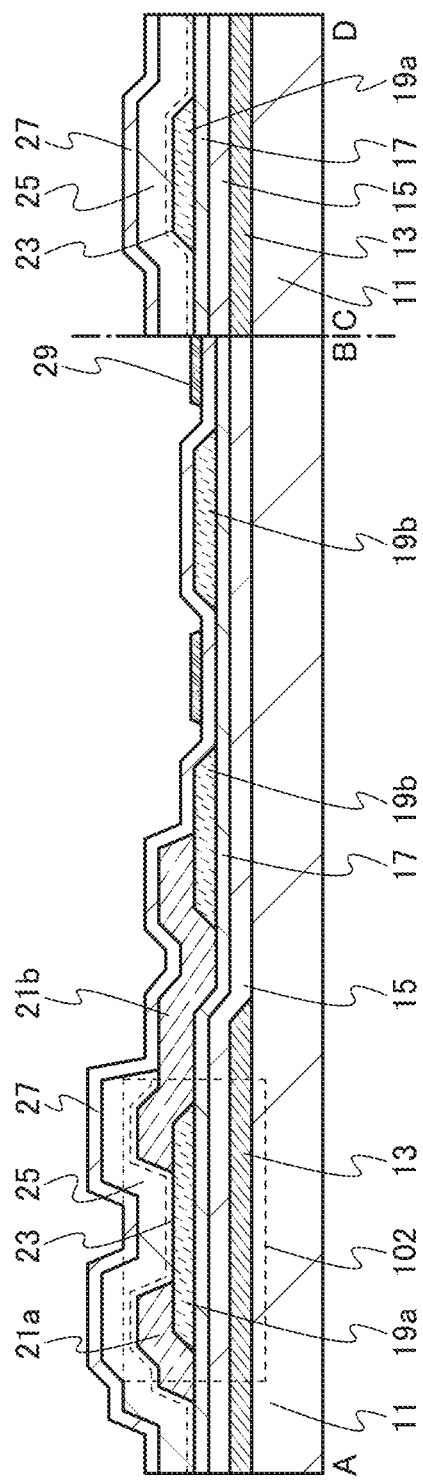
FIG. 8 is a cross-sectional view illustrating one embodiment of a display device.
Figure 9:
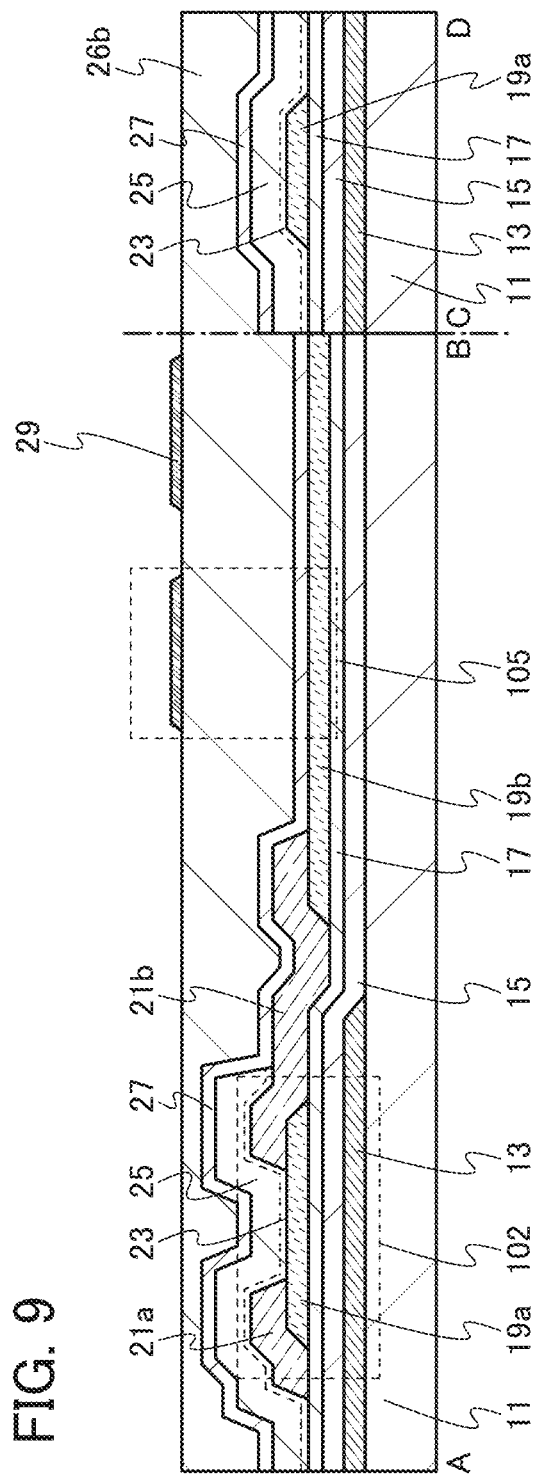
FIG. 9 is a cross-sectional view illustrating one embodiment of a display device.
Figure 22:
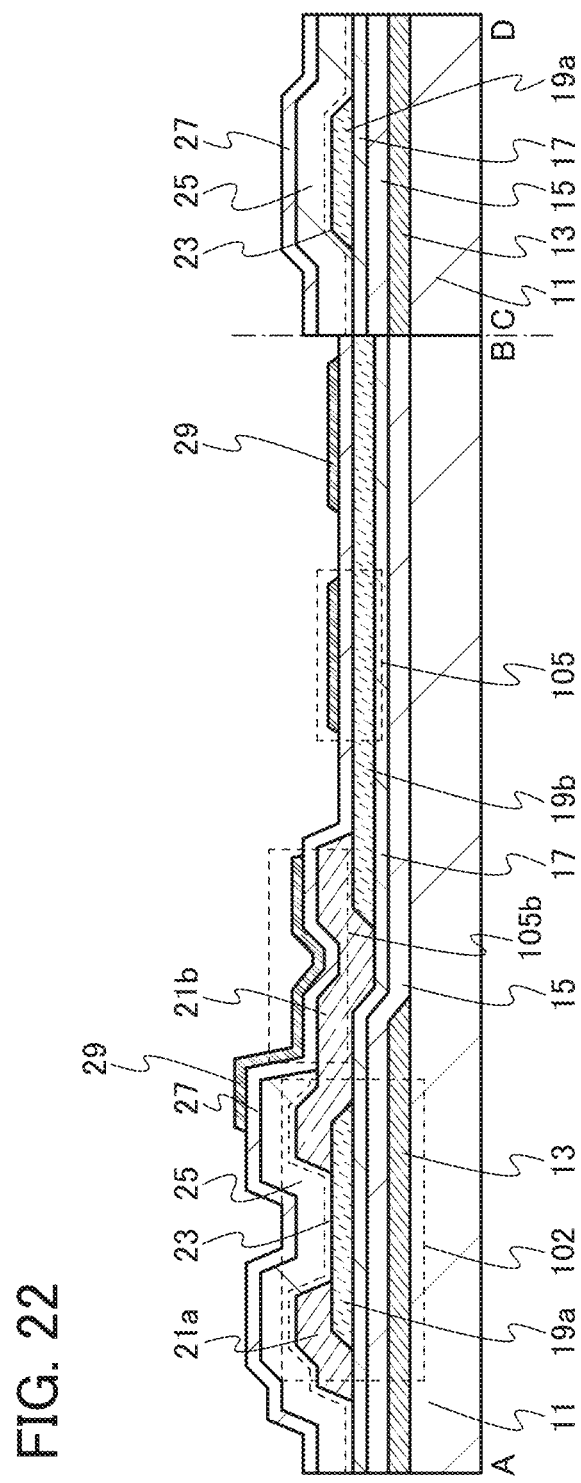
FIG. 22 is a cross-sectional view illustrating one embodiment of a display device.
Figure 23:
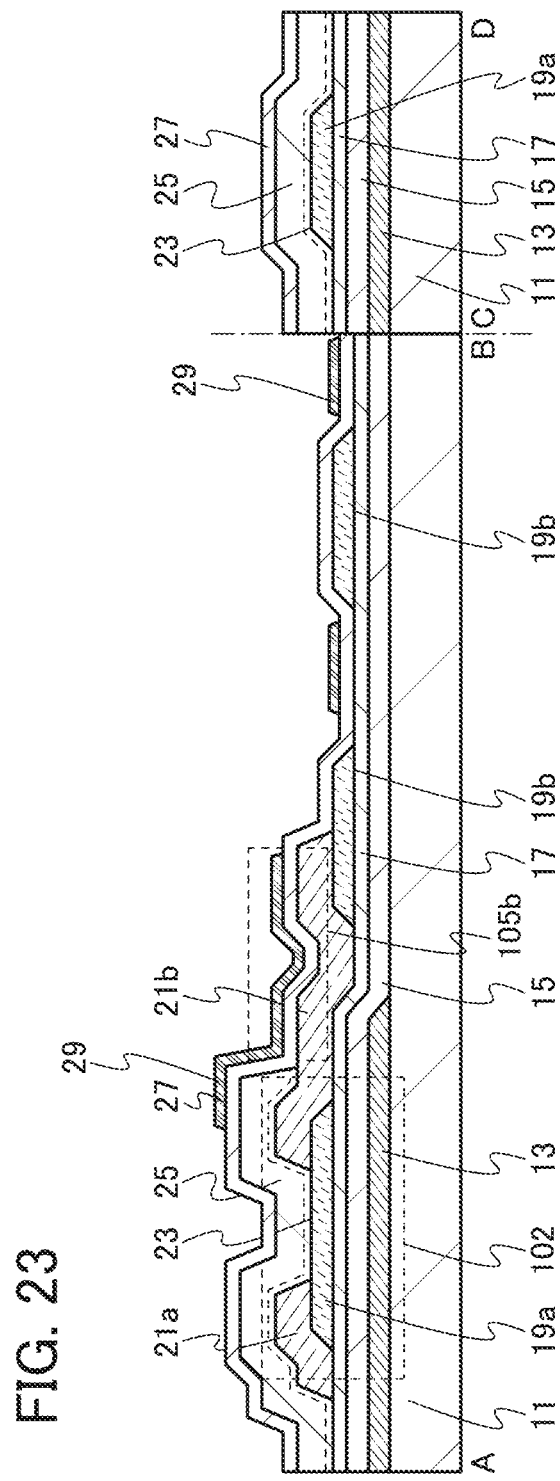
FIG. 23 is a cross-sectional view illustrating one embodiment of a display device.

Note that a cross-sectional view of one embodiment of the present invention is not limited to FIG. 7. The display device can have a variety of different structures. For example, the pixel electrode 19b may have a slit. The pixel electrode 19b may have a comb-like shape. An example of a cross-sectional view in this case is illustrated in FIG. 8. Alternatively, an insulating film 26b may be provided over the nitride insulating film 27 as illustrated in FIG. 9. For example, an organic resin film may be provided as the insulating film 26b. Thus, the insulating film 26b can have a flat surface. In other words, as an example, the insulating film 26b can function as a planarization film. Alternatively, a capacitor 105b may be formed so that the common electrode 29 and the conductive film 21b overlap with each other. Examples of a cross-sectional view in this case are illustrated in FIG. 22 and FIG. 23. Such a structure enables the capacitor 105b to function as a capacitor holding the potential of the pixel electrode. Therefore, with such a structure, capacitance of the capacitor can be increased.

A structure of the display device is described below in detail.

There is no particular limitation on the property of a material and the like of the substrate 11 as long as the material has heat resistance enough to withstand at least later heat treatment. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 11. Furthermore, any of these substrates further provided with a semiconductor element may be used as the substrate 11. In the case where a glass substrate is used as the substrate 11, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 11, and the transistor 102 may be provided directly on the flexible substrate. Alternatively, a separation layer may be provided between the substrate 11 and the transistor 102. The separation layer can be used when part or the whole of a display device formed over the separation layer is separated from the substrate 11 and transferred onto another substrate. In such a case, the transistor 102 can be transferred to a substrate having low heat resistance or a flexible substrate as well.

The conductive film 13 functioning as a gate electrode can be formed using a metal element selected from aluminum, chromium, copper, tantalum, titanium, molybdenum, and tungsten; an alloy containing any of these metal elements as a component; an alloy containing any of these metal elements in combination; or the like. Furthermore, one or more metal elements selected from manganese and zirconium may be used. The conductive film 13 functioning as a gate electrode may have a single-layer structure or a stacked-layer structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, and a three-layer structure in which a titanium film, an aluminum film, and a titanium film are stacked in this order can be given. Alternatively, a film, an alloy film, or a nitride film which contains aluminum and one or more elements selected from titanium, tantalum, tungsten, molybdenum, chromium, neodymium, and scandium may be used.

The conductive film 13 functioning as a gate electrode can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The nitride insulating film 15 can be a nitride insulating film that is hardly permeated by oxygen. Furthermore, a nitride insulating film which is hardly permeated by oxygen, hydrogen, and water can be used. As the nitride insulating film that is hardly permeated by oxygen and the nitride insulating film that is hardly permeated by oxygen, hydrogen, and water, a silicon nitride film, a silicon nitride oxide film, an aluminum nitride film, an aluminum nitride oxide film, or the like is given. Instead of the nitride insulating film that is hardly permeated by oxygen and the nitride insulating film that is hardly permeated by oxygen, hydrogen, and water, an oxide insulating film such as an aluminum oxide film, an aluminum oxynitride film, a gallium oxide film, a gallium oxynitride film, an yttrium oxide film, an yttrium oxynitride film, a hafnium oxide film, or a hafnium oxynitride film can be used.

The thickness of the nitride insulating film 15 is preferably greater than or equal to 5 nm and less than or equal to 100 nm, further preferably greater than or equal to 20 nm and less than or equal to 80 nm.

The oxide insulating film 17 may be formed to have a single-layer structure or a stacked-layer structure using, for example, one or more of a silicon oxide film, a silicon oxynitride film, a silicon nitride oxide film, an aluminum oxide film, a hafnium oxide film, a gallium oxide film, and a Ga—Zn-based metal oxide film.

The oxide insulating film 17 may also be formed using a material having a high relative dielectric constant such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the oxide insulating film 17 is preferably greater than or equal to 5 nm and less than or equal to 400 nm, further preferably greater than or equal to 10 nm and less than or equal to 300 nm, still further preferably greater than or equal to 50 nm and less than or equal to 250 nm.

The oxide semiconductor film 19a is typically formed using an In—Ga oxide, an In—Zn oxide, or an In-M-Zn oxide (M represents Al, Ga, Y, Zr, Sn, La, Ce, or Nd).

In the case where the oxide semiconductor film 19a contains an In-M-Zn oxide, the proportions of In and M when summation of In and M is assumed to be 100 atomic % are preferably as follows: the atomic percentage of In is greater than 25 atomic % and the atomic percentage of M is less than 75 atomic %, or further preferably, the atomic percentage of In is greater than 34 atomic % and the atomic percentage of M is less than 66 atomic %.

The energy gap of the oxide semiconductor film 19a is 2 eV or more, preferably 2.5 eV or more, further preferably 3 eV or more. The off-state current of the transistor 102 can be reduced by using an oxide semiconductor having such a wide energy gap.

The thickness of the oxide semiconductor film 19a is greater than or equal to 3 nm and less than or equal to 200 nm, preferably greater than or equal to 3 nm and less than or equal to 100 nm, further preferably greater than or equal to 3 nm and less than or equal to 50 nm.

In the case where the oxide semiconductor film 19a is an In-M-Zn oxide film (M represents Al, Ga, Y, Zr, Sn, La, Ce, or Nd), it is preferable that the atomic ratio of metal elements of a sputtering target used for forming the In-M-Zn oxide film satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the proportion of each metal element in the atomic ratio of the oxide semiconductor film 19a to be formed varies within a range of ±40% of that in the above atomic ratio of the sputtering target as an error.

An oxide semiconductor film with low carrier density is used as the oxide semiconductor film 19a. For example, an oxide semiconductor film whose carrier density is $1\times10^{17}/cm^3$ or lower, preferably $1\times10^{15}/cm^3$ or lower, further preferably $1\times10^{13}/cm^3$ or lower, still further preferably $1\times10^{11}/cm^3$ or lower is used as the oxide semiconductor film 19a.

Note that, without limitation to the compositions described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 19a be set to be appropriate.

Note that it is preferable to use, as the oxide semiconductor film 19a, an oxide semiconductor film in which the impurity concentration is low and density of defect states is low, in which case the transistor can have more excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has few carrier traps in some cases. Furthermore, the highly purified intrinsic or substantially highly purified intrinsic oxide semiconductor film has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor in which a channel region is formed in the oxide semiconductor film has a small variation in electrical characteristics and high reliability in some cases. As examples of the impurities, hydrogen, nitrogen, alkali metal, and alkaline earth metal are given.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal element causes generation of an electron serving as a carrier. Thus, a transistor including an oxide semiconductor which contains hydrogen is likely to be normally on.

Accordingly, it is preferable that hydrogen be reduced as much as possible as well as the oxygen vacancies in the oxide semiconductor film 19a. Specifically, in the oxide semiconductor film 19a, the concentration of hydrogen which is measured by secondary ion mass spectrometry (SIMS) is set to be lower than or equal to $5\times10^{19}$ atoms/cm$^3$, preferably lower than or equal to $1\times10^{19}$ atoms/cm$^3$, further preferably lower than or equal to $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$, yet still furthermore preferably lower than or equal to $1\times10^{16}$ atoms/cm$^3$.

When silicon or carbon which is one of elements belonging to Group 14 is contained in the oxide semiconductor film 19a, oxygen vacancies are increased in the oxide semiconductor film 19a, and the oxide semiconductor film 19a becomes an n-type film. Thus, the concentration of silicon or carbon (the concentration is measured by SIMS) of the oxide semiconductor film 19a is set to be lower than or equal to $2\times10^{18}$ atoms/cm$^3$, preferably lower than or equal to $2\times10^{17}$ atoms/cm$^3$.

The concentration of alkali metal or alkaline earth metal in the oxide semiconductor film 19a, which is measured by SIMS, is set to be lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor film 19a.

Furthermore, when containing nitrogen, the oxide semiconductor film 19a easily has n-type conductivity by generation of electrons serving as carriers and an increase of carrier density. Thus, a transistor including an oxide semiconductor which contains nitrogen is likely to be normally on. For this reason, nitrogen in the oxide semiconductor film is preferably reduced as much as possible; the concentration of nitrogen which is measured by SIMS is preferably set to be, for example, lower than or equal to $5\times10^{18}$ atoms/cm$^3$.

The oxide semiconductor film 19a may have a non-single-crystal structure, for example. The non-single-crystal structure includes a c-axis aligned crystalline oxide semiconductor (CAAC-OS) which is described later, a polycrystalline structure, a microcrystalline structure which is described later, or an amorphous structure, for example. Among the non-single-crystal structures, the amorphous has the highest density of defect states, whereas CAAC-OS has the lowest density of defect states.

The oxide semiconductor film 19a may have an amorphous structure, for example. The oxide semiconductor films having the amorphous structure each have disordered atomic arrangement and no crystalline component, for example. Alternatively, the oxide films having an amorphous structure have, for example, an absolutely amorphous structure and no crystal part.

Note that the oxide semiconductor film 19a may be a mixed film including two or more regions of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure of two or more of a region having an amorphous structure, a region having a microcrystalline structure, a region having a polycrystalline structure, a CAAC-OS region, and a region having a single-crystal structure in some cases.

The pixel electrode 19b is formed by processing an oxide semiconductor film formed at the same time as the oxide semiconductor film 19a. Thus, the pixel electrode 19b contains a metal element similar to that in the oxide semiconductor film 19a. Furthermore, the pixel electrode 19b has a crystal structure similar to or different from that of the oxide semiconductor film 19a. By adding impurities or oxygen vacancies to the oxide semiconductor film formed at the same time as the oxide semiconductor film 19a, the oxide semiconductor film has conductivity and thus functions as the pixel electrode 19b. An example of the impurities contained in the oxide semiconductor film is hydrogen. Instead of hydrogen, as the impurity, boron, phosphorus, tin, antimony, a rare gas element, an alkali metal, an alkaline earth metal, or the like may be included. Alternatively, the pixel electrode 19b is formed at the same time as the oxide semiconductor film 19a, and has increased conductivity by containing oxygen vacancies generated by plasma damage or the like. Alternatively, the pixel electrode 19b is formed at the same time as the oxide semiconductor film 19a, and has increased conductivity by containing impurities and oxygen vacancies generated by plasma damage or the like.

The oxide semiconductor film 19a and the pixel electrode 19b are both formed over the oxide insulating film 17, but differ in impurity concentration. Specifically, the pixel electrode 19b has a higher impurity concentration than the oxide semiconductor film 19a. For example, the concentration of hydrogen contained in the oxide semiconductor film 19a is lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$, yet further preferably lower than or equal to $1\times10^{16}$ atoms/cm$^3$. The concentration of hydrogen contained in the pixel electrode 19b is higher than or equal to $8\times10^{19}$ atoms/cm$^3$, preferably higher than or equal to $1\times10^{20}$ atoms/cm$^3$, further preferably higher than or equal to $5\times10^{20}$ atoms/cm$^3$. The concentration of hydrogen contained in the pixel electrode 19b is greater than or equal to 2 times, preferably greater than or equal to 10 times that in the oxide semiconductor film 19a.

When the oxide semiconductor film formed at the same time as the oxide semiconductor film 19a is exposed to plasma, the oxide semiconductor film is damaged, and oxygen vacancies can be generated. For example, when a film is formed over the oxide semiconductor film by a plasma CVD method or a sputtering method, the oxide semiconductor film is exposed to plasma and oxygen vacancies are generated. Alternatively, when the oxide semiconductor film is exposed to plasma in etching treatment for formation of the oxide insulating film 23 and the oxide insulating film 25, oxygen vacancies are generated. Alternatively, when the oxide semiconductor film is exposed to plasma such as a mixed gas of oxygen and hydrogen, hydrogen, a rare gas, and ammonia, oxygen vacancies are generated. As a result, the conductivity of the oxide semiconductor film is increased, so that the oxide semiconductor film has conductivity and functions as the pixel electrode 19b.

In other words, the pixel electrode 19b is formed using an oxide semiconductor film having high conductivity. It can also be said that the pixel electrode 19b is formed using a metal oxide film having high conductivity.

In the case where a silicon nitride film is used as the nitride insulating film 27, the silicon nitride film contains hydrogen. When hydrogen in the nitride insulating film 27 is diffused into the oxide semiconductor film formed at the same time as the oxide semiconductor film 19a, hydrogen is bonded to oxygen and electrons serving as carriers are generated in the oxide semiconductor film. When the silicon nitride film is formed by a plasma CVD method or a sputtering method, the oxide semiconductor film is exposed to plasma and oxygen vacancies are generated in the oxide semiconductor film. When hydrogen contained in the silicon nitride film enters the oxygen vacancies, electrons serving as carriers are generated. As a result, the conductivity of the oxide semiconductor film is increased, so that the oxide semiconductor film functions as the pixel electrode 19b.

When hydrogen is added to an oxide semiconductor including oxygen vacancies, hydrogen enters oxygen vacant sites and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. In other words, the pixel electrode 19b is formed using an oxide conductor film. Oxide semiconductors generally have a visible light transmitting property because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

Here, a model in which an oxide semiconductor film becomes an oxide conductor film is described with reference to FIGS. 39A to 39D.

Figure 39A:
FIGS. 39A to 39D illustrate a formation model of an oxide conductor film.

As illustrated in FIG. 39A, an oxide semiconductor film 71 is formed.

Figure 39B:
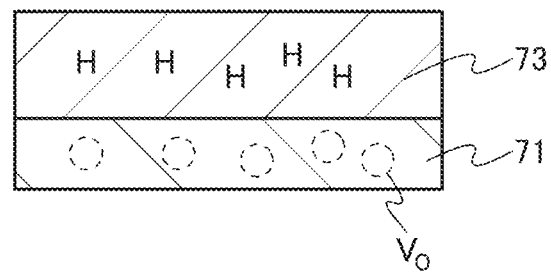

As illustrated in FIG. 39B, a nitride insulating film 73 is formed over the oxide semiconductor film 71. Hydrogen H is contained in the nitride insulating film 73. When the nitride insulating film 73 is formed, the oxide semiconductor film 71 is exposed to plasma and oxygen vacancies $V_o$ are formed in the oxide semiconductor film 71.

Figure 39C:
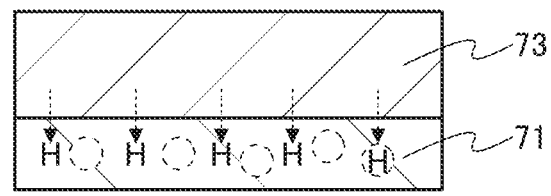
Figure 39D:
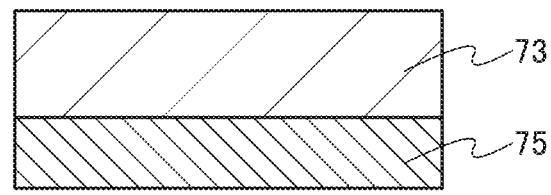

As illustrated in FIG. 39C, the hydrogen H contained in the nitride insulating film 73 diffuses into the oxide semiconductor film 71. The hydrogen H enters the oxygen vacancies $V_o$ and a donor level is formed in the vicinity of the conduction band. Thus, as illustrated in FIG. 39D, the conductivity of the oxide semiconductor film is increased and an oxide conductor film 75 is formed. The oxide conductor film 75 functions as a pixel electrode.

The pixel electrode 19b has lower resistivity than the oxide semiconductor film 19a. The resistivity of the pixel electrode 19b is preferably greater than or equal to $1 \times 10^{-8}$ times and less than $1 \times 10^{-1}$ times the resistivity of the oxide semiconductor film 19a. The resistivity of the pixel electrode 19b is typically greater than or equal to $1 \times 10^{-3}$ Ωcm and less than $1 \times 10^4$ Ωcm, preferably greater than or equal to $1 \times 10^{-3}$ Ωcm and less than $1 \times 10^{-1}$ Ωcm.

The conductive films 21a and 21b functioning as a source electrode and a drain electrode are each formed to have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order can be given. Note that a transparent conductive material containing indium oxide, tin oxide, or zinc oxide may be used.

As the oxide insulating film 23 or the oxide insulating film 25, an oxide insulating film which contains more oxygen than that in the stoichiometric composition is preferably used. Here, as the oxide insulating film 23, an oxide insulating film which permeates oxygen is formed, and as the oxide insulating film 25, an oxide insulating film which contains more oxygen than that in the stoichiometric composition is formed.

The oxide insulating film 23 is an oxide insulating film through which oxygen is permeated. Thus, oxygen released from the oxide insulating film 25 provided over the oxide insulating film 23 can be moved to the oxide semiconductor film 19a through the oxide insulating film 23. Moreover, the oxide insulating film 23 also serves as a film which relieves damage to the oxide semiconductor film 19a at the time of forming the oxide insulating film 25 later.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating film 23. Note that in this specification. "silicon oxynitride film" refers to a film that contains more oxygen than nitrogen, and "silicon nitride oxide film" refers to a film that contains more nitrogen than oxygen.

Furthermore, it is preferable that the amount of defects in the oxide insulating film 23 be small and typically, the spin density of a signal that appears at g=2.001 be lower than or equal to $3 \times 10^{17}$ spins/cm$^3$ by electron spin resonance (ESR) measurement. The signal that appears at g=2.001 is due to dangling bonds of silicon. This is because if the density of defects in the oxide insulating film 23 is high, oxygen is bonded to the defects and the amount of oxygen that passes through the oxide insulating film 23 is decreased.

Furthermore, it is preferable that the amount of defects at the interface between the oxide insulating film 23 and the oxide semiconductor film 19a be small and typically, the spin density of a signal that appears at g=1.89 or more and 1.96 or less due to an oxygen vacancy in the oxide semiconductor film 19a be lower than or equal to $1\times10^{17}$ spins/cm$^3$, further preferably lower than or equal to the lower limit of detection by ESR measurement.

Note that in the oxide insulating film 23, all oxygen that enters the oxide insulating film 23 from the outside is transferred to the outside of the oxide insulating film 23 in some cases. Alternatively, some oxygen that enters the oxide insulating film 23 from the outside remains in the oxide insulating film 23 in some cases. Further, movement of oxygen occurs in the oxide insulating film 23 in some cases in such a manner that oxygen enters the oxide insulating film 23 from the outside and oxygen contained in the oxide insulating film 23 is moved to the outside of the oxide insulating film 23.

The oxide insulating film 25 is formed in contact with the oxide insulating film 23. The oxide insulating film 25 is formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film which contains oxygen at a higher proportion than the stoichiometric composition is an oxide insulating film of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the oxide insulating film 25.

It is preferable that the amount of defects in the oxide insulating film 25 be small and typically, the spin density of a signal that appears at g=2.001 be lower than $1.5\times10^{18}$ spins/cm$^3$, further preferably lower than or equal to $1\times10^{18}$ spins/cm$^3$ by ESR measurement. Note that the oxide insulating film 25 is provided more apart from the oxide semiconductor film 19a than the oxide insulating film 23 is; thus, the oxide insulating film 25 may have higher defect density than the oxide insulating film 23.

Like the nitride insulating film 15, the nitride insulating film 27 can be a nitride insulating film which is hardly permeated by oxygen. Furthermore, a nitride insulating film which is hardly permeated by oxygen, hydrogen, and water can be used.

The nitride insulating film 27 is formed using a silicon nitride film, a silicon nitride oxide film, an aluminum nitride film, an aluminum nitride oxide film, or the like with a thickness greater than or equal to 50 nm and less than or equal to 300 nm, preferably greater than or equal to 100 nm and less than or equal to 200 nm.

In the case where the oxide insulating film which contains oxygen at a higher proportion than the stoichiometric composition is included in the oxide insulating film 23 or the oxide insulating film 25, part of oxygen contained in the oxide insulating film 23 or the oxide insulating film 25 can be moved to the oxide semiconductor film 19a, so that the amount of oxygen vacancies contained in the oxide semiconductor film 19a can be reduced.

The threshold voltage of a transistor using an oxide semiconductor film with oxygen vacancies shifts negatively with ease, and such a transistor tends to be normally on. This is because charges are generated owing to oxygen vacancies in the oxide semiconductor film and the resistance is thus reduced. The transistor having normally-on characteristics causes various problems in that malfunction is likely to be caused when in operation and that power consumption is increased when not in operation, for example. Furthermore, there is a problem in that the amount of change in electrical characteristics, typically in threshold voltage, of the transistor is increased by change over time or a stress test.

However, in the transistor 102 in this embodiment, the oxide insulating film 23 or the oxide insulating film 25 provided over the oxide semiconductor film 19a contains oxygen at a higher proportion than the stoichiometric composition. Furthermore, the oxide semiconductor film 19a, the oxide insulating film 23, and the oxide insulating film 25 are surrounded by the nitride insulating film 15 and the oxide insulating film 17. As a result, oxygen contained in the oxide insulating film 23 or the oxide insulating film 25 is moved to the oxide semiconductor film 19a efficiently, so that the amount of oxygen vacancies in the oxide semiconductor film 19a can be reduced. Accordingly, a transistor having normally-off characteristics is obtained. Furthermore, the amount of change in electrical characteristics, typically in threshold voltage, of the transistor over time or due to a stress test can be reduced.

The common electrode 29 is formed using a light-transmitting film, preferably a light-transmitting conductive film. As the light-transmitting conductive film, an indium oxide film containing tungsten oxide, an indium zinc oxide film containing tungsten oxide, an indium oxide film containing titanium oxide, an indium tin oxide film containing titanium oxide, an indium tin oxide (hereinafter referred to as ITO) film, an indium zinc oxide film, an indium tin oxide film to which silicon oxide is added, and the like are given.

The shape of the common electrode 29 is similar to that of the common electrode 9 in Embodiment 1, and the extending direction of the conductive film 21a functioning as a signal line and the extending direction of the common electrode 29 intersect with each other. Therefore, differences in directions between the electric field between the conductive film 21a functioning as a signal line and the common electrode 29 and the electric field between the pixel electrode 19b and the common electrode 29 arise and the differences form a large angle. Accordingly, the alignment state of the liquid crystal molecules in the vicinity of the conductive film functioning as a signal line and the alignment state of the liquid crystal molecules in the vicinity of the pixel electrode which is generated by an electric field between the pixel electrodes provided in adjacent pixels and the common electrode are less likely to be affected by each other. Thus, a change in the transmittance of the pixels is suppressed. Accordingly, flickers in an image can be reduced.

In the liquid crystal display device having a low refresh rate, alignment of liquid crystal molecules in the vicinity of the conductive film 21a functioning as a signal line is less likely to affect alignment state of liquid crystal molecules in the vicinity of the pixel electrode due to the electric field between the pixel electrodes in the adjacent pixels and the common electrode 29 even during the retention period. Thus, the transmittance of the pixels in the retention period can be held and flickers can be reduced.

The common electrode 29 includes the stripe regions extending in a direction intersecting with the conductive film 21a functioning as a signal line. Accordingly, in the vicinity of the pixel electrode 19b and the conductive film 21a, unintended alignment of liquid crystal molecules can be prevented and thus light leakage can be suppressed. As a result, a display device with excellent contrast can be manufactured.

On an element substrate of the display device described in this embodiment, the pixel electrode is formed at the same time as the oxide semiconductor film of the transistor. The pixel electrode functions as the one of electrodes of the capacitor. The common electrode also functions as the other of electrodes of the capacitor. Thus, a step of forming another conductive film is not needed to form the capacitor, and the number of steps of manufacturing the display device can be reduced. The capacitor has a light-transmitting property. As a result, the area occupied by the capacitor can be increased and the aperture ratio in a pixel can be increased.

Next, a method for manufacturing the transistor 102 and the capacitor 105 in FIG. 7 is described with reference to FIGS. 10A to 10D, FIGS. 11A to 11D, and FIGS. 12A to 12C.

As illustrated in FIG. 10A, a conductive film 12 to be the conductive film 13 is formed over the substrate 11. The conductive film 12 is formed by a sputtering method, a chemical vapor deposition (CVD) method such as a metal organic chemical vapor deposition (MOCVD) method, a metal chemical vapor deposition method, an atomic layer deposition (ALD) method, or a plasma-enhanced chemical vapor deposition (PECVD) method, an evaporation method, a pulsed laser deposition (PLD) method, or the like. When a metal organic chemical vapor deposition (MOCVD) method, a metal chemical vapor deposition method, or an atomic layer deposition (ALD) method is employed, the conductive film is less damaged by plasma.

Here, a glass substrate is used as the substrate 11. Furthermore, as the conductive film 12, a 100-nm-thick tungsten film is formed by a sputtering method.

Next, a mask is formed over the conductive film 12 by a photolithography process using a first photomask. Then, as illustrated in FIG. 10B, part of the conductive film 12 is etched with the use of the mask to form the conductive film 13 functioning as a gate electrode. After that, the mask is removed.

Note that the conductive film 13 functioning as a gate electrode may be formed by an electrolytic plating method, a printing method, an ink-jet method, or the like instead of the above formation method.

Here, the tungsten film is etched by a dry etching method to form the conductive film 13 functioning as a gate electrode.

Next, as illustrated in FIG. 10C, over the conductive film 13 functioning as a gate electrode, the nitride insulating film 15 and an oxide insulating film 16 to be the oxide insulating film 17 later are formed. Then, over the oxide insulating film 16, an oxide semiconductor film 18 to be the oxide semiconductor film 19a and the pixel electrode 19b later is formed.

The nitride insulating film 15 and the oxide insulating film 16 are each formed by a sputtering method, a chemical vapor deposition (CVD) method such as a metal organic chemical vapor deposition (MOCVD) method, a metal chemical deposition method, an atomic layer deposition (ALD) method, or a plasma-enhanced chemical vapor deposition (PECVD) method, an evaporation method, a pulsed laser deposition (PLD) method, a coating method, a printing method, or the like. When a metal organic chemical vapor deposition (MOCVD) method, or an atomic layer deposition (ALD) method is employed, the nitride insulating film 15 and the oxide insulating film 16 are less damaged by plasma. When an atomic layer deposition (ALD) method is employed, coverage of the nitride insulating film 15 and the oxide insulating film 16 can be increased.

Here, as the nitride insulating film 15, a 300-nm-thick silicon nitride film is formed by a plasma CVD method in which silane, nitrogen, and ammonia are used as a source gas.

In the case where a silicon oxide film, a silicon oxynitride film, or a silicon nitride oxide film is formed as the oxide insulating film 16, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

Moreover, in the case of forming a gallium oxide film as the oxide insulating film 16, a metal organic chemical vapor deposition (MOCVD) method can be employed.

Here, as the oxide insulating film 16, a 50-nm-thick silicon oxynitride film is formed by a plasma CVD method in which silane and dinitrogen monoxide are used as a source gas.

The oxide semiconductor film 18 can be formed by a sputtering method, a chemical vapor deposition (CVD) method such as a metal organic chemical vapor deposition (MOCVD) method, an atomic layer deposition (ALD) method, or a plasma-enhanced chemical vapor deposition (PECVD) method, a pulsed laser deposition method, a laser ablation method, a coating method, or the like. When a metal organic chemical vapor deposition (MOCVD) method, a metal chemical deposition method, or an atomic layer deposition (ALD) method is employed, the oxide semiconductor film 18 is less damaged by plasma and the oxide insulating film 16 is less damaged. When an atomic layer deposition (ALD) method is employed, coverage of the oxide semiconductor film 18 can be increased.

As a power supply device for generating plasma in the case of forming the oxide semiconductor film by a sputtering method, an RF power supply device, an AC power supply device, a DC power supply device, or the like can be used as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen to a rare gas is preferably increased.

Furthermore, a target may be selected as appropriate in accordance with the composition of the oxide semiconductor film to be formed.

In order to obtain a highly purified intrinsic or substantially highly purified intrinsic oxide semiconductor film, it is necessary to highly purify a sputtering gas as well as to evacuate a chamber to a high vacuum. As an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film can be prevented as much as possible.

Here, a 35-nm-thick In—Ga—Zn oxide film is formed as the oxide semiconductor film by a sputtering method using an In—Ga—Zn oxide target (In:Ga:Zn=1:1:1).

Then, after a mask is formed over the oxide semiconductor film 18 by a photolithography process using a second photomask, the oxide semiconductor film is partly etched using the mask. Thus, the oxide semiconductor film 19a and an oxide semiconductor film 19c subjected to element isolation as illustrated in FIG. 10D are formed. After that, the mask is removed.

Here, the oxide semiconductor films 19a and 19c are formed in such a manner that a mask is formed over the oxide semiconductor film 18 and part of the oxide semiconductor film 18 is selectively etched by a wet etching method.

Next, as illustrated in FIG. 11A, a conductive film 20 to be the conductive films 21a and 21b later is formed.

The conductive film 20 can be formed by a method similar to that of the conductive film 12 as appropriate.

Here, a 50-nm-thick tungsten film and a 300-nm-thick copper film are sequentially stacked by a sputtering method.

Next, a mask is formed over the conductive film 20 by a photolithography process using a third photomask. Then, the conductive film 20 is etched using the mask, so that the conductive films 21a and 21b functioning as a source electrode and a drain electrode are formed as illustrated in FIG. 11B. After that, the mask is removed.

Here, the mask is formed over the copper film by a photolithography process. Then, the tungsten film and the copper film are etched with the use of the mask, so that the conductive films 21a and 21b are formed. Note that the copper film is etched by a wet etching method. Next, the tungsten film is etched by a dry etching method using $SF_6$, whereby fluoride is formed on the surface of the copper film. By the fluoride, diffusion of copper elements from the copper film is reduced and thus the copper concentration in the oxide semiconductor film 19a can be reduced.

Next, as illustrated in FIG. 11C, an oxide insulating film 22 to be the oxide insulating film 23 later and an oxide insulating film 24 to be the oxide insulating film 25 later are formed over the oxide semiconductor films 19a and 19c and the conductive films 21a and 21b. The oxide insulating film 22 and the oxide insulating film 24 can each be formed by a method similar to those of the nitride insulating film 15 and the oxide insulating film 16 as appropriate.

Note that after the oxide insulating film 22 is formed, the oxide insulating film 24 is preferably formed in succession without exposure to the air. After the oxide insulating film 22 is formed, the oxide insulating film 24 is formed in succession by adjusting at least one of the flow rate of a source gas, pressure, a high-frequency power, and a substrate temperature without exposure to the air, whereby the concentration of impurities attributed to the atmospheric component at the interface between the oxide insulating film 22 and the oxide insulating film 24 can be reduced and oxygen in the oxide insulating film 24 can be moved to the oxide semiconductor film 19a; accordingly, the amount of oxygen vacancies in the oxide semiconductor film 19a can be reduced.

As the oxide insulating film 22, a silicon oxide film or a silicon oxynitride film can be formed under the following conditions: the substrate placed in a treatment chamber of a plasma CVD apparatus that is vacuum-evacuated is held at a temperature higher than or equal to 280° C. and lower than or equal to 400° C., the pressure is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as the source gas of the oxide insulating film 22. Typical examples of the deposition gas containing silicon include silane, disilane, trisilane, and silane fluoride. As the oxidizing gas, oxygen, ozone, dinitrogen monoxide, and nitrogen dioxide can be given as examples.

With the use of the above conditions, an oxide insulating film which permeates oxygen can be formed as the oxide insulating film 22. Furthermore, by providing the oxide insulating film 22, damage to the oxide semiconductor film 19a can be reduced in a step of forming the oxide insulating film 25 which is formed later.

A silicon oxide film or a silicon oxynitride film can be formed as the oxide insulating film 22 under the following conditions: the substrate placed in a treatment chamber of a plasma CVD apparatus that is vacuum-evacuated is held at a temperature higher than or equal to 280° C. and lower than or equal to 400° C., the pressure is greater than or equal to 100 Pa and less than or equal to 250 Pa with introduction of a source gas into the treatment chamber, and a high-frequency power is supplied to an electrode provided in the treatment chamber.

Under the above film formation conditions, the bonding strength of silicon and oxygen becomes strong in the above substrate temperature range. Thus, as the oxide insulating film 22, a dense and hard oxide insulating film which is permeated by oxygen, typically, a silicon oxide film or a silicon oxynitride film having an etching rate lower than or equal to 10 nm/min, preferably lower than or equal to 8 nm/min when etching is performed at 25° C. using hydrofluoric acid of 0.5 wt % can be formed.

The oxide insulating film 22 is formed while heating is performed; thus, hydrogen, water, or the like contained in the oxide semiconductor film 19a can be released in the step. Hydrogen contained in the oxide semiconductor film 19a is bonded to an oxygen radical formed in plasma to form water. Since the substrate is heated in the step of forming the oxide insulating film 22, water formed by bonding of oxygen and hydrogen is released from the oxide semiconductor film. That is, when the oxide insulating film 22 is formed by a plasma CVD method, the amount of water and hydrogen contained in the oxide semiconductor film 19a can be reduced.

Furthermore, time for heating in a state where the oxide semiconductor film 19a is exposed can be shortened because heating is performed in a step of forming the oxide insulating film 22. Thus, the amount of oxygen released from the oxide semiconductor film by heat treatment can be reduced. That is, the amount of oxygen vacancies in the oxide semiconductor film can be reduced.

Note that when the ratio of the amount of the oxidizing gas to the amount of the deposition gas containing silicon is 100 or higher, the hydrogen content in the oxide insulating film 22 can be reduced. Consequently, the amount of hydrogen entering the oxide semiconductor film 19a can be reduced; thus, the negative shift in the threshold voltage of the transistor can be inhibited.

Here, as the oxide insulating film 22, a 50-nm-thick silicon oxynitride film is formed by a plasma CVD method in which silane with a flow rate of 30 sccm and dinitrogen monoxide with a flow rate of 4000 sccm are used as a source gas, the pressure in the treatment chamber is 200 Pa, the substrate temperature is 220° C. and a high-frequency power of 150 W is supplied to parallel-plate electrodes with the use of a 27.12 MHz high-frequency power source. Under the above conditions, a silicon oxynitride film which is permeated by oxygen can be formed.

As the oxide insulating film 24, a silicon oxide film or a silicon oxynitride film is formed under the following conditions: the substrate placed in a treatment chamber of a plasma CVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

A deposition gas containing silicon and an oxidizing gas are preferably used as the source gas of the oxide insulating film 24. Typical examples of the deposition gas containing silicon include silane, disilane, trisilane, and silane fluoride. As the oxidizing gas, oxygen, ozone, dinitrogen monoxide, and nitrogen dioxide can be given as examples.

As the film formation conditions of the oxide insulating film 24, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content in the oxide insulating film 24 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, it is possible to form an oxide insulating film which contains oxygen at a higher proportion than the stoichiometric composition and from which part of oxygen is released by heating. Furthermore, the oxide insulating film 22 is provided over the oxide semiconductor film 19a. Accordingly, in the step of forming the oxide insulating film 24, the oxide insulating film 22 functions as a protective film of the oxide semiconductor film 19a. Consequently, the oxide insulating film 24 can be formed using the high-frequency power having a high power density while damage to the oxide semiconductor film 19a is reduced.

Here, as the oxide insulating film 24, a 400-nm-thick silicon oxynitride film is formed by a plasma CVD method in which silane with a flow rate of 200 sccm and dinitrogen monoxide with a flow rate of 4000 sccm are used as the source gas, the pressure in the treatment chamber is 200 Pa, the substrate temperature is 220° C. and a high-frequency power of 1500 W is supplied to the parallel-plate electrodes with the use of a 27.12 MHz high-frequency power source. Note that the plasma CVD apparatus is a parallel-plate plasma CVD apparatus in which the electrode area is 6000 cm$^2$, and the power per unit area (power density) into which the supplied power is converted is 0.25 W/cm$^2$.

Furthermore, when the conductive films 21a and 21b functioning as a source electrode and a drain electrode is formed, the oxide semiconductor film 19a is damaged by the etching of the conductive film, so that oxygen vacancies are generated on the back channel side of the oxide semiconductor film 19a (the side of the oxide semiconductor film 19a which is opposite to the side facing to the conductive film 13 functioning as a gate electrode). However, with the use of the oxide insulating film which contains oxygen at a higher proportion than the stoichiometric composition as the oxide insulating film 24, the oxygen vacancies generated on the back channel side can be repaired by heat treatment. By this, defects contained in the oxide semiconductor film 19a can be reduced, and thus, the reliability of the transistor 102 can be improved.

Then, a mask is formed over the oxide insulating film 24 by a photolithography process using a fourth photomask. Next, as illustrated in FIG. 11D, part of the oxide insulating film 22 and part of the oxide insulating film 24 are etched with the use of the mask to form the oxide insulating film 23 and the oxide insulating film 25 having the opening 40. After that, the mask is removed.

In the process, the oxide insulating films 22 and 24 are preferably etched by a dry etching method. As a result, the oxide semiconductor film 19c is exposed to plasma in the etching treatment; thus, the amount of oxygen vacancies in the oxide semiconductor film 19c can be increased.

Next, heat treatment is performed. The heat treatment is performed typically at a temperature higher than or equal to 150° C. and lower than or equal to 400° C., preferably higher than or equal to 300° C. and lower than or equal to 400° C., further preferably higher than or equal to 320° C. and lower than or equal to 370° C.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the oxide insulating film 25 can be moved to the oxide semiconductor film 19a, so that the amount of oxygen vacancies contained in the oxide semiconductor film 19a can be reduced.

In the case where water, hydrogen, or the like is contained in the oxide insulating film 23 and the oxide insulating film 25 and the nitride insulating film 26 has a barrier property against water, hydrogen, or the like, when the nitride insulating film 26 is formed later and heat treatment is performed, water, hydrogen, or the like contained in the oxide insulating film 23 and the oxide insulating film 25 are moved to the oxide semiconductor film 19a, so that defects are generated in the oxide semiconductor film 19a. However, by the heating, water, hydrogen, or the like contained in the oxide insulating film 23 and the oxide insulating film 25 can be released; thus, variation in electrical characteristics of the transistor 102 can be reduced, and a change in threshold voltage can be inhibited.

Note that when the oxide insulating film 24 is formed over the oxide insulating film 22 while being heated, oxygen can be moved to the oxide semiconductor film 19a to reduce the amount of oxygen vacancies in the oxide semiconductor film 19a; thus, the heat treatment is not necessarily performed.

The heat treatment may be performed after the formation of the oxide insulating films 22 and 24. However, the heat treatment is preferably performed after the formation of the oxide insulating films 23 and 25 because a film having higher conductivity can be formed in such a manner that oxygen is not moved to the oxide semiconductor film 19c and oxygen is released from the oxide semiconductor film 19c because of exposure of the oxide semiconductor film 19c and then oxygen vacancies are generated.

Here, the heat treatment is performed at 350° C. in a mixed atmosphere of nitrogen and oxygen for one hour.

Figure 12A:
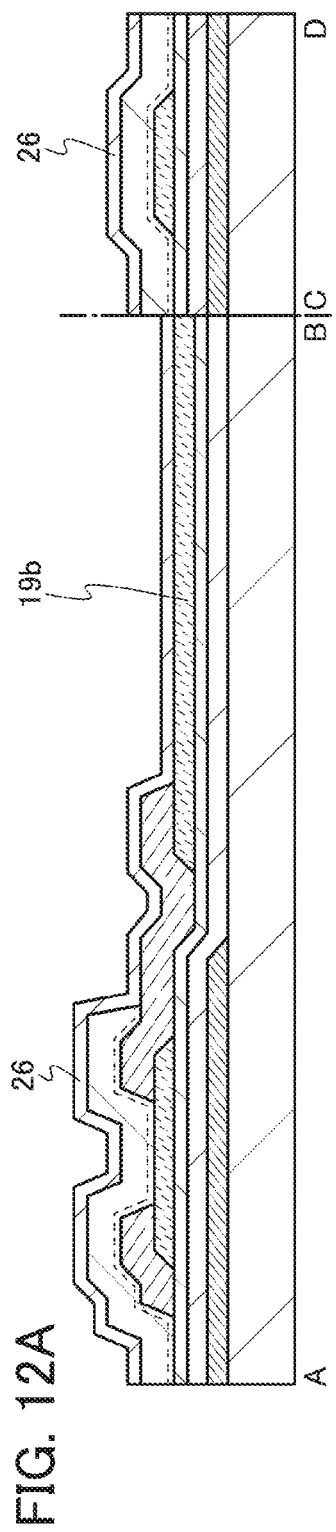
FIGS. 12A to 12C are cross-sectional views illustrating one embodiment of a method for manufacturing a display device.

Then, as illustrated in FIG. 12A, the nitride insulating film 26 is formed.

The nitride insulating film 26 can be formed by a method similar to those of the nitride insulating film 15 and the oxide insulating film 16 as appropriate. By forming the nitride insulating film 26 by a sputtering method, a CVD method, or the like, the oxide semiconductor film 19c is exposed to plasma; thus, the amount of oxygen vacancies in the oxide semiconductor film 19c can be increased.

The oxide semiconductor film 19c has improved conductivity and functions as the pixel electrode 19b. When a silicon nitride film is formed by a plasma CVD method as the nitride insulating film 26, hydrogen contained in the silicon nitride film is diffused into the oxide semiconductor film 19c; thus, the conductivity of the pixel electrode 19b can be enhanced.

In the case where a silicon nitride film is formed by a plasma CVD method as the nitride insulating film 26, the substrate placed in the treatment chamber of the plasma CVD apparatus that is vacuum-evacuated is preferably held at a temperature higher than or equal to 300° C. and lower than or equal to 400° C. further preferably higher than or equal to 320° C. and lower than or equal to 370° C., so that a dense silicon nitride film can be formed.

In the case where a silicon nitride film is formed, a deposition gas containing silicon, nitrogen, and ammonia are preferably used as a source gas. As the source gas, a small amount of ammonia compared to the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia is larger than the amount of nitrogen in the source gas, cleavage of a deposition gas containing silicon and cleavage of nitrogen are not promoted, so that a sparse silicon nitride film in which bonds between silicon and hydrogen remain and defects are increased is formed. Therefore, in a source gas, the flow ratio of the nitrogen to the ammonia is set to be preferably greater than or equal to 5 and less than or equal to 50, further preferably greater than or equal to 10 and less than or equal to 50.

Here, in the treatment chamber of a plasma CVD apparatus, a 50-nm-thick silicon nitride film is formed as the nitride insulating film 26 by a plasma CVD method in which silane with a flow rate of 50 sccm, nitrogen with a flow rate of 5000 sccm, and ammonia with a flow rate of 100 sccm are used as the source gas, the pressure in the treatment chamber is 100 Pa, the substrate temperature is 350° C., and a high-frequency power of 1000 W is supplied to parallel-plate electrodes with a high-frequency power supply of 27.12 MHz. Note that the plasma CVD apparatus is a parallel-plate plasma CVD apparatus in which the electrode area is 6000 cm$^2$, and the power per unit area (power density) into which the supplied power is converted is $1.7 \times 10^{-1}$ W/cm$^2$.

Next, heat treatment may be performed. The heat treatment is performed typically at a temperature higher than or equal to 150° C. and lower than or equal to 400° C., preferably higher than or equal to 300° C. and lower than or equal to 400° C., further preferably higher than or equal to 320° C. and lower than or equal to 370° C. As a result, the negative shift of the threshold voltage can be reduced. Moreover, the amount of change in the threshold voltage can be reduced.

Next, although not illustrated, a mask is formed by a photolithography process using a fifth photomask. Then, part of each of the nitride insulating film 15, the oxide insulating film 16, the oxide insulating film 23, the oxide insulating film 25, and the nitride insulating film 26 is etched using the mask to form the nitride insulating film 27 and an opening through which part of a connection terminal formed at the same time as the conductive film 13 is exposed. Alternatively, part of each of the oxide insulating film 23, the oxide insulating film 25, and the nitride insulating film 26 is etched to form the nitride insulating film 27 and an opening through which part of a connection terminal formed at the same time as the conductive films 21a and 21b is exposed.

Figure 12B:
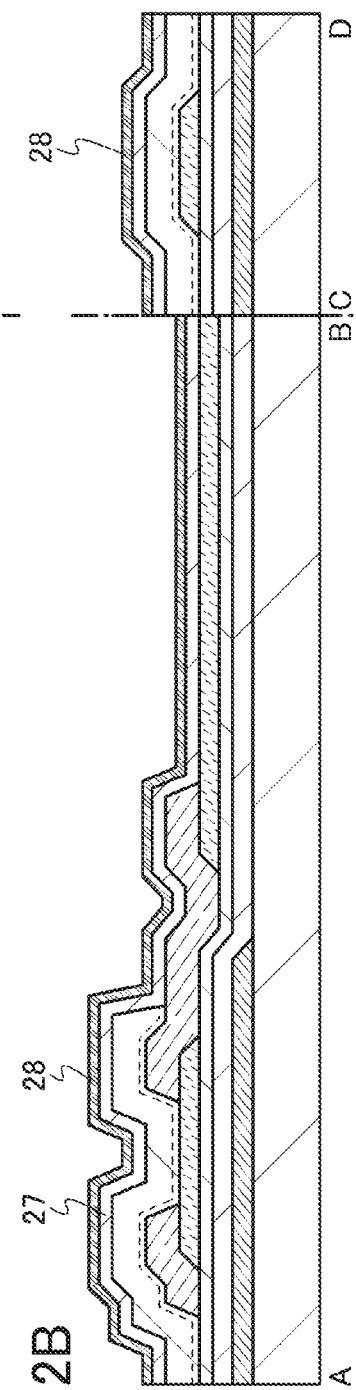

Next, as illustrated in FIG. 12B, a conductive film 28 to be the common electrode 29 later is formed over the nitride insulating film 27.

The conductive film 28 is formed by a sputtering method, a CVD method, an evaporation method, or the like.

Figure 12C:
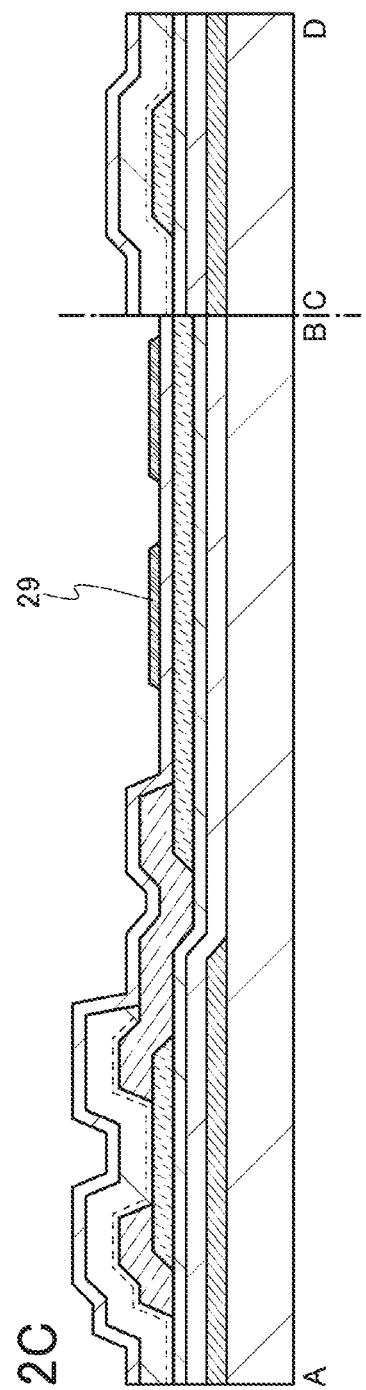

Then, a mask is formed over the conductive film 28 by a photolithography process using a sixth photomask. Next, as illustrated in FIG. 12C, part of the conductive film 28 is etched with the use of the mask to form the common electrode 29. Although not illustrated, the common electrode 29 is connected to the connection terminal formed at the same time as the conductive film 13 or the connection terminal formed at the same time as the conductive films 21a and 21b. After that, the mask is removed.

Through the above process, the transistor 102 is manufactured and the capacitor 105 can be manufactured.

The element substrate of the display device of this embodiment is provided with a common electrode whose upper surface has a zigzag shape and which includes stripe regions extending in a direction intersecting with the conductive film functioning as a signal line. Therefore, the display device can have excellent contrast. In addition, flickers can be reduced in a liquid crystal display device having a low refresh rate.

In the element substrate of the display device of this embodiment, the pixel electrode is formed at the same time as the oxide semiconductor film of the transistor; therefore, the transistor 102 and the capacitor 105 can be formed using six photomasks. The pixel electrode functions as the one of electrodes of the capacitor. The common electrode also functions as the other of electrodes of the capacitor. Thus, a step of forming another conductive film is not needed to form the capacitor, and the number of steps of manufacturing the display device can be reduced. The capacitor has a light-transmitting property. As a result, the area occupied by the capacitor can be increased and the aperture ratio in a pixel can be increased. Moreover, power consumption of the display device can be reduced.

Note that the structures, methods, and the like described in this embodiment can be used as appropriate in combination with any of the structures, methods, and the like described in the other embodiments.

Modification Example 1

A structure in which a common line connected to the common electrode is provided in the display device described in Embodiment 1 is described with reference to FIGS. 13A and 13B.

Figure 13A:
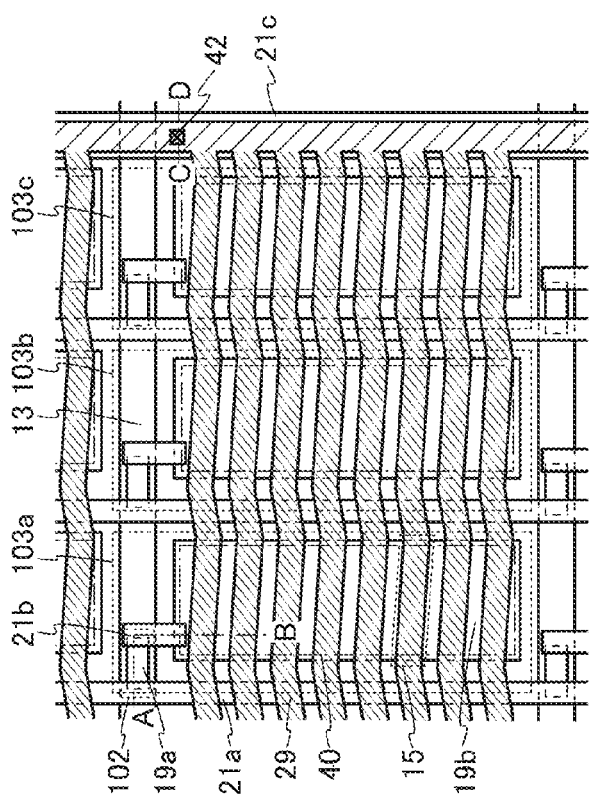
FIGS. 13A and 13B are a top view and a cross-sectional view illustrating one embodiment of a display device.
Figure 13B:
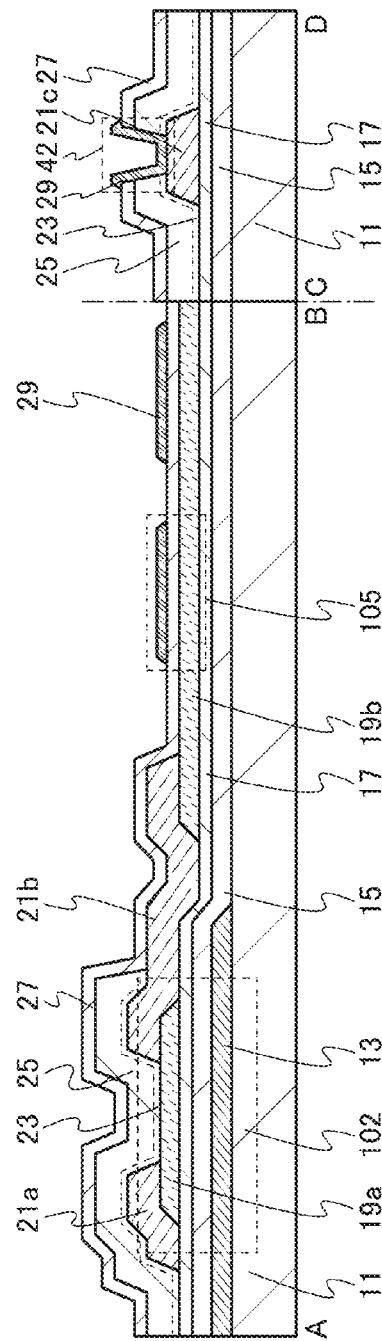

FIG. 13A is a top view of the pixels 103a, 103b, and 103c included in a display device, and FIG. 13B is a cross-sectional view taken along dashed-dotted lines A-B and C-D in FIG. 13A.

As illustrated in FIG. 13A, the upper surface of the common electrode 29 has a zigzag shape, and the extending direction of the conductive film 21a functioning as a signal line intersects with the extending direction of the common electrode 29.

For easy understanding of the structure of the common electrode 29, the common electrode 29 is hatched in FIG. 13A to explain its shape. The common electrode 29 includes regions hatched diagonally left down and a region hatched diagonally right down. The regions hatched diagonally left down are stripe regions (first regions) having a zigzag shape, and the extending direction of the conductive film 21a functioning as a signal line intersects with the extending direction of the common electrode 29. The region hatched diagonally right down is a connection region (second region) connected to the stripe regions (first regions) and extending in a direction parallel or substantially parallel to the conductive film 21a functioning as a signal line.

A common line 21c overlaps with the connection region (second region) of the common electrode 29.

The common line 21c may be provided par pixel. Alternatively, the common line 21c may be provided every plurality of pixels. For example, as illustrated in FIG. 13A, one common line 21c is provided for every three pixels, so that the area occupied by the common line in the flat plane of the display device can be reduced. Alternatively, one common line may be provided for every four or more pixels. As a result, the area of the pixel and the aperture ratio of the pixel can be increased.

In a region where the pixel electrode 19b and the common electrode 29 overlap with each other, a liquid crystal molecule is less likely to be driven by an electric field generated between the pixel electrode 19b and the connection region (second region) of the common electrode 29. Therefore, the area of a region overlapping with the pixel electrode 19b in the connection region (second region) of the common electrode 29 is reduced, so that a region where a liquid crystal molecule is driven can be increased, leading to an increase in the aperture ratio. For example, as illustrated in FIG. 13A, the connection region (second region) of the common electrode 29 is provided so as not to overlap with the pixel electrode 19b, whereby the area of a region where the pixel electrode 19b and the common electrode 29 overlap with each other can be reduced and thus the aperture ratio of the pixel can be increased.

As illustrated in FIG. 13B, the common line 21c can be formed at the same time as the conductive film 21a functioning as a signal line. The common electrode 29 is connected to the common line 21c in an opening 42 formed in the oxide insulating film 23, the oxide insulating film 25, and the nitride insulating film 27.

Since a material of the conductive film 21a has resistivity lower than that of the common electrode 29, resistance of the common electrode 29 and the common line 21c can be reduced.

Note that the structures, methods, and the like described in this embodiment can be used as appropriate in combination with any of the structures, methods, and the like described in the other embodiments.

Embodiment 3

In this embodiment, a display device which is different from the display device in Embodiment 2 and a manufacturing method thereof are described with reference to a drawing. This embodiment is different from Embodiment 2 in that a transistor included in a high resolution display device includes a source electrode and a drain electrode capable of reducing light leakage. Note that the structures similar to those in Embodiment 2 are not described repeatedly here.

Figure 14:
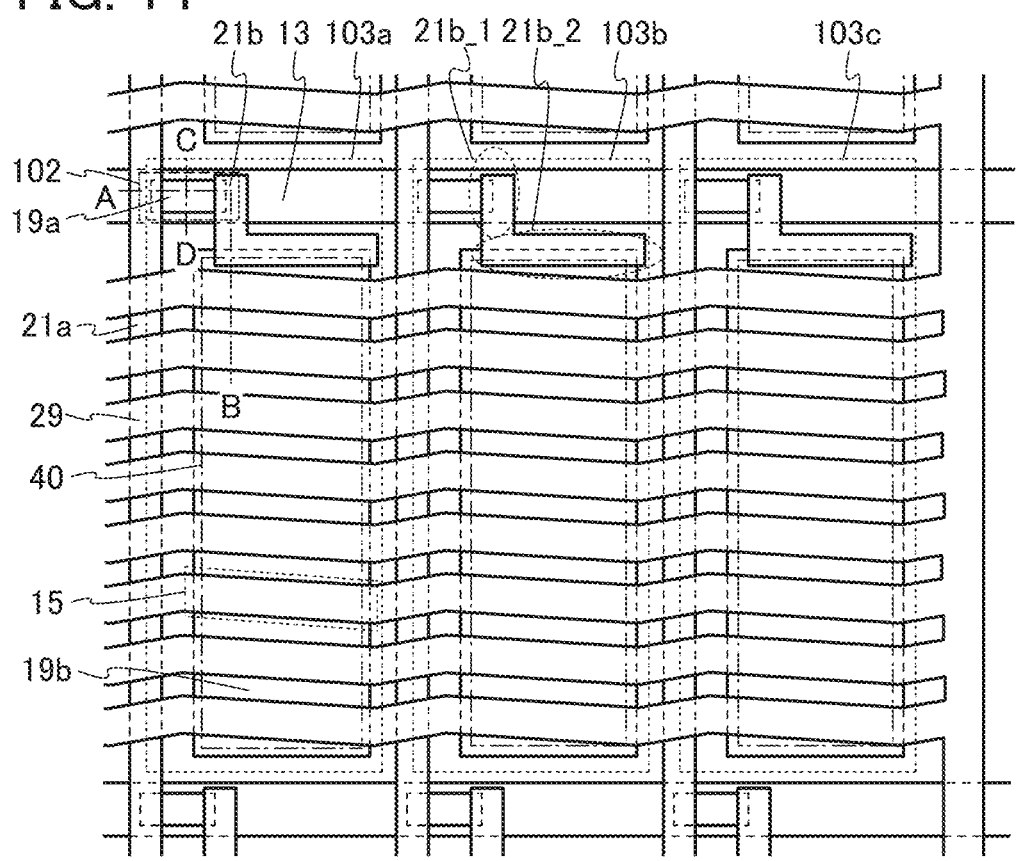
FIG. 14 is a top view illustrating one embodiment of a display device.

FIG. 14 is a top view of the display device described in this embodiment. One of features of the display device is that the conductive film 21b functioning as one of a source electrode and a drain electrode has an L shape in the top view. In other words, the conductive film 21b has a shape in which a region 21b_1 extending in a direction perpendicular to the conductive film 13 functioning as a scan line and a region 21b_2 extending in a direction parallel or substantially parallel to the conductive film 13 are connected to each other in the top view. The region 21b_2 overlaps with at least one of the conductive film 13, the pixel electrode 19b, and the common electrode 29 in the top view. Alternatively, the conductive film 21b includes the region 21b_2 extending in a direction parallel or substantially parallel to the conductive film 13 and the region 21b_2 is placed between the conductive film 13 and the pixel electrode 19b or the common electrode 29 in the top view.

Since the area of the pixel in a high resolution display device is reduced, the distance between the common electrode 29 and the conductive film 13 functioning as a scan line is reduced. In a pixel performing black display, when voltage at which a transistor is turned on is applied to the conductive film 13 functioning as a scan line, an electric field is generated between the pixel electrode 19b for black display and the conductive film 13 functioning as a scan line. As a result, a liquid crystal molecule rotates in an unintended direction, causing light leakage.

However, in the transistor included in the display device of this embodiment, the conductive film 21b functioning as the one of a source electrode and a drain electrode includes the region 21b_2 overlapping with at least one of the conductive film 13, the pixel electrode 19b, and the common electrode 29, or the region 21b_2 placed between the conductive film 13 and the pixel electrode 19b or the common electrode 29 in the top view. As a result, the region 21b_2 blocks the electric field of the conductive film 13 functioning as a scan line and an electric field generated between the conductive film 13 and the pixel electrode 19b can be suppressed, leading to a reduction in light leakage.

Figure 24:
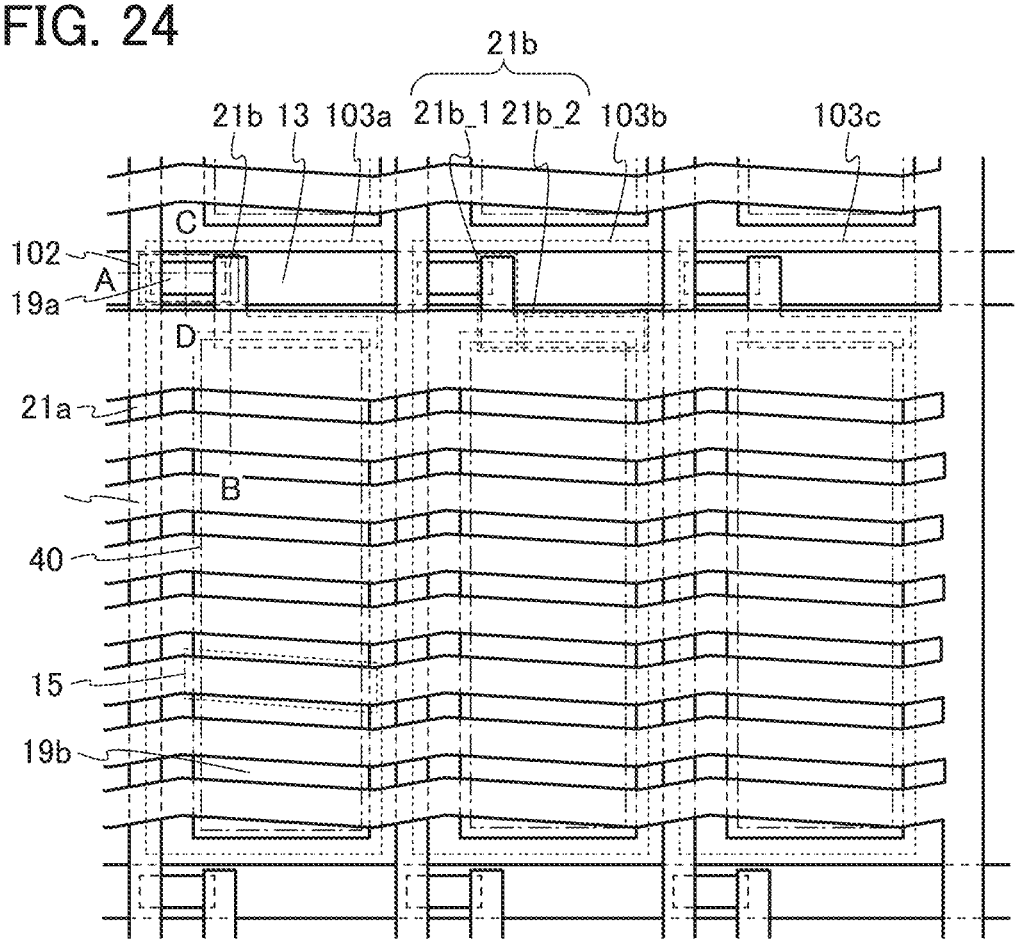
FIG. 24 is a top view illustrating one embodiment of a display device.

Note that the conductive film 21b and the common electrode 29 may overlap with each other. The overlapping region can function as a capacitor. Therefore, with this structure, the capacitance of the capacitor can be increased. FIG. 24 illustrates an example of this case.

Note that the structures, methods, and the like described in this embodiment can be used as appropriate in combination with any of the structures, methods, and the like described in the other embodiments.

Embodiment 4

In this embodiment, a display device which is different from the display devices in Embodiments 2 and 3 and a manufacturing method thereof are described with reference to drawings. This embodiment is different from Embodiment 2 in that a high resolution display device includes a common electrode capable of reducing light leakage. Note that the structures similar to those in Embodiment 2 are not described repeatedly here.

Figure 15:
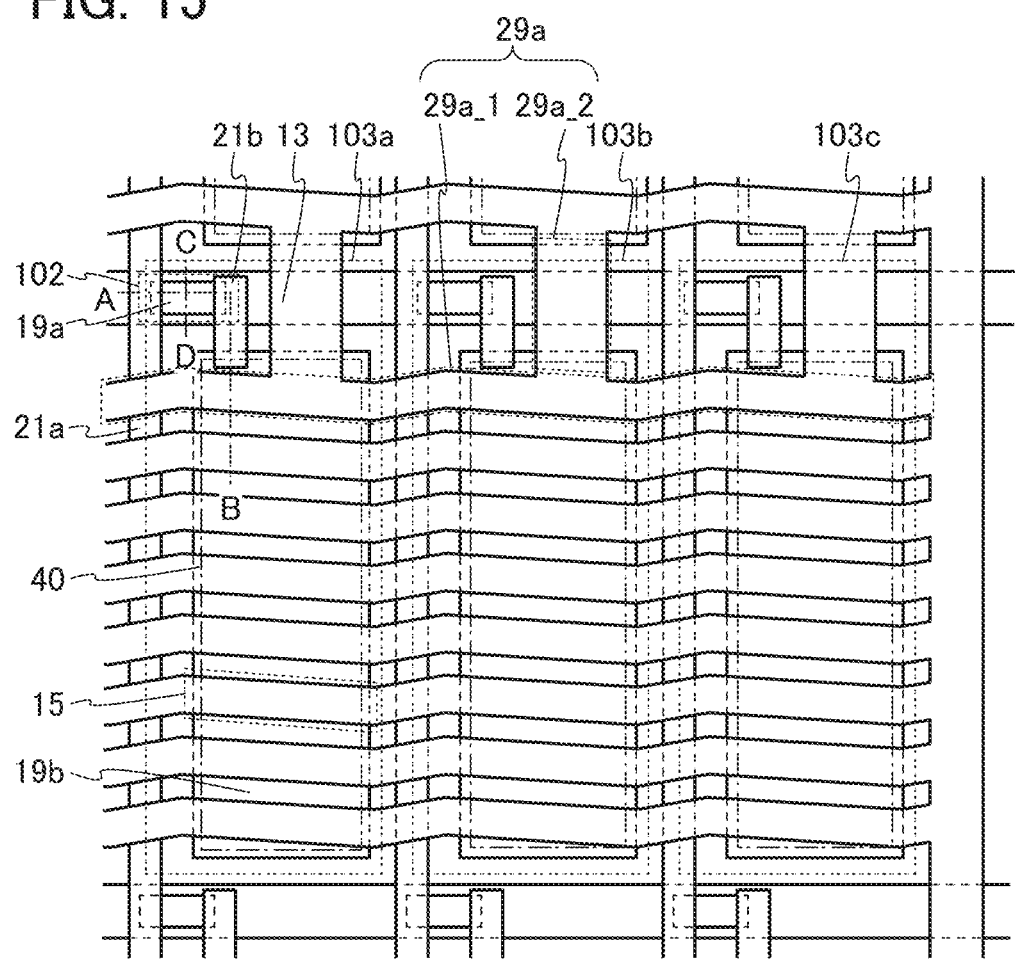
FIG. 15 is a top view illustrating one embodiment of a display device.

FIG. 15 is a top view of the display device described in this embodiment. A common electrode 29a includes a stripe region 29a_1 extending in a direction intersecting with the conductive film 21a functioning as a signal line and a region 29a_2 which is connected to the stripe region and overlaps with the conductive film 13 functioning as a scan line.

Since the area of a pixel is reduced in a high resolution display device, the distance between the pixel electrode 19b and the conductive film 13 functioning as a scan line is reduced. When voltage is applied to the conductive film 13 functioning as a scan line, an electric field is generated between the conductive film 13 and the pixel electrode 19b. As a result, a liquid crystal molecule rotates in an unintended direction, causing light leakage.

However, the display device described in this embodiment includes the common electrode 29a including the region 29a_2 intersecting with the conductive film 13 functioning as a scan line. Therefore, an electric field can be prevented from being generated between the common electrode 29a and the conductive film 13 functioning as a scan line, leading to a reduction in light leakage.

Figure 25:
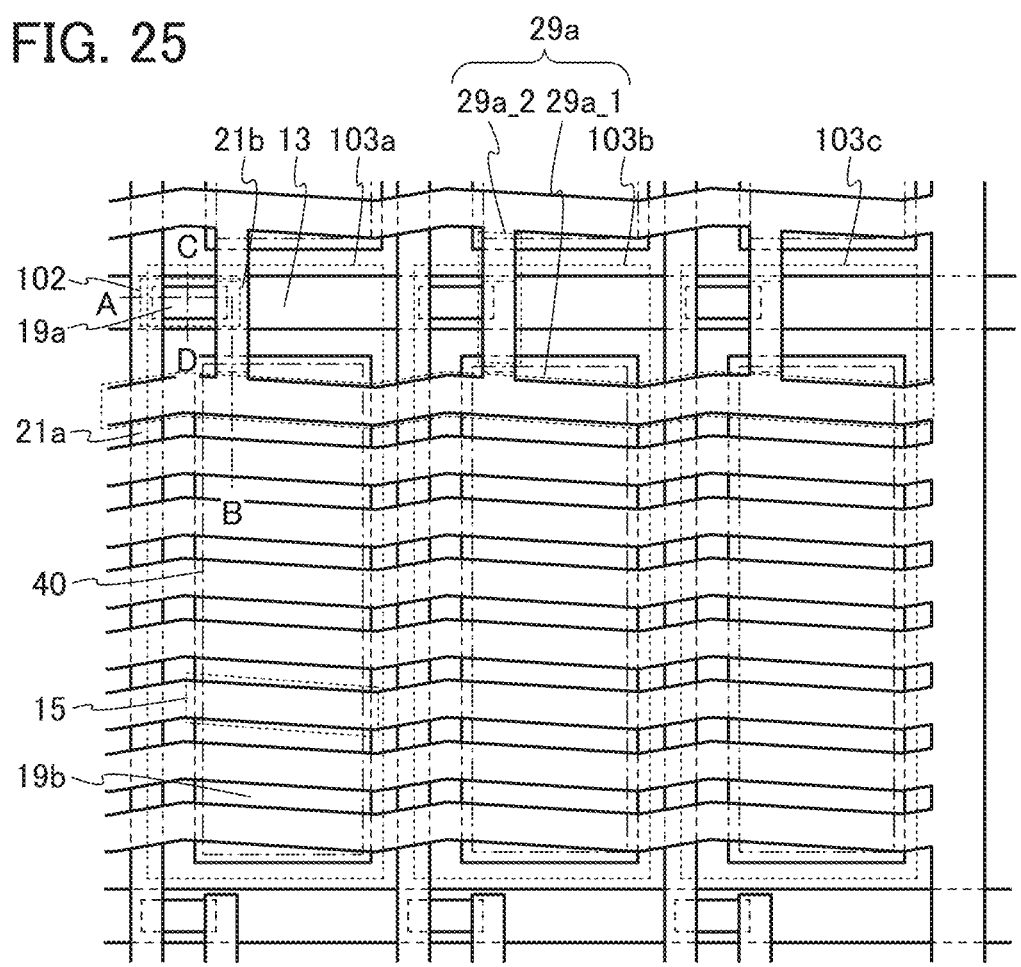
FIG. 25 is a top view illustrating one embodiment of a display device.

Note that the conductive film 21b and the common electrode 29 may overlap with each other. The overlapping region can function as a capacitor. Therefore, with this structure, the capacitance of the capacitor can be increased. FIG. 25 illustrates an example of this case.

Note that the structures, methods, and the like described in this embodiment can be used as appropriate in combination with any of the structures, methods, and the like described in the other embodiments.

Embodiment 5

In this embodiment, a display device which is different from the display device in Embodiment 2 and a manufacturing method thereof are described with reference to a drawing. The display device in this embodiment is different from that in Embodiment 2 in that the transistor has a structure in which an oxide semiconductor film is provided between different gate electrodes, that is, a dual-gate structure. Note that the structures similar to those in Embodiment 2 are not described repeatedly here.

Figure 26:
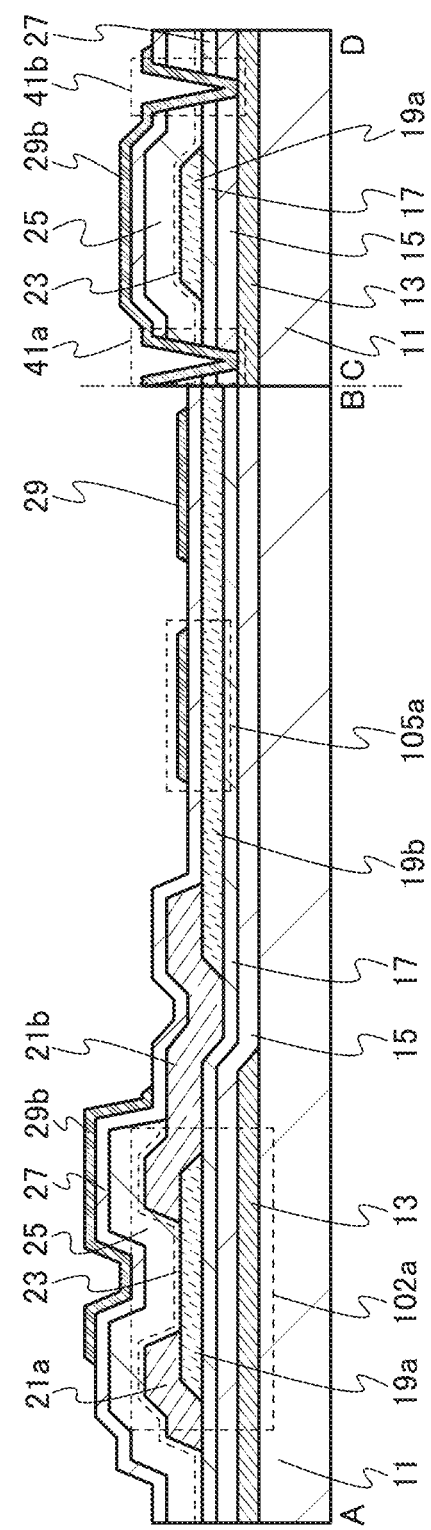
FIG. 26 is a cross-sectional view illustrating one embodiment of a display device.

A specific structure of an element substrate included in the display device is described. The element substrate in this embodiment is different from that in Embodiment 2 in that a conductive film 29b functioning as a gate electrode and overlapping part of or the whole of each of the conductive film 13 functioning as a gate electrode, the oxide semiconductor film 19a, the conductive films 21a and 21b, and the oxide insulating film 25 is provided, as illustrated in FIG. 26. The conductive film 29b functioning as a gate electrode is connected to the conductive film 13 functioning as a gate electrode in the openings 41a and 41b.

A transistor 102a shown in FIG. 26 is a channel-etched transistor. Note that a cross-sectional view along line A-B shows the transistor 102a in the channel length direction and a capacitor 105a, and a cross-sectional view along line C-D shows the transistor 102a in the channel width direction and a connection portion between the conductive film 13 functioning as a gate electrode and the conductive film 29b functioning as a gate electrode.

The transistor 102a in FIG. 26 has a dual-gate structure and includes the conductive film 13 functioning as a gate electrode over the substrate 11. In addition, the transistor 102a includes the nitride insulating film 15 formed over the substrate 11 and the conductive film 13 functioning as a gate electrode; the oxide insulating film 17 formed over the nitride insulating film 15; the oxide semiconductor film 19a overlapping with the conductive film 13 functioning as a gate electrode with the nitride insulating film 15 and the oxide insulating film 17 therebetween; and the conductive films 21a and 21b functioning as a source electrode and a drain electrode which are in contact with the oxide semiconductor film 19a. Moreover, the oxide insulating film 23 is formed over the oxide insulating film 17, the oxide semiconductor film 19a, and the conductive films 21a and 21b functioning as a source electrode and a drain electrode, and the oxide insulating film 25 is formed over the oxide insulating film 23. The nitride insulating film 27 is formed over the nitride insulating film 15, the oxide insulating film 23, the oxide insulating film 25, and the conductive film 21b. The pixel electrode 19b is formed over the oxide insulating film 17. The pixel electrode 19b is connected to one of the conductive films 21a and 21b functioning as a source electrode and a drain electrode, here, connected to the conductive film 21b. The common electrode 29 and the conductive film 29b functioning as a gate electrode are formed over the nitride insulating film 27.

As illustrated in the cross-sectional view along line C-D, the conductive film 29b functioning as a gate electrode is connected to the conductive film 13 functioning as a gate electrode in the opening 41a provided in the nitride insulating film 15 and the nitride insulating film 27. That is, the conductive film 13 functioning as a gate electrode and the conductive film 29b functioning as a gate electrode have the same potential.

Thus, by applying voltage at the same potential to each gate electrode of the transistor 102a, variation in the initial characteristics can be reduced, and degradation of the transistor 102a after the −GBT stress test and a change in the rising voltage of on-state current at different drain voltages can be suppressed. In addition, a region where carriers flow in the oxide semiconductor film 19a becomes larger in the film thickness direction, so that the amount of carrier movement is increased. As a result, the on-state current of the transistor 102a is increased, and the field-effect mobility is increased. Typically, the field-effect mobility is greater than or equal to 20 cm$^2$/V·s.

Over the transistor 102a in this embodiment, the oxide insulating films 23 and 25, which are subjected to element isolation, are formed. The oxide insulating films 23 and 25 which are separated from each other overlap with the oxide semiconductor film 19a. In the cross-sectional view in the channel width direction, end portions of the oxide insulating films 23 and 25 are positioned on an outer side than the oxide semiconductor film 19a. Furthermore, in the channel width direction in FIG. 26, the conductive film 29b functioning as a gate electrode faces a side surface of the oxide semiconductor film 19a with the oxide insulating films 23 and 25 therebetween.

An end portion processed by etching or the like of the oxide semiconductor film is damaged by processing, to produce defects and also contaminated by the attachment of an impurity, or the like. Thus, the end portion of the oxide semiconductor film is easily activated by application of a stress such as an electric field, thereby easily becoming n-type (having a low resistance). Therefore, the end portion of the oxide semiconductor film 19a overlapping the conductive film 13 functioning as a gate electrode easily becomes n-type. When the end portion which becomes n-type is provided between the conductive films 21a and 21b functioning as a source electrode and a drain electrode, the region which becomes n-type functions as a carrier path, resulting in a parasitic channel. However, as illustrated in the cross-sectional view along line C-D, when the conductive film 29b functioning as a gate electrode faces a side surface of the oxide semiconductor film 19a with the oxide insulating films 23 and 25 provided therebetween in the channel width direction, due to the electric field of the conductive film 29b functioning as a gate electrode, generation of a parasitic channel on the side surface of the oxide semiconductor film 19a or in a region including the side surface and the vicinity of the side surface is suppressed. As a result, a transistor which has excellent electrical characteristics such as a sharp increase in the drain current at the threshold voltage is obtained.

In the capacitor 105a, the pixel electrode 19b is formed at the same time as the oxide semiconductor film 19a and has increased conductivity by containing an impurity. Alternatively, the pixel electrode 19b is formed at the same time as the oxide semiconductor film 19a, and has increased conductivity by containing oxygen vacancies generated by plasma damage or the like. Alternatively, the pixel electrode 19b is formed at the same time as the oxide semiconductor film 19a, and has increased conductivity by containing impurities and oxygen vacancies generated by plasma damage or the like.

On an element substrate of the display device described in this embodiment, the pixel electrode is formed at the same time as the oxide semiconductor film of the transistor. The pixel electrode also functions as one of electrodes of the capacitor. The common electrode also functions as the other of electrodes of the capacitor. Thus, a step of forming another conductive film is not needed to form the capacitor, and the number of steps of manufacturing the semiconductor device can be reduced. The capacitor has a light-transmitting property. As a result, the area occupied by the capacitor can be increased and the aperture ratio in a pixel can be increased.

Details of the transistor 102a are described below. Note that the components with the same reference numerals as those in Embodiment 2 are not described here.

The conductive film 29b functioning as a gate electrode can be formed using a material similar to that of the common electrode 29 in Embodiment 2.

Next, a method for manufacturing the transistor 102a and the capacitor 105a in FIG. 26 is described with reference to FIGS. 10A to 10D, FIGS. 11A to 11D, FIG. 12A, and FIGS. 27A to 27C.

As in Embodiment 2, through the steps illustrated in FIGS. 10A to 12A, the conductive film 13 functioning as a gate electrode, the nitride insulating film 15, the oxide insulating film 16, the oxide semiconductor film 19a, the pixel electrode 19b, the conductive films 21a and 21b functioning as a source electrode and a drain electrode, the oxide insulating film 22, the oxide insulating film 24, and the nitride insulating film 26 are formed over the substrate 11. In these steps, photography processes using the first photomask to the fourth photomask are performed.

Figure 27:
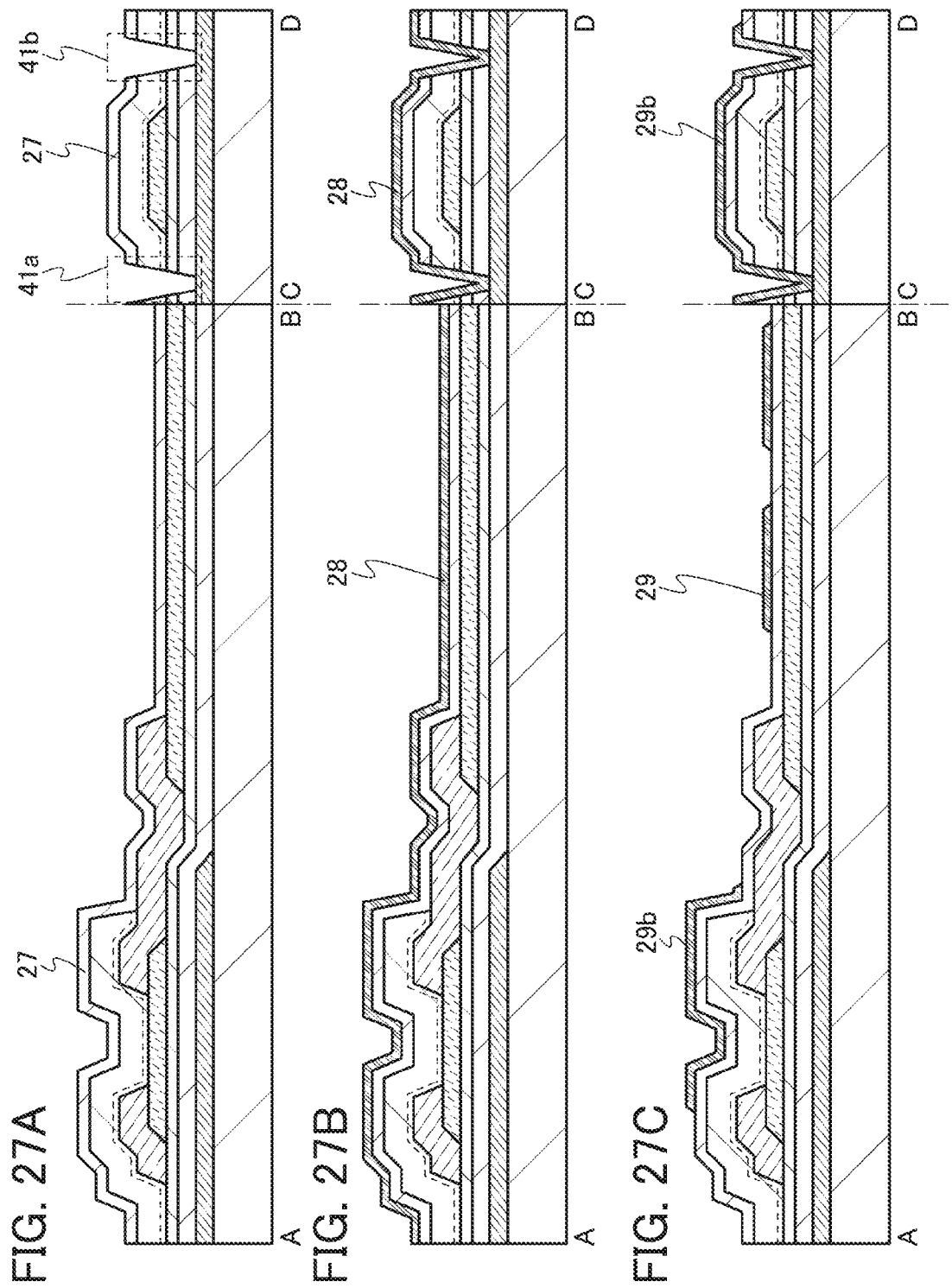
FIGS. 27A to 27C are cross-sectional views illustrating one embodiment of a method for manufacturing a display device.

Next, a mask is formed over the nitride insulating film 26 through a photolithography process using a fifth photomask, and then part of the nitride insulating film 26 is etched using the mask; thus, the nitride insulating film 27 having the openings 41a and 41b is formed as illustrated in FIG. 27A.

Next, as illustrated in FIG. 27B, the conductive film 28 to be the common electrode 29 and the conductive film 29b functioning as a gate electrode is formed over the conductive film 13 functioning as a gate electrode, the conductive film 21b, and the nitride insulating film 27.

Then, a mask is formed over the conductive film 28 by a photolithography process using a sixth photomask. Next, as illustrated in FIG. 27C, part of the conductive film 28 is etched with the use of the mask to form the common electrode 29 and the conductive film 29b functioning as a gate electrode. After that, the mask is removed.

Through the above process, the transistor 102a is manufactured and the capacitor 105a can also be manufactured.

In the transistor described in this embodiment, when the common electrode 29 functioning as a gate electrode faces a side surface of the oxide semiconductor film 19a with the oxide insulating films 23 and 25 therebetween in the channel width direction, due to the electric field of the conductive film 29b functioning as a gate electrode, generation of a parasitic channel on the side surface of the oxide semiconductor film 19a or in a region including the side surface and the vicinity of the side surface is suppressed. As a result, a transistor which has excellent electrical characteristics such as a sharp increase in the drain current at the threshold voltage is obtained.

The element substrate of the display device of this embodiment is provided with a common electrode including a stripe region extending in a direction intersecting with a signal line. Therefore, the display device can have excellent contrast.

On an element substrate of the display device described in this embodiment, the pixel electrode is formed at the same time as the oxide semiconductor film of the transistor. The pixel electrode also functions as one of electrodes of the capacitor. The common electrode functions as the other of electrodes of the capacitor. Thus, a step of forming another conductive film is not needed to form the capacitor, and the number of steps of manufacturing the semiconductor device can be reduced. The capacitor has a light-transmitting property. As a result, the area occupied by the capacitor can be increased and the aperture ratio in a pixel can be increased.

Note that the structures, methods, and the like described in this embodiment can be used as appropriate in combination with any of the structures, methods, and the like described in the other embodiments.

Embodiment 6

In this embodiment, a display device including a transistor in which the number of defects in an oxide semiconductor film can be further reduced as compared to the above embodiments is described with reference to drawings. The transistor described in this embodiment is different from any of the transistors in Embodiments 2 to 5 in that a multilayer film including a plurality of oxide semiconductor films is provided. Here, details are described using the transistor in Embodiment 2.

FIGS. 16A and 16B each illustrate a cross-sectional view of an element substrate included in a display device. FIGS. 16A and 16B are cross-sectional views taken along lines A-B and C-D in FIG. 6.

A transistor 102b in FIG. 16A includes a multilayer film 37a overlapping with the conductive film 13 functioning as a gate electrode with the nitride insulating film 15 and the oxide insulating film 17 therebetween, and the conductive films 21a and 21b functioning as a source electrode and a drain electrode in contact with the multilayer film 37a. The oxide insulating film 23, the oxide insulating film 25, and the nitride insulating film 27 are formed over the nitride insulating film 15, the oxide insulating film 17, the multilayer film 37a, and the conductive films 21a and 21b functioning as a source electrode and a drain electrode.

The capacitor 105b in FIG. 16A includes a multilayer film 37b formed over the oxide insulating film 17, the nitride insulating film 27 in contact with the multilayer film 37b, and the common electrode 29 in contact with the nitride insulating film 27. The multilayer film 37b functions as a pixel electrode.

In the transistor 102b described in this embodiment, the multilayer film 37a includes the oxide semiconductor film 19a and an oxide semiconductor film 39a. That is, the multilayer film 37a has a two-layer structure. In addition, part of the oxide semiconductor film 19a functions as a channel region. Moreover, the oxide insulating film 23 is formed in contact with the multilayer film 37a, and the oxide insulating film 25 is formed in contact with the oxide insulating film 23. That is, the oxide semiconductor film 39a is provided between the oxide semiconductor film 19a and the oxide insulating film 23.

The oxide semiconductor film 39a is an oxide film containing one or more elements that constitute the oxide semiconductor film 19a. Thus, interface scattering is unlikely to occur at the interface between the oxide semiconductor films 19a and 39a. Thus, the transistor can have high field-effect mobility because the movement of carriers is not hindered at the interface.

The oxide semiconductor film 39a is typically an In—Ga oxide film, an In—Zn oxide film, or an In-M-Zn oxide film (M represents Al, Ga, Y, Zr, Sn, La, Ce, or Nd). The energy at the conduction band bottom of the oxide semiconductor film 39a is closer to a vacuum level than that of the oxide semiconductor film 19a is, and typically, the difference between the energy at the conduction band bottom of the oxide semiconductor film 39a and the energy at the conduction band bottom of the oxide semiconductor film 19a is any one of 0.05 eV or more, 0.07 eV or more, 0.1 eV or more, or 0.15 eV or more, and any one of 2 eV or less, 1 eV or less, 0.5 eV or less, or 0.4 eV or less. That is, the difference between the electron affinity of the oxide semiconductor film 39a and the electron affinity of the oxide semiconductor film 19a is any one of 0.05 eV or more, 0.07 eV or more, 0.1 eV or more, or 0.15 eV or more, and any one of 2 eV or less, 1 eV or less, 0.5 eV or less, or 0.4 eV or less.

The oxide semiconductor film 39a preferably contains In because carrier mobility (electron mobility) can be increased.

When the oxide semiconductor film 39a contains a larger amount of Al, Ga, Y, Zr, Sn, La, Ce, or Nd in an atomic ratio than the amount of In in an atomic ratio, any of the following effects may be obtained: (1) the energy gap of the oxide semiconductor film 39a is widened; (2) the electron affinity of the oxide semiconductor films film 39a is reduced; (3) scattering of impurities from the outside is reduced; (4) an insulating property increases as compared to the oxide semiconductor film 19a; and (5) oxygen vacancies are less likely to be generated because Al, Ga, Y, Zr, Sn, La, Ce, or Nd is a metal element strongly bonded to oxygen.

In the case where the oxide semiconductor film 39a is an In-M-Zn oxide film, the proportions of In and M when the summation of In and M is assumed to be 100 atomic % are preferably as follows: the atomic percentage of In is less than 50 atomic % and the atomic percentage of M is more than 50 atomic %; further preferably, the atomic percentage of In is less than 25 atomic % and the atomic percentage of M is more than 75 atomic %.

Furthermore, in the case where each of the oxide semiconductor films 19a and 39a is an In-M-Zn oxide film (M represents Al, Ga, Y, Zr, Sn, La, Ce, or Nd), the proportion of M atoms (M represents Al, Ga, Y, Zr, Sn, La, Ce, or Nd) in the oxide semiconductor film 39a is higher than that in the oxide semiconductor film 19a. As a typical example, the proportion of M in the oxide semiconductor film 39a is 1.5 times or more, preferably twice or more, further preferably three times or more as high as that in the oxide semiconductor film 19a.

Furthermore, in the case where each of the oxide semiconductor film 19a and the oxide semiconductor film 39a is an In-M-Zn oxide film (M represents Al, Ga, Y. Zr, Sn, La, Ce, or Nd), when In:M:Zn=$x_1$:$y_1$:$z_1$ [atomic ratio] is satisfied in the oxide semiconductor film 39a and In:M:Zn=$x_2$:$y_2$:$z_2$ [atomic ratio] is satisfied in the oxide semiconductor film 19a, $y_1/x_1$ is higher than $y_2/x_2$. Preferably, $y_1/x_1$ is 1.5 times or more as high as $y_2/x_2$. Further preferably, $y_1/x_1$ is twice or more as high as $y_2/x_2$. Still further preferably, $y_1/x_1$ is three times or more as high as $y_2/x_2$.

In the case where the oxide semiconductor film 19a is an In-M-Zn oxide film (M is Al, Ga, Y, Zr, Sn, La, Ce, or Nd) and a target having the atomic ratio of metal elements of In:M:Zn=$x_1$:$y_1$:$z_1$ is used for forming the oxide semiconductor film 19a, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 19a is easily formed. Typical examples of the atomic ratio of the metal elements of the target are In:M:Zn=1:1:1, In:M:Zn=1:1:1.2, and In:M:Zn=3:1:2.

In the case where the oxide semiconductor film 39a is an In-M-Zn oxide film (M is Al, Ga, Y, Zr, Sn, La, Ce, or Nd) and a target having the atomic ratio of metal elements of In:M:Zn=$x_2$:$y_2$:$z_2$ is used for forming the oxide semiconductor film 39a, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film to be described later as the oxide semiconductor film 39a is easily formed. Typical examples of the atomic ratio of the metal elements of the target are In:M:Zn=1:3:2, In:M:Zn=1:3:4, In:M:Zn=1:3:6, In:M:Zn=1:3:8, In:M:Zn=1:4:4, In:M:Zn=1:4:5, and In:M:Zn=1:6:8.

Note that the proportion of each metal element in the atomic ratio of each of the oxide semiconductor films 19a and the oxide semiconductor film 39a varies within a range of ±40% of that in the above atomic ratio as an error.

The oxide semiconductor film 39a also functions as a film that relieves damage to the oxide semiconductor film 19a at the time of forming the oxide insulating film 25 later.

The thickness of the oxide semiconductor film 39a is greater than or equal to 3 nm and less than or equal to 100 nm, preferably greater than or equal to 3 nm and less than or equal to 50 nm.

The oxide semiconductor film 39a may have a non-single-crystal structure, for example, like the oxide semiconductor film 19a. The non-single crystal structure includes a c-axis aligned crystalline oxide semiconductor (CAAC-OS), a polycrystalline structure, a microcrystalline structure, or an amorphous structure, which is described later, for example.

The oxide semiconductor film 39a may have an amorphous structure, for example. The oxide semiconductor films having the amorphous structure each have disordered atomic arrangement and no crystalline component, for example. Alternatively, the oxide films having an amorphous structure have, for example, an absolutely amorphous structure and no crystal part.

Note that the oxide semiconductor films 19a and 39a may each be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure in which two or more of the following regions are stacked: a region having an amorphous structure, a region having a microcrystalline structure, a region having a polycrystalline structure, a CAAC-OS region, and a region having a single-crystal structure.

Here, the oxide semiconductor film 39a is formed between the oxide semiconductor film 19a and the oxide insulating film 23. Thus, if carrier traps are formed between the oxide semiconductor film 39a and the oxide insulating film 23 by impurities and defects, electrons flowing in the oxide semiconductor film 19a are less likely to be captured by the carrier traps because there is a distance between the carrier traps and the oxide semiconductor film 19a. Accordingly, the amount of on-state current of the transistor can be increased, and the field-effect mobility can be increased. When the electrons are captured by the carrier traps, the electrons become negative fixed charges. As a result, a threshold voltage of the transistor fluctuates. However, by the distance between the oxide semiconductor film 19a and the carrier traps, capture of electrons by the carrier traps can be reduced, and accordingly, fluctuations of the threshold voltage can be reduced.

Impurities from the outside can be blocked by the oxide semiconductor film 39a, and accordingly, the amount of impurities that are transferred from the outside to the oxide semiconductor film 19a can be reduced. Furthermore, an oxygen vacancy is less likely to be formed in the oxide semiconductor film 39a. Consequently, the impurity concentration and the number of oxygen vacancies in the oxide semiconductor film 19a can be reduced.

Note that the oxide semiconductor films 19a and 39a are not only formed by simply stacking each film, but also are formed to have a continuous junction (here, in particular, a structure in which the energy of the bottom of the conduction band is changed continuously between each film). In other words, a stacked-layer structure in which there exist no impurity that forms a defect level such as a trap center or a recombination center at the interface between the films is provided. If an impurity exists between the oxide semiconductor films 19a and 39a which are stacked, a continuity of the energy band is damaged, and the carrier is captured or recombined at the interface and then disappears.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which functions as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

As in a transistor 102c in FIG. 16B, a multilayer film 38a may be provided instead of the multilayer film 37a.

In addition, as in a capacitor 105c in FIG. 16B, a multilayer film 38b may be provided instead of the multilayer film 37b.

The multilayer film 38a includes an oxide semiconductor film 49a, the oxide semiconductor film 19a, and the oxide semiconductor film 39a. That is, the multilayer film 38a has a three-layer structure. Furthermore, the oxide semiconductor film 19a functions as a channel region.

The oxide semiconductor film 49a can be formed using a material and a formation method similar to those of the oxide semiconductor film 39a.

The multilayer film 38b includes an oxide semiconductor film 49b, an oxide semiconductor film 19f, and an oxide semiconductor film 39b. In other words, the multilayer film 38b has a three-layer structure. The multilayer film 38b functions as a pixel electrode.

The oxide semiconductor film 19f can be formed using a material and a formation method similar to those of the pixel electrode 19b as appropriate. The oxide semiconductor film 49b can be formed using a material and a formation method similar to those of the oxide semiconductor film 39b as appropriate.

In addition, the oxide insulating film 17 and the oxide semiconductor film 49a are in contact with each other. That is, the oxide semiconductor film 49a is provided between the oxide insulating film 17 and the oxide semiconductor film 19a.

The multilayer film 38a and the oxide insulating film 23 are in contact with each other. In addition, the oxide semiconductor film 39a and the oxide insulating film 23 are in contact with each other. That is, the oxide semiconductor film 39a is provided between the oxide semiconductor film 19a and the oxide insulating film 23.

It is preferable that the thickness of the oxide semiconductor film 49a be smaller than that of the oxide semiconductor film 19a. When the thickness of the oxide semiconductor film 49a is greater than or equal to 1 nm and less than or equal to 5 nm, preferably greater than or equal to 1 nm and less than or equal to 3 nm, the amount of change in the threshold voltage of the transistor can be reduced.

In the transistor described in this embodiment, the oxide semiconductor film 39a is provided between the oxide semiconductor film 19a and the oxide insulating film 23. Thus, if carrier traps are formed between the oxide semiconductor film 39a and the oxide insulating film 23 by impurities and defects, electrons flowing in the oxide semiconductor film 19a are less likely to be captured by the carrier traps because there is a distance between the carrier traps and the oxide semiconductor film 19a. Accordingly, the amount of on-state current of the transistor can be increased, and the field-effect mobility can be increased. When the electrons are captured by the carrier traps, the electrons become negative fixed charges. As a result, a threshold voltage of the transistor fluctuates. However, by the distance between the oxide semiconductor film 19a and the carrier traps, capture of electrons by the carrier traps can be reduced, and accordingly, fluctuations of the threshold voltage can be reduced.

Impurities from the outside can be blocked by the oxide semiconductor film 39a, and accordingly, the amount of impurities that are transferred from the outside to the oxide semiconductor film 19a can be reduced. In addition, an oxygen vacancy is less likely to be formed in the oxide semiconductor film 39a. Consequently, the impurity concentration and the number of oxygen vacancies in the oxide semiconductor film 19a can be reduced.

Furthermore, the oxide semiconductor film 49a is provided between the oxide insulating film 17 and the oxide semiconductor film 19a, and the oxide semiconductor film 39a is provided between the oxide semiconductor film 19a and the oxide insulating film 23. Thus, it is possible to reduce the concentration of silicon or carbon in the vicinity of the interface between the oxide semiconductor film 49a and the oxide semiconductor film 19a, the concentration of silicon or carbon in the oxide semiconductor film 19a, or the concentration of silicon or carbon in the vicinity of the interface between the oxide semiconductor film 39a and the oxide semiconductor film 19a. Consequently, in the multilayer film 38a, the absorption coefficient derived from a constant photocurrent method is lower than $1\times10^{-3}$/cm, preferably lower than $1\times10^{-4}$/cm, and thus density of localized levels is extremely low.

The transistor 102c having such a structure includes very few defects in the multilayer film 38a including the oxide semiconductor film 19a; thus, the electrical characteristics of the transistor can be improved, and typically, the on-state current can be increased and the field-effect mobility can be improved. Moreover, in a BT stress test and a BT photostress test which are examples of a stress test, the amount of change in threshold voltage is small, and thus, reliability is high.

Note that the structures, methods, and the like described in this embodiment can be used as appropriate in combination with any of the structures, methods, and the like described in the other embodiments.

Embodiment 7

In this embodiment, one embodiment that can be applied to the oxide semiconductor film in the transistor included in the display device described in the above embodiment is described.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). In addition, the oxide semiconductor film may include a CAAC-OS film. Furthermore, the oxide semiconductor film may include an amorphous oxide semiconductor and an oxide semiconductor having a crystal grain. Described below are a CAAC-OS and a microcrystalline oxide semiconductor as typical examples.

<CAAC-OS>

The CAAC-OS film is one of oxide semiconductor films having a plurality of crystal parts. The crystal parts included in the CAAC-OS film each have c-axis alignment. In a plan TEM image, the area of the crystal parts included in the CAAC oxide film is greater than or equal to 2500 nm$^2$, preferably greater than or equal to 5 μm$^2$, further preferably greater than or equal to 1000 μm$^2$. Furthermore, in a cross-sectional TEM image, when the proportion of the crystal parts is greater than or equal to 50%, preferably greater than or equal to 80%, further preferably greater than or equal to 95% of the CAAC-OS film, the CAAC-OS film is a thin film having physical properties similar to those of a single crystal.

In a transmission electron microscope (TEM) observation image of the CAAC-OS film, it is difficult to clearly observe a boundary between crystal parts, that is, a grain boundary. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film. In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (luminescent spots) having alignment are shown.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film is analyzed by an out-of-plane method, a peak appears frequently when the diffraction angle (2θ) is around 31°. This peak is derived from the (00x) plane (x is an integral number) of the In—Ga—Zn oxide crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the In—Ga—Zn oxide crystal. Here, analysis (φ scan) is performed under conditions where the sample is rotated around a normal vector of a sample surface as an axis (φ axis) with 2θ fixed at around 56°. In the case where the sample is a single-crystal metal oxide semiconductor film of In—Ga—Zn oxide, six peaks appear. The six peaks are derived from crystal planes equivalent to the (110) plane. On the other hand, in the case of a CAAC-OS film, a peak is not clearly observed even when 0 scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Furthermore, the degree of crystallinity in the CAAC-OS film is not necessarily uniform. For example, in the case where crystal growth leading to crystal parts in the CAAC-OS film occurs from the vicinity of the top surface of the film, the degree of the crystallinity in the vicinity of the top surface is higher than that in the vicinity of the formation surface in some cases. Furthermore, when an impurity is added to the CAAC-OS film, the crystallinity in a region to which the impurity is added is changed, and the degree of crystallinity in the CAAC-OS film varies depending on regions.

Note that when the CAAC-OS film is analyzed by an out-of-plane method, a peak of 2θ may also be observed at around 36°, in addition to the peak of 2θ at around 31°. The peak of 2θ at around 36° indicates that a crystal part having no c-axis alignment is included in part of the CAAC-OS film. Preferably, in the CAAC-OS film, a peak of 2θ appears at around 31° and a peak of 2θ does not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. In addition, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might function as a carrier trap or a carrier generation source.

The CAAC-OS film is an oxide semiconductor film having a low density of defect states. In some cases, oxygen vacancies in the oxide semiconductor film function as carrier traps or function as carrier generation sources when hydrogen is captured therein.

The state in which impurity concentration is low and density of defect states is low (the amount of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

<Microcrystalline Oxide Semiconductor>

In an image observed with the TEM, crystal parts cannot be found clearly in a microcrystalline oxide semiconductor film in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film observed with a TEM, for example, a grain boundary is not easily and clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in a selected-area electron diffraction pattern of the nc-OS film obtained by using an electron beam having a probe diameter (e.g., larger than or equal to 50 nm) larger than a diameter of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

<Oxide Semiconductor Film and Oxide Conductor Film>

Figure 38:
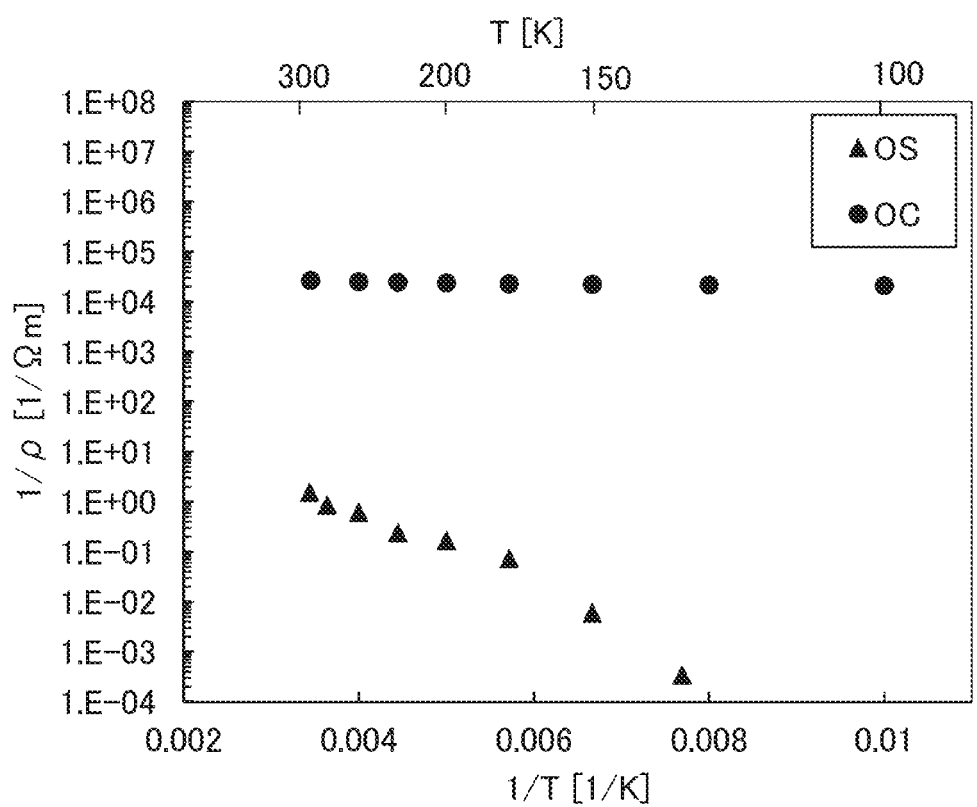
FIG. 38 is a graph showing temperature dependence of conductivity.

Next, the temperature dependence of conductivity of a film formed with an oxide semiconductor (hereinafter referred to as an oxide semiconductor film (OS)) and that of a film formed with an oxide conductor (hereinafter referred to as an oxide conductor film (OC)), which can be used for the pixel electrode 19b, will be described with reference to FIG. 38. In FIG. 38, the horizontal axes represent measurement temperature (the lower horizontal axis represents 1/T and the upper horizontal axis represents T), and the vertical axis represents conductivity ($1/\rho$). Measurement results of the oxide semiconductor film (OS) are plotted as triangles, and measurement results of the oxide conductor film (OC) are plotted as circles.

Note that a sample including the oxide semiconductor film (OS) was prepared by forming a 35-nm-thick In—Ga—Zn oxide film over a glass substrate by a sputtering method using a sputtering target with an atomic ratio of In:Ga:Zn=1:1:1.2, forming a 20-nm-thick In—Ga—Zn oxide film over the 35-nm-thick In—Ga—Zn oxide film by a sputtering method using a sputtering target with an atomic ratio of In:Ga:Zn=1:4:5, performing heat treatment in a 450° C. nitrogen atmosphere and then performing heat treatment in a 450° C. atmosphere of a mixed gas of nitrogen and oxygen, and forming a silicon oxynitride film by a plasma CVD method.

A sample including the oxide conductor film (OC) was prepared by forming a 100-nm-thick In—Ga—Zn oxide film over a glass substrate by a sputtering method using a sputtering target with an atomic ratio of In:Ga:Zn=1:1:1, performing heat treatment in a 450° C. nitrogen atmosphere and then performing heat treatment in a 450° C. atmosphere of a mixed gas of nitrogen and oxygen, and forming a silicon nitride film by a plasma CVD method.

As can be seen from FIG. 38, the temperature dependence of conductivity of the oxide conductor film (OC) is lower than the temperature dependence of conductivity of the oxide semiconductor film (OS). Typically, the range of variation of conductivity of the oxide conductor film (OC) at temperatures from 80 K to 290 K is from more than −20% to less than +20%. Alternatively, the range of variation of conductivity at temperatures from 150 K to 250 K is from more than −10% to less than +10%. In other words, the oxide conductor is a degenerate semiconductor and it is suggested that the conduction band edge agrees with or substantially agrees with the Fermi level. Thus, the oxide conductor film can be used for a resistor, a wiring, an electrode of a capacitor, a pixel electrode, or a common electrode, for example.

Note that the structures, methods, and the like described in this embodiment can be used as appropriate in combination with any of the structures, methods, and the like described in the other embodiments.

Embodiment 8

In the transistor using an oxide semiconductor film, the current in an off state (off-state current) can be made low, as described in Embodiment 2. Accordingly, an electric signal such as a video signal can be held for a longer period and a writing interval can be set longer.

With the use of a transistor with low off-state current, the liquid crystal display device in this embodiment can display images by at least two driving methods (modes). The first driving mode is a conventional driving method of a liquid crystal display device, in which data is rewritten sequentially every frame. The second driving mode is a driving method in which data rewriting is stopped after data writing is executed, i.e., a driving mode with a reduced refresh rate.

Moving images are displayed in the first driving mode. A still image can be displayed without change in image data every frame; thus, it is not necessary to rewrite data every frame. When the liquid crystal display device is driven in the second driving mode in displaying still images, power consumption can be reduced with fewer screen flickers.

A liquid crystal element used in the liquid crystal display device in this embodiment has a large-area capacitor that can accumulate a large capacitance. Thus, it is possible to make the retention period of potentials on the pixel electrode longer and to apply such a driving mode with a reduced refresh rate. In addition, a change in voltage applied to the liquid crystal layer can be inhibited for a long time even when the liquid crystal display device is used in the driving mode with a reduced refresh rate. This makes it possible to prevent screen flickers from being perceived by a user more effectively. Accordingly, the power consumption can be reduced and the display quality can be improved.

An effect of reducing the refresh rate will be described here.

The eye strain is divided into two categories: nerve strain and muscle strain. The nerve strain is caused by prolonged looking at light emitted from a liquid crystal display device or blinking images. This is because the brightness stimulates and fatigues the retina and nerve of the eye and the brain. The muscle strain is caused by overuse of a ciliary muscle which works for adjusting the focus.

Figure 17A:
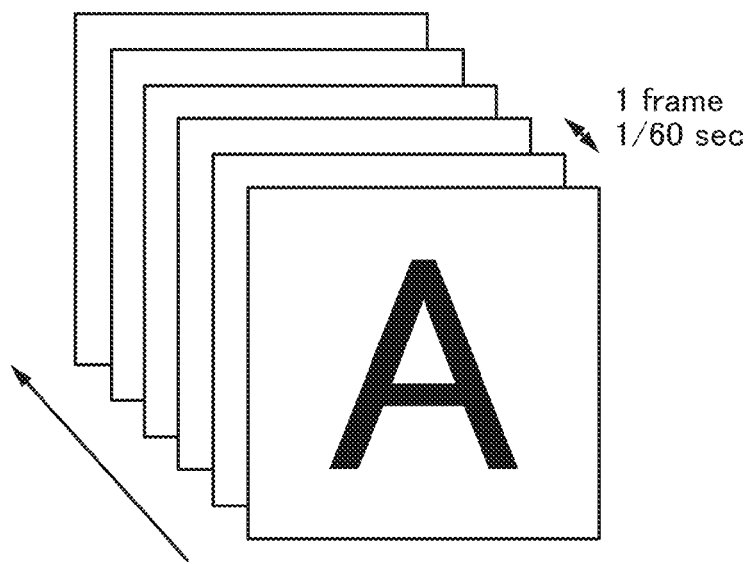
FIGS. 17A and 17B are conceptual diagrams illustrating examples of a driving method of a display device.

FIG. 17A is a schematic diagram illustrating display of a conventional liquid crystal display device. As illustrated in FIG. 17A, for the display of the conventional liquid crystal display device, image rewriting is performed 60 times per second. A prolonged looking at such a screen might stimulate a retina, optic nerves, and a brain of a user and lead to eye strain.

In one embodiment of the present invention, a transistor with an extremely low off-state current (e.g., a transistor using an oxide semiconductor) is used in a pixel portion of a liquid crystal display device. In addition, the liquid crystal element has a large-area capacitor. With these components, leakage of electrical charges accumulated on the capacitor can be inhibited, whereby the luminance of a liquid crystal display device can be kept even at a lower frame frequency.

Figure 17B:
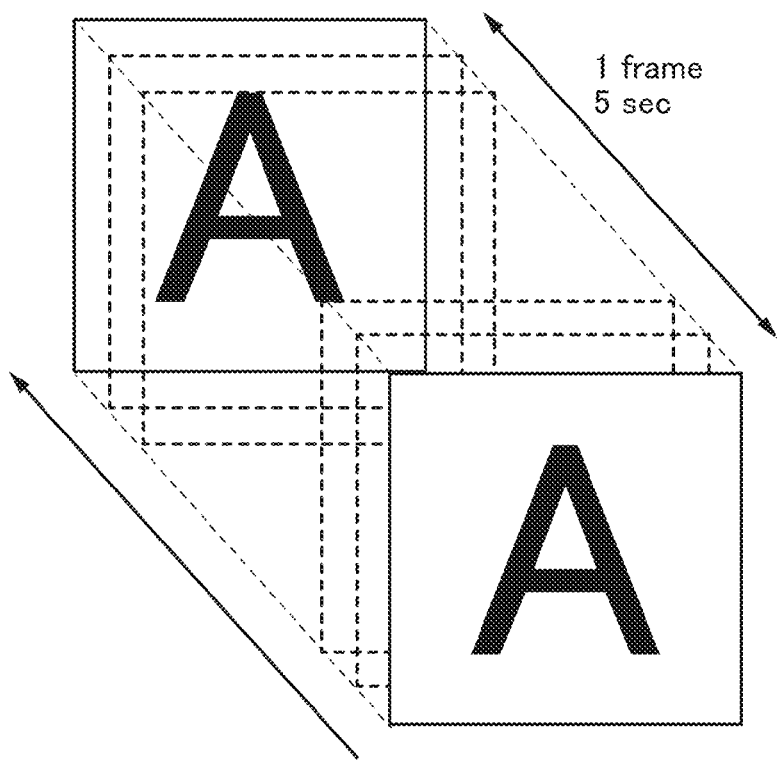

That is, as shown in FIG. 17B, an image can be rewritten as less frequently as once every five seconds, for example. This enables the user to see the same one image as long as possible, so that flickers on the screen recognized by the user are reduced. Consequently, a stimulus to the retina or the nerve of an eye or the brain of the user is relieved, resulting in less nervous fatigue.

One embodiment of the present invention can provide an eye-friendly liquid crystal display device.

Embodiment 9

In this embodiment, structural examples of electronic devices each using a display device of one embodiment of the present invention will be described. In addition, in this embodiment, a display module using a display device of one embodiment of the present invention will be described with reference to FIG. 18.

Figure 18:
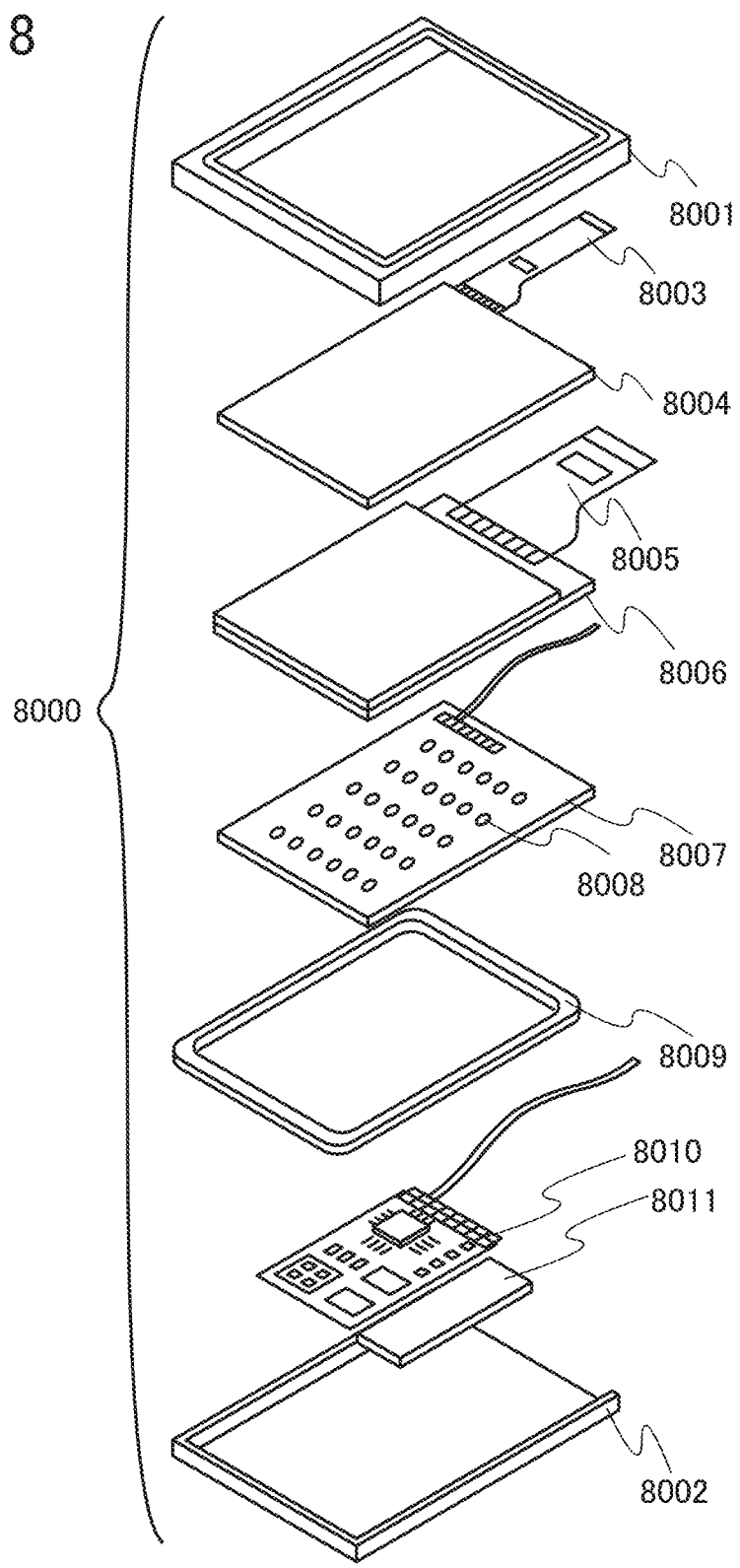
FIG. 18 illustrates a display module.

In a display module 8000 in FIG. 18, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The display device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

In addition, a wavelength conversion member may be provided between the backlight unit 8007 and the display panel 8006. The wavelength conversion member contains a wavelength conversion substance such as a fluorescent pigment, a fluorescent dye, or a quantum dot. Such a wavelength conversion substance can absorb light from the backlight unit 8007 and convert part of or the whole of the light into light with another wavelength. The quantum dot that is one of wavelength conversion substances is a particle having a diameter of from 1 nm to 100 nm. By using the wavelength conversion member containing a quantum dot, the color reproducibility of the display device can be increased. Furthermore, the wavelength conversion member may function as a light-guiding plate.

The frame 8009 protects the display panel 8006 and also functions as an electromagnetic shield for blocking electromagnetic waves generated by the operation of the printed board 8010. The frame 8009 can function as a radiator plate too.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 19A to 19D are each an external view of an electronic device including a display device of one embodiment of the present invention.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 19A:
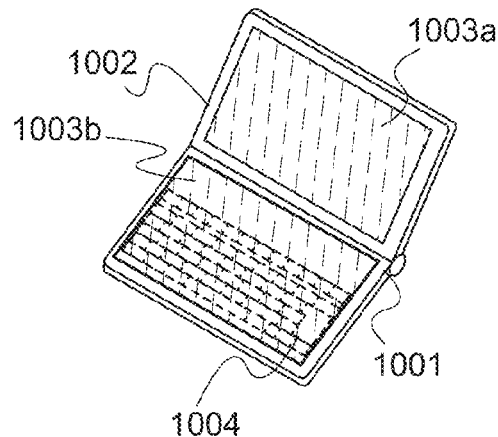
FIGS. 19A to 19D are each an external view of an electronic device according to one embodiment.

FIG. 19A illustrates a portable information terminal including a main body 1001, a housing 1002, display portions 1003*a* and 1003*b*, and the like. The display portion 1003*b* is a touch panel. By touching a keyboard button 1004 displayed on the display portion 1003*b*, a screen can be operated, and text can be input. It is needless to say that the display portion 1003*a* may be a touch panel. A liquid crystal panel or an organic light-emitting panel is fabricated using any of the transistors described in the above embodiments as a switching element and used in the display portion 1003*a* or 1003*b*, whereby a highly reliable portable information terminal can be provided.

The portable information terminal illustrated in FIG. 19A can have a function of displaying a variety of information (e.g., a still image, a moving image, and a text image) on the display portion; a function of displaying a calendar, a date, the time, and the like on the display portion; a function of operating or editing the information displayed on the display portion; a function of controlling processing by various kinds of software (programs); and the like. Furthermore, an external connection terminal (an earphone terminal, a USB terminal, or the like), a recording medium insertion portion, and the like may be provided on the back surface or the side surface of the housing.

The portable information terminal illustrated in FIG. 19A may transmit and receive data wirelessly. Through wireless communication, desired book data or the like can be purchased and downloaded from an e-book server.

Figure 19B:
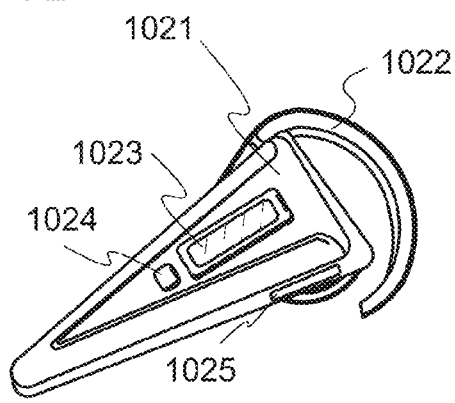

FIG. 19B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using any of the transistors described in the above embodiments as a switching element and used in the display portion 1023, whereby a highly reliable portable music player can be provided.

Furthermore, when the portable music player illustrated in FIG. 19B has an antenna, a microphone function, or a wireless communication function and is used with a mobile phone, a user can talk on the phone wirelessly in a hands-free way while driving a car or the like.

Figure 19C:
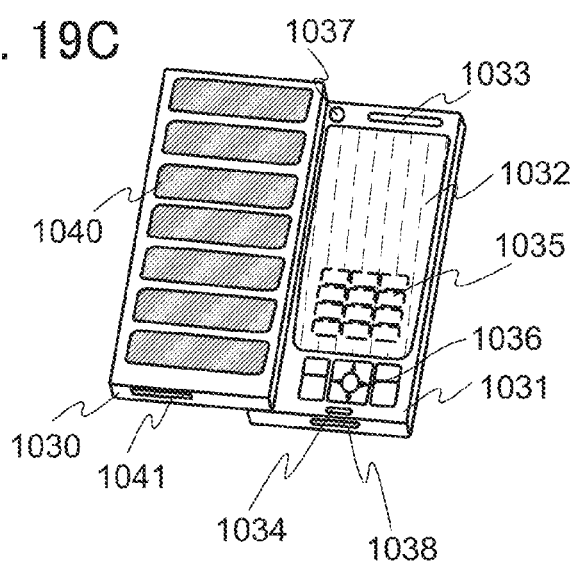

FIG. 19C illustrates a mobile phone, which includes two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. Any of the transistors described in the above embodiments is used in the display panel 1032, whereby a highly reliable mobile phone can be provided.

Furthermore, the display panel 1032 includes a touch panel. A plurality of operation keys 1035 that are displayed as images are indicated by dotted lines in FIG. 19C. Note that a boosting circuit by which voltage output from the solar cell 1040 is increased to be sufficiently high for each circuit is also included.

In the display panel 1032, the direction of display is changed as appropriate depending on the application mode. In addition, the mobile phone has the camera lens 1037 and the display panel 1032 on the same surface side, and thus it can be used as a video phone. The speaker 1033 and the microphone 1034 can be used for videophone calls, recording, and playing sound, etc., as well as voice calls. Moreover, the housings 1030 and 1031 in a state where they are developed as illustrated in FIG. 19C can shift, to a state where one is lapped over the other by sliding. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Furthermore by inserting a recording medium into the external memory slot 1041, a larger amount of data can be stored and moved.

In addition, in addition to the above functions, an infrared communication function, a television reception function, or the like may be provided.

Figure 19D:
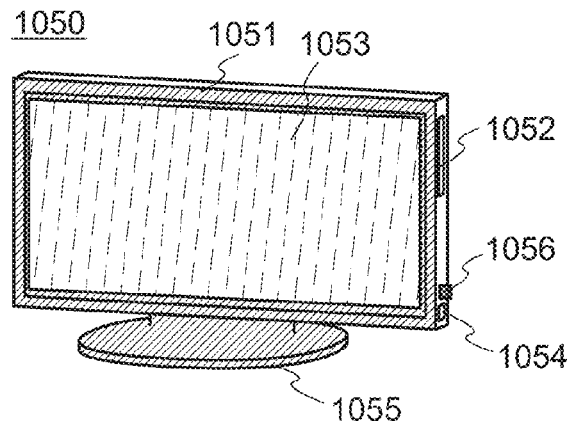

FIG. 19D illustrates an example of a television set. In a television set 1050, a display portion 1053 is incorporated in a housing 1051. Images can be displayed on the display portion 1053. Moreover, a CPU is incorporated in a stand 1055 supporting the housing 1051. Any of the transistors described in the above embodiments is used in the display portion 1053 and the CPU, whereby the television set 1050 can have high reliability.

The television set 1050 can be operated with an operation switch of the housing 1051 or a separate remote controller. In addition, the remote controller may be provided with a display portion for displaying data output from the remote controller.

Note that the television set 1050 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Furthermore, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Furthermore, in the case where the off-state leakage current of the transistor described in the above embodiments is extremely small, when the transistor is used in the external memory 1056 or the CPU, the television set 1050 can have high reliability and sufficiently reduced power consumption.

This embodiment can be combined with any of the other embodiments disclosed in this specification as appropriate.

Example 1

In this example, distribution of transmittance of a pixel included in a liquid crystal display device according to one embodiment of the present invention was evaluated by calculation.

First, samples used in this example are described.

FIG. 15 is a top view of Sample 1 and FIG. 7 is a cross-sectional view of the substrate 11 side of Sample 1. A pixel in Sample 1 includes three subpixels. The subpixel includes the conductive film 13 that extends in the lateral direction and functions as a scan line, the conductive film 21*a* that extends in the longitudinal direction (intersecting with the conductive film 13) and functions as a signal line, and the area inside. In addition, the common electrode 29*a* includes a stripe region that extends in the direction intersecting with the conductive film 21*a* functioning as a signal line and a connection region that is parallel to the conductive film 21*a* and is connected to the stripe region. The common electrode 29*a* includes a stripe region 29*a*_1 extending in a direction intersecting with the conductive film 21*a* functioning as a signal line and a region 29*a*_2 which is connected to the stripe region and overlaps with the conductive film 13 functioning as a scan line. The top surface of the common electrode 29*a* has a zigzag shape in the stripe region and the extending direction thereof intersects with the conductive film 21*a* functioning as a signal line.

In addition, as in the transistor illustrated in FIG. 7, each subpixel includes the transistor 102. The transistor 102 includes the conductive film 13 functioning as a gate electrode; the nitride insulating film 15 and the oxide insulating film 17 formed over the conductive film 13 and functioning as a gate insulating film; the oxide semiconductor film 19*a* overlapping with the gate electrode with the gate insulating film therebetween and formed through the same process where the pixel electrode 19*b* is formed; the conductive film 21*a* electrically connected to the oxide semiconductor film 19*a* and functioning as a signal line; and the conductive film 21*b* electrically connected to the oxide semiconductor film 19*a* and the pixel electrode 19*b*.

In addition, as illustrated in FIG. 7, oxide insulating films 23 and 25 are formed over the transistor 102 and the nitride insulating film 27 is formed over the oxide insulating film 25 and the pixel electrode 19*b*. The common electrode 29 is formed over the nitride insulating film 27.

Figure 4:
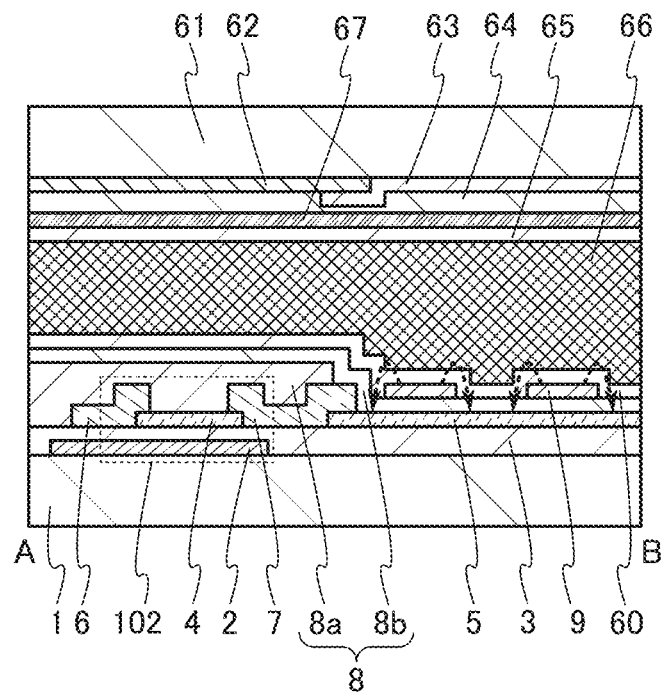
FIG. 4 is a cross-sectional view illustrating one embodiment of a display device.

Note that a pixel having the conductive film 67, like the conductive film 67 illustrated in FIG. 4, that faces the common electrode 29 with the liquid crystal layer therebetween in Sample 1 is referred to as Sample 2.

As a comparison example, Sample 3 is a sample that has a region intersecting with the conductive film functioning as a signal line in the top shape of the common electrode 29 in the pixel illustrated in FIG. 15, as in the common electrode 69 illustrated in FIG. 2C.

In addition, in Sample 1 and Sample 2, the angle (corresponding to θ1 in FIG. 2A) at a folding point in the common electrode was set to 1600, and the angle (corresponding to θ2 in FIG. 2A) between a perpendicular of the conductive film functioning as a signal line and the common electrode was set to 15°.

In addition, in Sample 3, the angle at the folding point in the common electrode was set to 175°, and the angle (corresponding to θ2 in FIG. 2A) between a perpendicular of the conductive film functioning as a signal line and the common electrode was set to 0°.

Samples 1 to 3 were prepared in the above manner. Transmittance of the pixels of Samples 1 to 3 can be controlled by a horizontal electric field applied between the pixel electrode and the common electrode.

Next, the transmittance of Samples 1 to 3 were calculated. The calculation was performed using LCD Master 3-D (produced by SHINTECH, Inc.) in an FEM-Static mode. In the calculation, the size was 49.5 μm long, 49.5 μm wide, and 4 μm deep (high), and a periodic boundary condition was adopted. In addition, the thickness of the conductive film 13 was set to 200 nm, the total thickness of the nitride insulating film 15 and the oxide insulating film 17 was set to 400 nm, the thickness of each of the conductive film 21*a* and the conductive film 21*b* was set to 300 nm, the total thickness of the oxide insulating film 23 and the oxide insulating film 25 was set to 500 nm, and the thickness of the nitride insulating film 27 was set to 100 nm. In addition, in each of Samples 1 to 3, the thickness of the pixel electrode was set to 0 nm and the thickness of the common electrode was set to 100 nm. The conductive film 67 in Sample 2 was set to 0 nm. In addition, the pretwist, twist, and pretilt angles of a liquid crystal molecule were set to 90°, 0°, and 3°, respectively. Note that the thickness of the pixel electrodes in Samples 1 to 3 and the thickness of the conductive film 67 in Sample 2 were set to 0 nm to reduce a load due to calculation.

Under the above conditions, transmittance was calculated in the case where the conductive film functioning as a scan line was set to −9 V, the common line was set to 0 V, the voltage of the conductive film functioning as a signal line was equal to that of the pixel electrode, and a voltage increasing by 1 V from 0 V to 6 V was applied (corresponding to a refresh period for a liquid crystal device having a low refresh rate), and in the case where the conductive film functioning as a signal line was fixed to 0 V, and a voltage increasing by 1 V from 0 V to 6V was applied to the pixel electrode (corresponding to a retention period for a liquid crystal device having a low refresh rate).

Figure 20A:
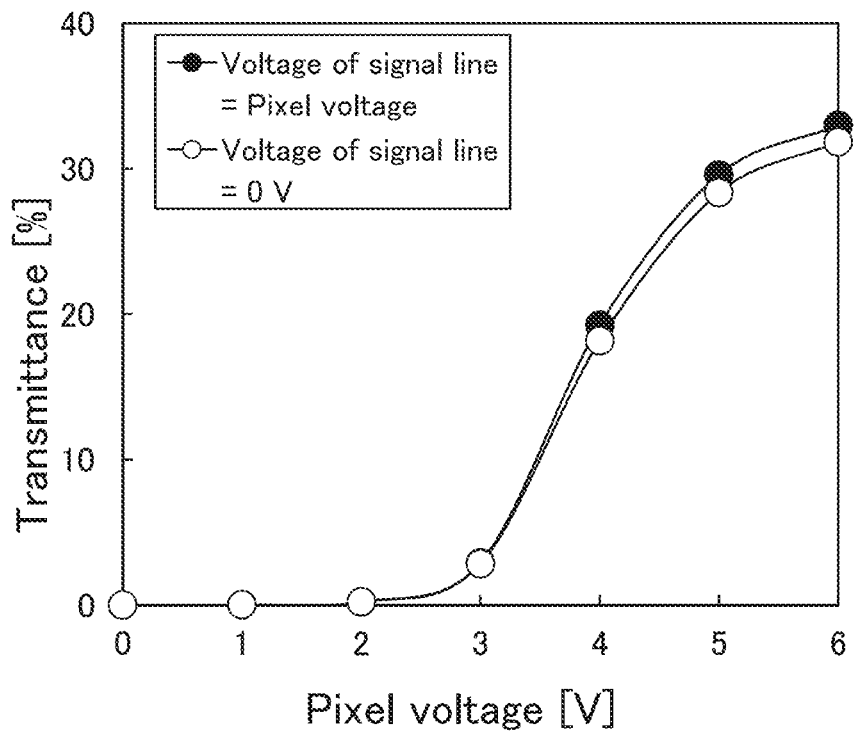
FIGS. 20A and 20B show transmittance of Sample 1 and Sample 2.
Figure 20B:
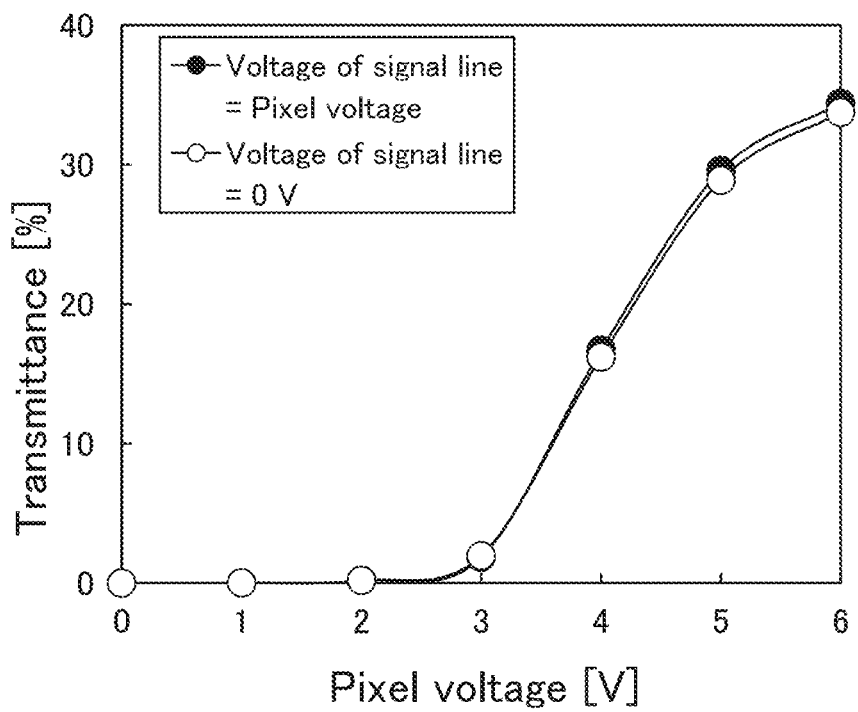
Figure 21:
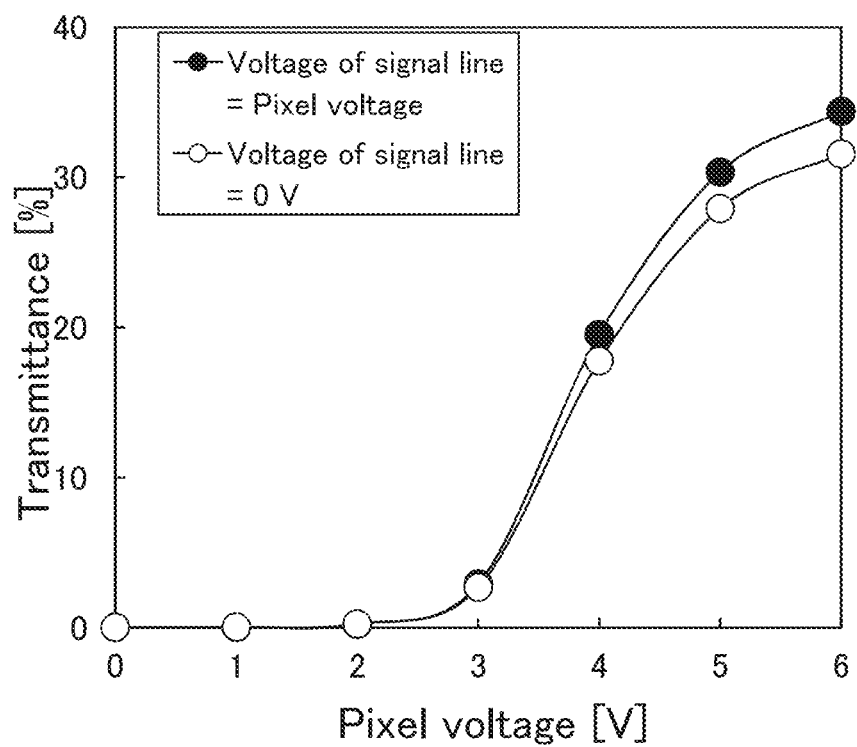
FIG. 21 shows transmittance of Sample 3.

The relationships between the voltage of the pixel electrode (hereinafter, referred to as a pixel voltage) and the transmittance of the pixel are shown in FIGS. 20A and 20B and FIG. 21. The calculation result of Sample 1 is shown in FIG. 20A, the calculation result of Sample 2 is shown in FIG. 20B, and the calculation result of Sample 3 is shown in FIG. 21. In FIGS. 20A and 20B and FIG. 21, the black circles indicate the transmittance in the case where the voltage of the conductive film functioning as a signal line (hereinafter referred to as a signal line voltage) is equal to the pixel voltage (corresponding to the refresh period) and the white circles indicate the transmittance in the case where the signal line voltage is fixed to 0 V (corresponding to the retention period). The transmittance of each sample was calculated under the condition where the parallel Nicols transmittance is 100%.

FIGS. 20A and 20B show that the transmittance is increased as the pixel voltage is increased in each of Sample 1 and Sample 2. In addition, when the pixel voltage was 6 V, the difference in transmittances when the signal line voltage was equal to the pixel voltage and when the signal line voltage was 0 V is small. This indicates that the transmittance can be maintained in the retention period and the refresh period, and thereby flickers on the screen can be reduced.

On the other hand, FIG. 21 shows that the transmittance is increased as the pixel voltage is increased in Sample 3. However, the increasing rate in the transmittance in the case where the signal line voltage was fixed to 0 V was lower than that in the case where the signal line voltage was equal to the pixel voltage. This indicates that the brightness in pixels in the retention period is decreased as compared with that in the refresh period, and thereby flickers on the screed are generated.

Accordingly, the provision of the common electrodes having the shape for Sample 1 and Sample 2 is effective for reduction of flickers on the screen in a liquid crystal display device having a low refresh rate.

Example 2

The element substrates described in Embodiments 2 to 6 makes it possible to reduce the number of masks used in manufacturing steps and to make a high aperture ratio of a pixel. However, the liquid crystal element is formed in a region where the oxide insulating films 23 and 25, and the like are partly etched, and thus a step is produced inside in the element substrate. Thus, the relationship between the rubbing direction of an alignment film and light leakage was examined.

The examined result of the relationships between the alignment direction for the alignment film and the amount of light leakage in a pixel is described first.

Rubbing treatment were performed on the element substrate at the angles of 0°, 45°, and 90° with respect to the extending direction of the conductive film 21*a* functioning as a signal line. In addition, alignment treatment was performed to the counter substrate so as to be antiparallel to the rubbing direction of the element substrate. Then, a liquid crystal layer and a sealing material were provided between the element substrate and counter substrate to manufacture a liquid crystal display device.

Figure 29:
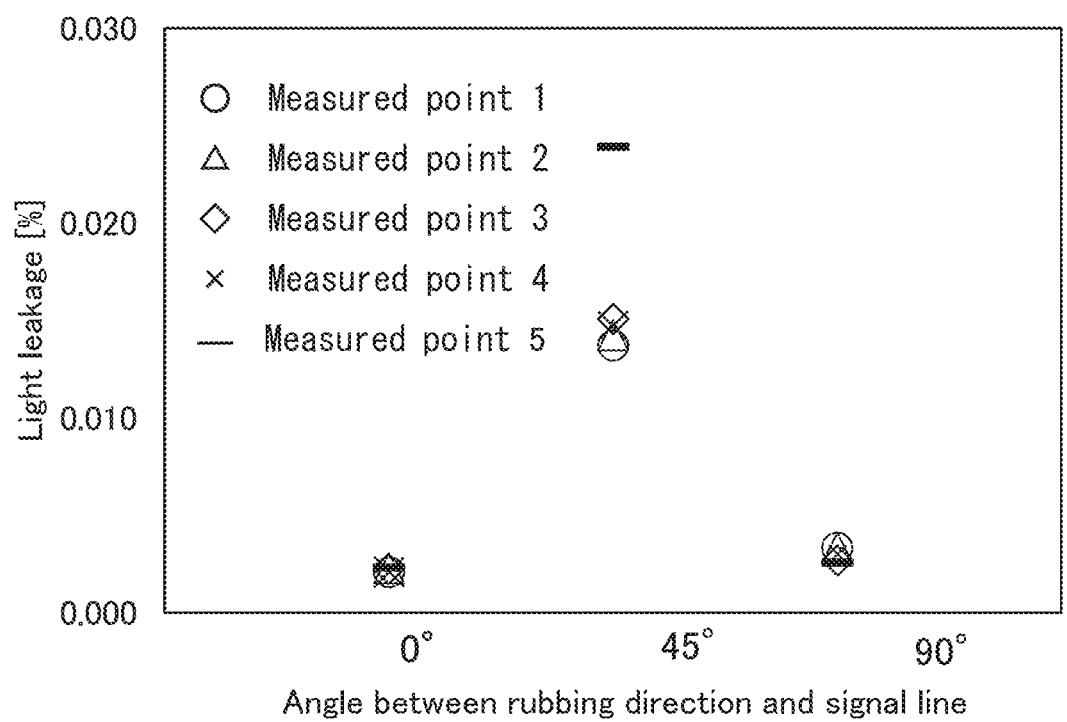
FIG. 29 is a graph showing a relation between a rubbing angle of an element substrate and light leakage.

Next, the amount of light leakage from pixels included in the liquid crystal display device was measured. In the measurement, a pair of polarizing plates was arranged in the liquid crystal display device such that polarizers made a crossed Nicols. Note that the angle in the rubbing direction and the axis of the polarizers were parallel. FIG. 29 shows the measurement result. The measurement of light leakage were performed at five points in each liquid crystal display device.

FIG. 29 indicates that the amount of light leakage in the display device where the angle between the rubbing direction and the conductive film 21*a* functioning as a signal line is 45° is large, while the amount of light leakage where the angles are 0° and 90° is small. In addition, it is also confirmed that the light leakage was suppressed most by performing the alignment treatment such that the rubbing direction is parallel to the conductive film 21*a* functioning as a signal line.

The liquid crystal display device fabricated in this example had the density of the conductive film 21*a* functioning as a signal line which is three times as high as that of the conductive film 13 functioning as a scan line. In other words, convex and concave regions are extended in the direction parallel to the conductive film 21*a* functioning as a signal line. Thus, it is confirmed that the alignment treatment is performed on the direction parallel to the conductive film 21*a* functioning as a signal line, so that light leakage can be suppressed even when steps are formed.

Next, the examination result of the relationship between the alignment treatment method and the amount of light leakage is described.

Figure 30A:
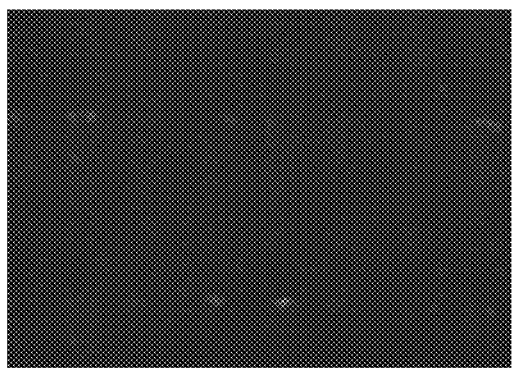
FIGS. 30A and 30B are each an observation result of a display portion of a liquid crystal display device.
Figure 30B:
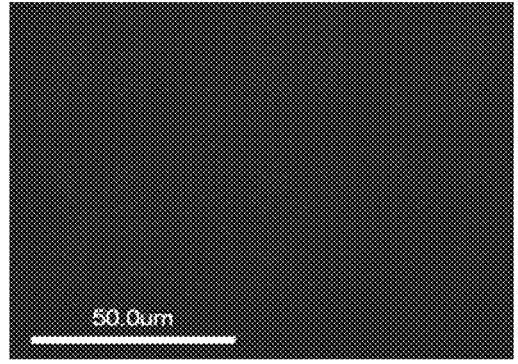

FIGS. 30A and 30B are photos of a display portion in the liquid crystal display device observed by a microscope. FIG. 30A is an observation result of the liquid crystal display device where an alignment film is formed by performing only rubbing treatment, and FIG. 30B is an observation result of the liquid crystal display device where an alignment film is formed by performing rubbing treatment and optical orientation treatment. Note that the observation by a microscope was performed under the condition where the arrangement of polarizers included in polarizing plates was crossed Nicols and a transmission mode was adopted.

As seen in FIG. 30A, it is confirmed that local light leakage was generated in the liquid crystal display device where the alignment film is formed by performing only the rubbing treatment. On the other hand, as seen in FIG. 30B, it is confirmed that light leakage was suppressed in the liquid crystal display device where the alignment film is formed by performing the rubbing treatment and the optical orientation treatment.

Based on these results, it is confirmed that the alignment treatment can be performed uniformly in a plane on the element substrate having a step structure, by making the orientation of the liquid crystal molecules horizontal and performing the alignment treatment in the direction parallel to the extending direction of concave and convex regions, and making also the optical orientation treatment.

Example 3

Figure 31A:
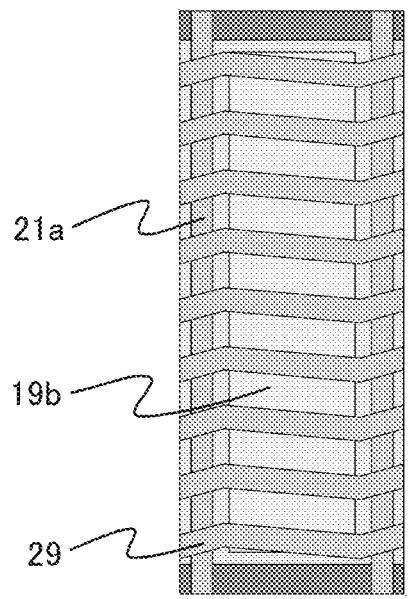
FIG. 31A is a top view of the shape of a pixel used for calculation.

In this example, as illustrated in FIG. 31A, the alignment state of liquid crystal molecules is calculated in the pixel having the common electrode 29 having a zigzag slit shape in the direction substantially intersecting with the conductive film 21*a* functioning as a signal line.

A design simulator for liquid crystal display devices (LCD Master 3-D Full set FEM mode) manufactured by Shintech, Inc. was used for calculation of alignment of liquid crystal molecules. In addition, the cell gap in a liquid crystal element was set to 4.0 μm and the pixel structure was assumed to have two neighboring subpixels. A voltage of 5 V was applied to the pixel electrode 19*b* for white display of one subpixel and a voltage of 0 V was applied to the pixel electrode 19*b* for black display of the other subpixel, and the alignment state of liquid crystal molecules was calculated. Furthermore, 0 V or 6 V was applied to the conductive film 21*a* functioning as a signal line to examine the influence by electric field between the conductive film 21*a* functioning as a signal line and the common electrode 29, and the alignment of liquid crystal molecules in both cases were compared. Assuming an actual panel, a light-shielding film was arranged for the counter substrate so as to cover an area located 1.5 μm inside from the end of the conductive film 21*a* functioning as a signal line for the calculation.

Figure 32A:
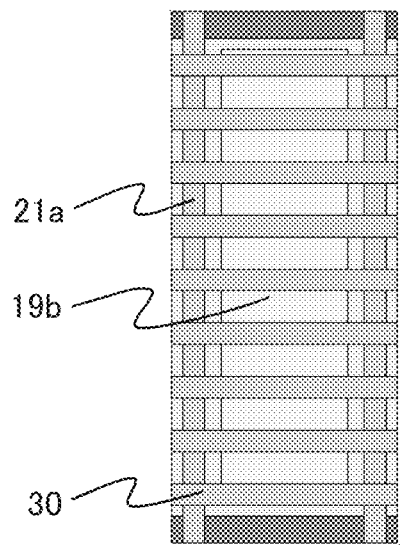
FIG. 32A is a top view of the shape of a pixel used for calculation.

In addition, as a comparison example, the alignment of liquid crystal molecules in a pixel having a straight-line common electrode 30 as illustrated in FIG. 32A was also calculated.

For a liquid crystal display device that is driven at a low refresh rate, a negative liquid crystal material is preferred in light of a flexo-electric effect. Thus, the negative liquid crystal material is used for the calculation.

Figure 31B:
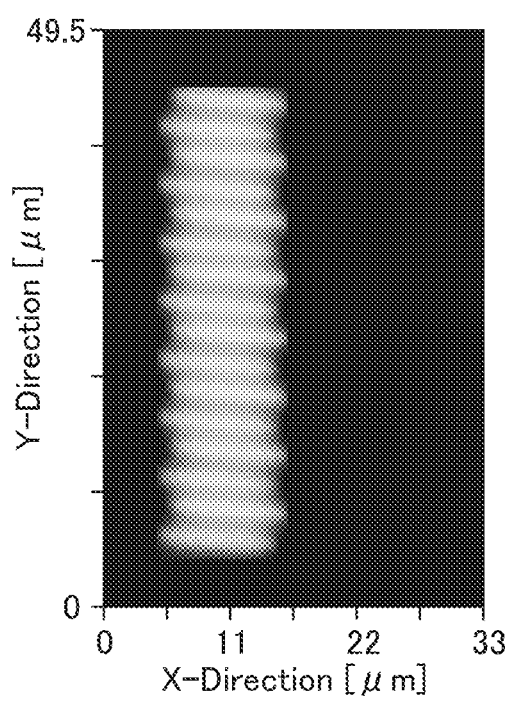
FIGS. 31B and 31C show calculation results.
Figure 31C:
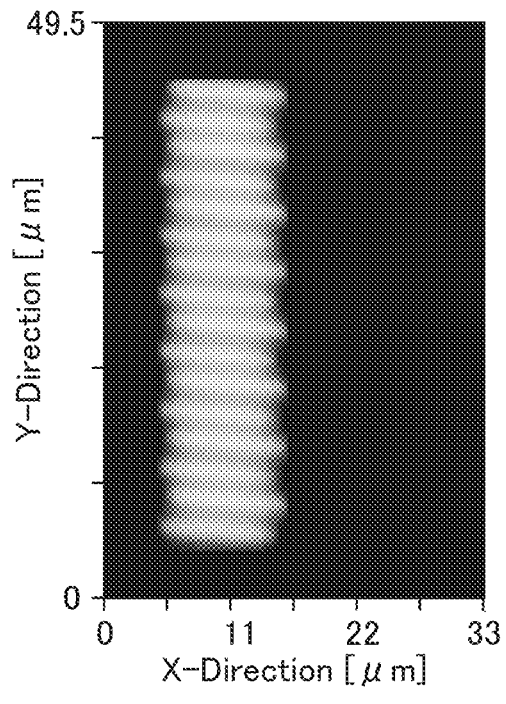
Figure 32B:
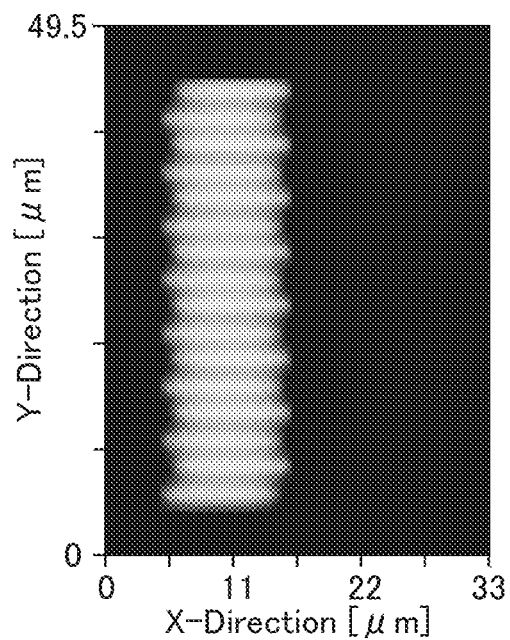
FIGS. 32B and 32C show calculation results.
Figure 32C:
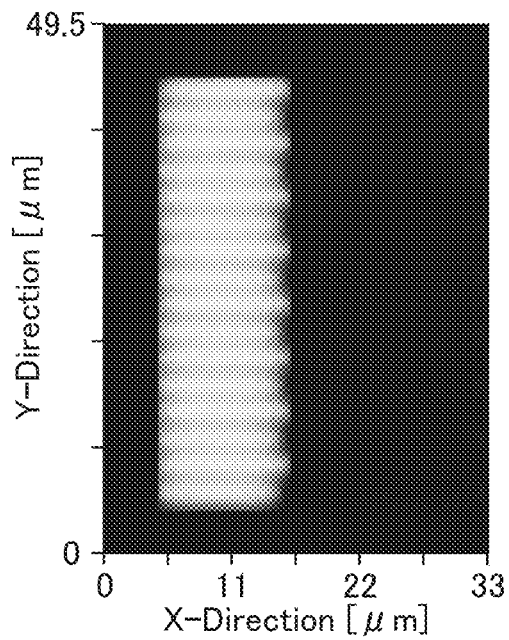

FIGS. 31B and 31C show the calculation results of the pixel illustrated in FIG. 31A. In addition, the calculation result of the pixel illustrated in FIG. 32A is shown in FIG. 32B and FIG. 32C. In FIGS. 31A to 31C and FIGS. 32A to 32C, FIG. 31B and FIG. 32B show calculation results when 0 V was applied to the conductive film functioning as a signal line and FIG. 31C and FIG. 32C show calculation results when 6 V was applied to the conductive film 21*a* functioning as a signal line.

It is confirmed that the alignment state of liquid crystal molecules is different depending on the voltage applied to the conductive film 21*a* functioning as a signal line by comparing the subpixels for white display shown in FIG. 32B and FIG. 32C. On the other hand, the large difference in the alignment state of liquid crystal molecules over the pixel electrodes 19*b* in subpixels for white display shown in FIG. 31B and FIG. 31C is not confirmed.

The reason of that is as follows: the common electrode 29 has a zigzag shape and the rotation direction of liquid crystal molecules is clockwise over the conductive film 21*a* functioning as a signal line but is counterclockwise over the pixel electrode 19*b*. As a result, the alignment state of liquid crystal molecules is difficult to interfere with each other over the conductive film 21*a* functioning as a signal line and the pixel electrode 19*b*.

Figure 40A:
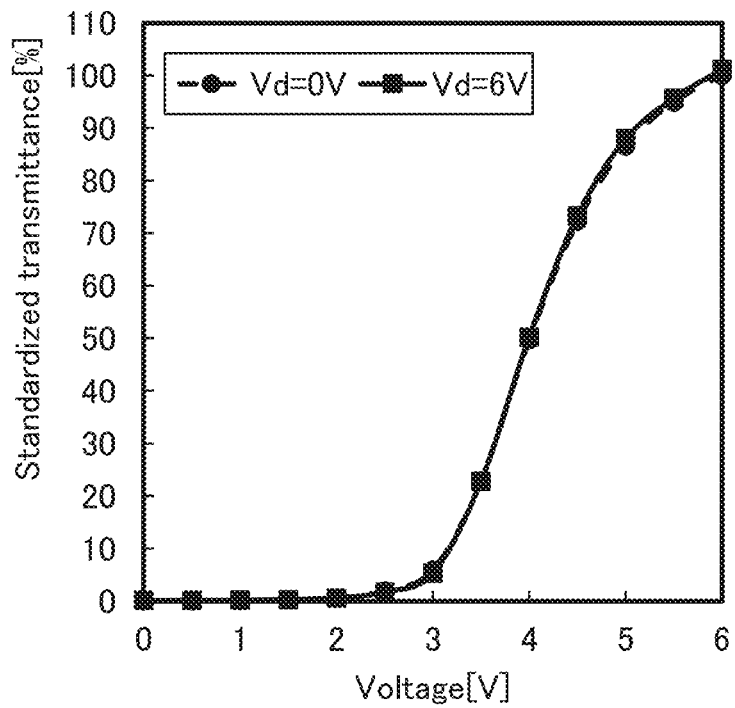
FIGS. 40A and 40B are graphs showing calculation results of voltage-transmittance characteristics.
Figure 40B:
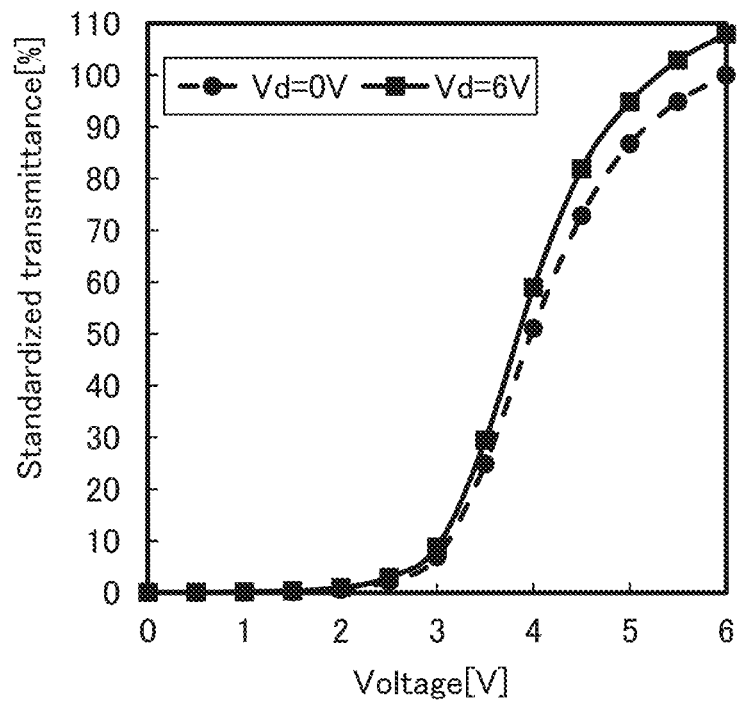

Next, with the calculation result, the voltage-transmittance characteristics of the pixel when a voltage increasing by 0.5 V from 0 V to 6 V was applied to the pixel electrode 19*b* were calculated. At this time, the voltage Vd applied to the conductive film 21*a* functioning as a signal line was set to 0 V or 6 V. The results of calculation are shown in FIGS. 40A and 40B. FIG. 40A shows a calculation result of voltage-transmittance characteristics of the pixel illustrated in FIG. 31A, and FIG. 40B shows a calculation result of voltage-transmittance characteristics of the pixel illustrated in FIG. 32A. In FIGS. 40A and 40B, the horizontal axis shows a voltage of the pixel electrode 19*b* and the vertical axis shows transmittance of the pixel. In each of FIGS. 40A and 40B, the circle symbol and broken line show a calculation result obtained when the voltage of 0 V was applied to the conductive film 21*a* functioning as a signal line and the square symbol and solid line show a calculation result obtained when the voltage of 6 V is applied to the conductive film 21*a* functioning as a signal line. In FIG. 40A, the curved lines of transmittances at 0 V and 6 V (Vd) are substantially overlapped. As shown in FIG. 40A, the structure of the common electrode 30 illustrated in FIGS. 31A to 31C have few variations in transmittance of the pixel due to the voltage applied to the conductive film 21*a* functioning as a signal line.

Figure 33:
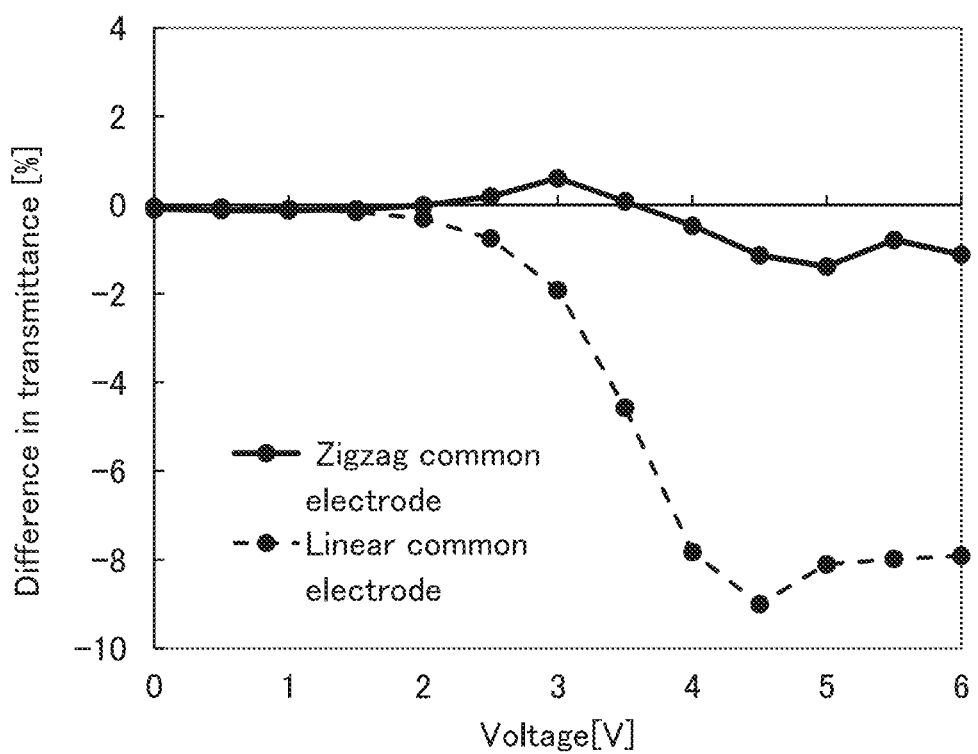
FIG. 33 is a graph showing voltage-transmittance characteristics.

In addition, FIG. 33 shows the difference between the voltage-transmittance characteristics in the case of the voltage from 0 V to 6 V applied to the conductive film 21*a* functioning as a signal line by using the voltage-transmittance characteristics in the case of the voltage 0 V applied to the conductive film 21*a* functioning as a signal line as a reference. In FIG. 33, the horizontal axis shows the voltage of the pixel electrode 19*b* and the vertical axis shows the difference in transmittance. Like the calculation shown in FIGS. 31A to 31C and FIGS. 32A to 32C, assuming an actual panel, a light-shielding film was arranged for the counter substrate so as to cover an area located 1.5 μm inside from the end of the conductive film 21*a* functioning as a signal line for the calculation.

In FIG. 33, the horizontal axis shows a voltage applied to the pixel electrode 19*b* and the vertical axis shows a difference in voltage-transmittance characteristics at each applied voltage. In FIG. 33, the solid line shows a calculation result of the pixel illustrated in FIG. 31A and the broken line shows a calculation result of the pixel illustrated in FIG. 32A.

In the structure of the common electrode 30 illustrated in FIG. 32A, the difference in voltage-transmittance characteristics gets larger as the voltage applied to the pixel electrode 19*b* becomes large. In other words, the transmittance of the pixel is influenced greatly by the voltage applied to the conductive film 21*a* functioning as a signal line.

On the other hand, in the shape of the common electrode 29 illustrated in FIG. 31A, the difference in the voltage-transmittance characteristics is small even when the voltage applied to the pixel electrode 19*b* is increased. In other words, the transmittance of the pixel is not influenced so much by the voltage applied to the conductive film 21*a* functioning as a signal line.

Accordingly, the rotation direction of liquid crystal molecules over the conductive film 21*a* functioning as a signal line is reversed to that over the pixel electrode 19*b*, and thereby the influence to liquid crystal molecules by electric field of the conductive film functioning as a signal line can be reduced.

In addition, the shape of the common electrode 29 provided in the conductive film 21*a* functioning as a signal line is a slit shape and the oxide insulating films 23 and 25 are formed over the conductive film 21*a* functioning as a signal line, whereby the parasitic capacitance generated between the conductive film 21*a* functioning as a signal line and the common electrode 29 can be reduced sufficiently.

Accordingly, the element substrate according to one embodiment of the present invention is also effective for a liquid crystal display device that is driven at a low refresh rate.

Example 4

In this example, a liquid crystal display device was fabricated using the element substrate described in Embodiment 2. The specifications and display image of the liquid crystal display device will be described.

Table 1 shows specifications of the liquid crystal display device.

TABLE 1

| | |
|---|---|
| Screen Diagonal | 4.29 inch |
| Resolution | 1080 × RGB (H) × 1920 (V): Full-HD |
| Pixel Pitch | 49.5 mm (H) × 49.5 mm (V) |
| Pixel Density | 513 ppi |
| Liquid Crystal Mode | Fringe Field Switching |
| Aperture Ratio | 50.80% |
| FET | CAAC-IGZO |
| Process | Six-Mask Process |

A 513-ppi FFS mode liquid crystal display device that can be driven at a low frequency was manufactured by a six-mask process in such a manner that rubbing treatment and optical orientation treatment were used as the alignment treatment of the alignment film, the common electrode were processed into zigzag shape, the oxide semiconductor film having a conductivity formed at the same time as the oxide semiconductor film included in the transistor was used as the pixel electrode 19*b*.

Figure 34:
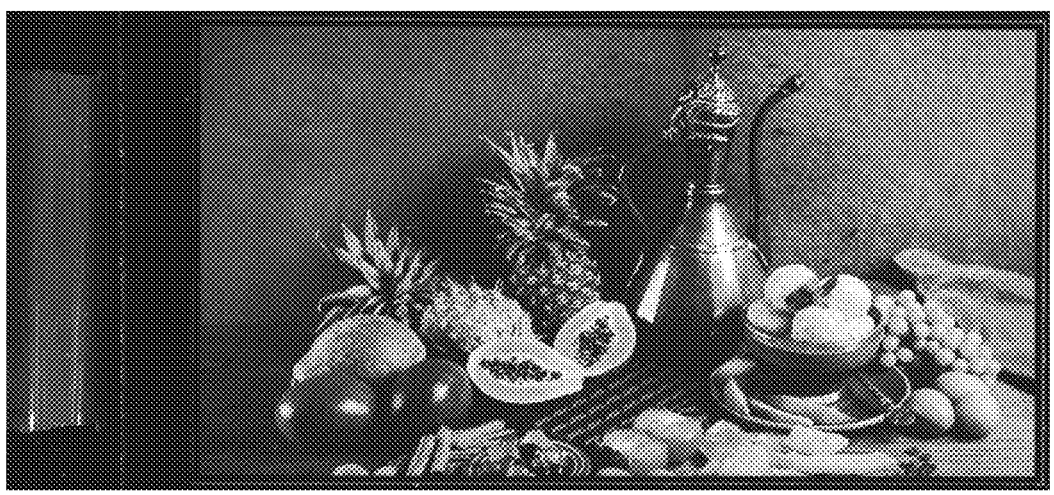
FIG. 34 is a photograph of an image displayed on a liquid crystal display device.

Next, FIG. 34 is a photograph of an image displayed by the liquid crystal display device manufactured in this example. As seen in FIG. 34, the display device according to one embodiment of the present invention is a liquid crystal display device exhibiting high definition and superior display quality. Note that the liquid crystal display device manufactured in this example can be driven at a low frequency and thus, can consume less power.

Example 5

In this example, the transmittance, conductivity, and resistivity of the oxide semiconductor film having conductivity are described.

The methods for forming Sample A1 and Sample A2 are described first.

First, a method for forming Sample A1 will be described.

A 50-nm-thick In—Ga—Zn oxide film (hereinafter referred to as an IGZO film) was formed over a glass substrate and then a 100-nm-thick silicon nitride film was stacked thereover. Note that Sample A1 includes an oxide semiconductor film having conductivity.

Note that the formation condition of the IGZO film was as follows: a sputtering method was employed, a metal oxide target (In:Ga:Zn=1:1:1) was used, a sputtering gas containing 33 vol % of oxygen diluted with argon was used, the pressure was 0.4 Pa, the formation power was 200 W, and the substrate temperature was 300° C.

In addition, the formation condition of the silicon nitride film was as follows: a plasma CVD method was employed, the gas flow rate of $SiH_4$ to $N_2$ and $NH_3$ were 50/5000/100 sccm, the pressure was 100 Pa; the formation power was 1000 W; and the substrate temperature was 350° C. Through the above process, Samples A1 was formed.

Next, a fabrication method of Sample A2 is described.

An IGZO of Sample A2 was formed over a glass substrate under the formation condition of the IGZO film of Sample A1. Through the above process. Sample A2 was fabricated. Note that Sample A1 includes the oxide semiconductor film.

Figure 35:
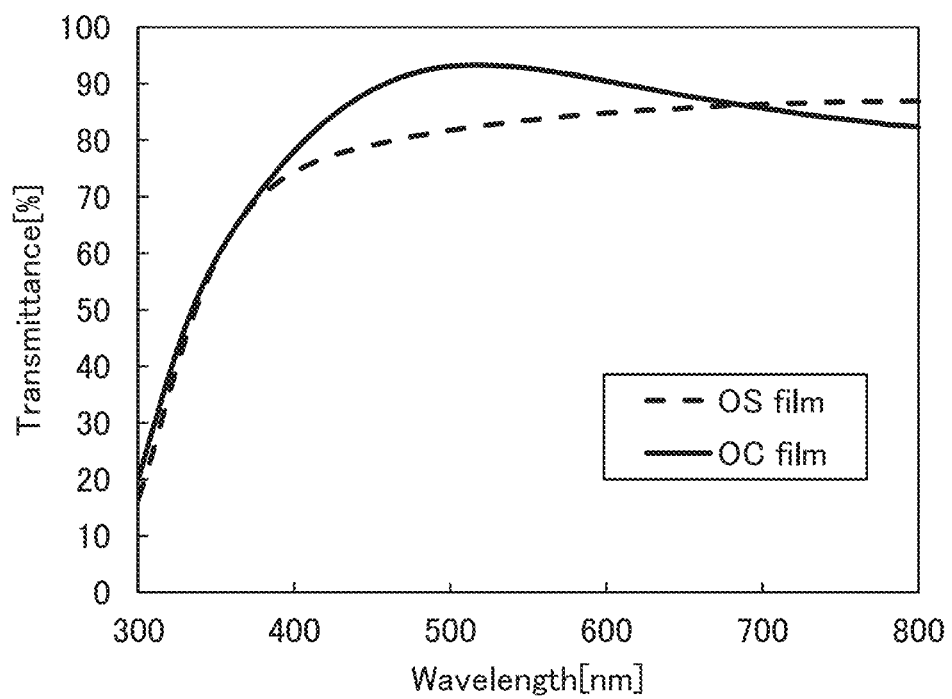
FIG. 35 is a graph showing the measurement result of transmittance.

Next, the transmittance of visible light in each of Samples A1 and A2 was measured. The measured transmittances are shown in FIG. 35. In FIG. 35, the solid line shows the transmittance of the oxide semiconductor film having conductivity (OC film) included in Sample A1 and the broken line indicates the transmittance of the oxide semiconductor film (OS film) included in Sample A2.

The transmittances of Sample A1 and Sample A2 are 80% or higher in the wide energy region. In other words, the oxide semiconductor film having conductivity has high transmittance in visible light region as compared with the oxide semiconductor film.

Next, the conductivity and resistivity of the oxide semiconductor film having conductivity were measured.

A method for forming Sample A3 is described first.

Under similar conditions of Sample A1, a 35-nm-thick IGZO film was formed over the glass substrate, and then, a 100-nm-thick nitride silicon film was stacked thereover. Next, the silicon nitride film was etched to expose the oxide semiconductor film having conductivity. Through the above steps, Sample A3 was formed.

Figure 36:
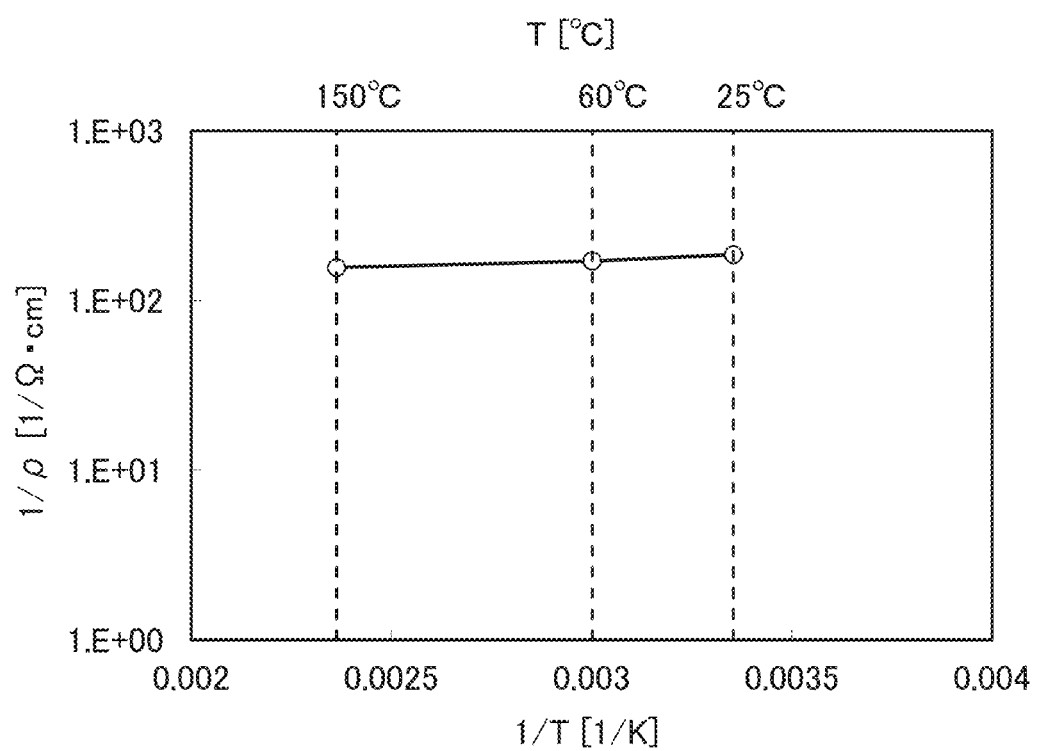
FIG. 36 is a graph showing the measurement result of conductivity.

Next, the conductivity of the oxide semiconductor film having conductivity included in Sample A3 was measured. FIG. 36 (Arrhenius plot) shows 1/T dependence of the conductivity of the oxide semiconductor film having conductivity. In FIG. 36, the horizontal axis shows 1/T absolute temperature and the vertical axis shows $1/\rho$.

As shown in FIG. 36, the resistance of the oxide semiconductor film having conductivity is slightly increased as the temperature is increased. This indicates that the conductivity of the oxide semiconductor film having conductivity does not show semiconductive performance but metallic performance. This is thought to be because carriers degenerate in the oxide semiconductor film having conductivity.

Figure 37:
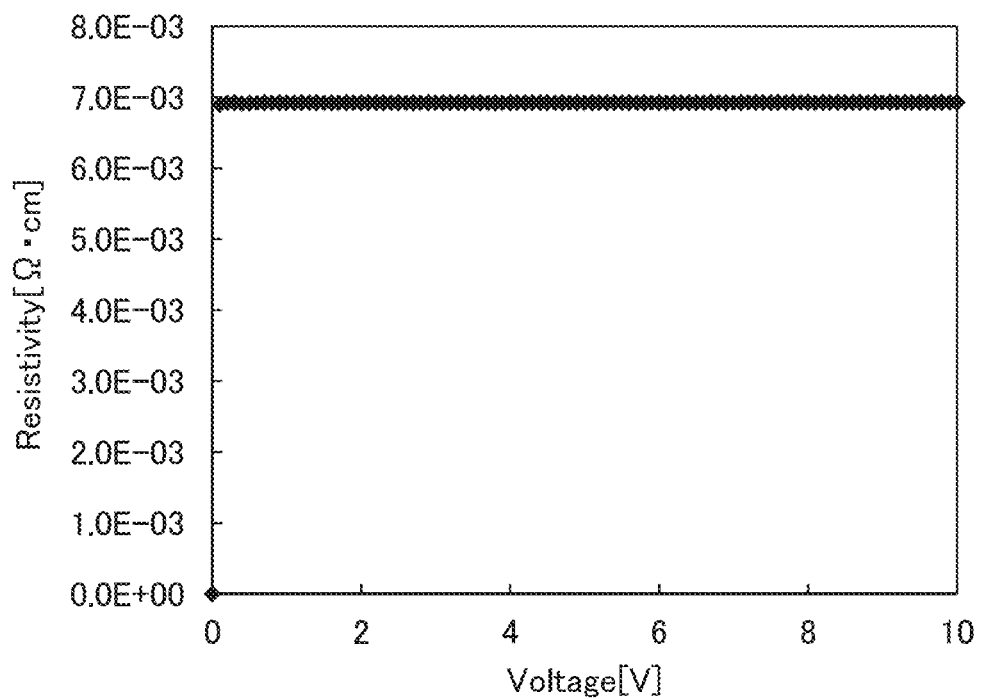
FIG. 37 is a graph showing the measurement result of resistivity.

FIG. 37 shows the measured resistivity of Sample A3. The electrical characteristics of the oxide semiconductor film having conductivity included in Sample A3 showed favorable linear electrical characteristics and the resistivity was about $7 \times 10^{-3}$ Ω·cm.

Based on the measurement results of transmittance and resistivity, the oxide semiconductor film having conductivity can be used as an alternative for ITO.

In addition, the oxide semiconductor film having conductivity showed physical properties different from that of the oxide semiconductor film, and thus it can be said that the oxide semiconductor film having conductivity and the oxide semiconductor film are different materials.

Example 6

In this example, measurement results of Vg-Id characteristics of a transistor will be described.

A manufacturing process of the transistor included in Sample B1 is described first with reference to FIGS. 10A to 10D and FIGS. 11A to 11D.

First, as illustrated in FIG. 10A, a glass substrate was used as the substrate 11, and the conductive film 12 was formed over the substrate 11.

In this case, a 100-nm-thick tungsten film was formed as the conductive film 12 by a sputtering method.

As illustrated in FIG. 10B, the conductive film 13 functioning as a gate electrode was formed.

Here, a mask was formed over the conductive film 12 by a photolithography process and then the conductive film 12 was partly etched to form the conductive film 13.

As illustrated in FIG. 10C, the nitride insulating film 15, the oxide insulating film 16, and the oxide semiconductor film 18 were formed in this order over the conductive film 13.

Here, as the nitride insulating film 15, a 50-nm-thick first silicon nitride film, a 300-nm-thick second silicon nitride film, and a 50-nm-thick third silicon nitride film were formed by a plasma CVD method. As the oxide insulating film 16, a 50-nm-thick silicon oxynitride film was formed by a plasma CVD method. As the oxide semiconductor film 18, a 35-nm-thick IGZO film was formed by a sputtering method. Note that the atomic ratio of In to Ga and Zn contained in the used sputtering target was 1:1:1. The deposition temperature was 170° C.

Next, first heat treatment was performed. Here, as the first heat treatment, after heat treatment was performed at 450° C. under a nitrogen atmosphere for one hour, heat treatment was performed at 450° C. in an atmosphere of nitrogen and oxygen for one hour.

Then, as illustrated in FIG. 10D, the oxide semiconductor film 19a was formed. Here, after a mask is formed over the oxide semiconductor film 18 by a photolithography process, part of the oxide semiconductor film 18 is etched to form the oxide semiconductor film 19a.

Next, the conductive film 20 was formed as illustrated in FIG. 1A.

Here, as the conductive film 20, a 50-nm-thick tungsten film, a 400-nm-thick aluminum film, and a 100-nm-thick titanium film were formed in this order by a sputtering method.

Next, as illustrated in FIG. 11B, conductive films 21a and 21b functioning as a source electrode and a drain electrode were formed. Here, a mask was formed over the conductive film 20 by a photolithography process, and then part of the conductive film 20 was etched to form the conductive films 21a and 21b.

Then, the oxide insulating film 22 and the oxide insulating film 24 were formed as illustrated in FIG. 11C.

Here, a 50-nm-thick silicon oxynitride film was formed as the oxide insulating film 22 by a plasma CVD method. As the oxide insulating film 24, a 400-nm-thick silicon oxynitride film was formed by a plasma CVD method.

Next, by second heat treatment, water, nitrogen, hydrogen, or the like was released from the oxide insulating film 22 and the oxide insulating film 24 and part of oxygen contained in the oxide insulating film 24 was supplied to the oxide semiconductor film 19a. Here, the heat treatment was performed at 350° C. in a mixed atmosphere of nitrogen and oxygen for one hour.

Next, although not illustrated, a nitride insulating film was formed over the oxide insulating film 24.

Here, a 100-nm-thick silicon nitride film was formed as the nitride insulating film by a plasma CVD method.

Next, although not illustrated, openings which expose parts of the conductive films 21*a* and 21*b* were formed by partly etching the nitride insulating film.

Then, as not illustrated, a planarization film was formed over the nitride insulating film.

Here, the nitride insulating film was coated with a composition, and was subjected to light and developed, so that a planarization film having an opening through which the pair of electrodes is partly exposed to light was formed. Note that as the planarization film, a 1.5-μm-thick acry resin was formed. Then, heat treatment was performed in a nitrogen atmosphere at 250° C. for one hour.

Next, although not illustrated, a conductive film connected to parts of the conductive films 21*a* and 21*b* was formed.

Here, a 100-nm-thick ITO film containing silicon oxide was formed by a sputtering method. After that, heat treatment was performed at 250° C. in a nitrogen atmosphere for one hour.

Through the above process, Sample B1 including a transistor was formed.

In addition, Sample B2 including the transistor was fabricated where the oxide semiconductor film 19*a* and the conductive films 21*a* and 21*b* included in the transistor of Sample B1 were changed.

The transistor included in Sample B2 includes a multilayer film instead of the oxide semiconductor film 19*a*. As the multilayer film, a 35-nm-thick first IGZO film and a 20-nm-thick second IGZO film were formed in this order by a sputtering method. Note that the atomic ratio of In to Ga and Zn contained in the sputtering target used for the first IGZO film was 1:1:1 and the deposition temperature was 300° C. and the atomic ratio of In to Ga and Zn contained in the sputtering target used for the second IGZO film was 1:4:5 and the deposition temperature was 200° C.

In the transistor included in Sample B2, as the conductive films 21*a* and 21*b*, a 50-nm-thick tungsten film and a 200-nm-thick copper film were formed in this order by a sputtering method.

In the transistor included in Sample B2, the following step was added between after the formation of the conductive films 21*a* and 21*b* and before the formation of the oxide insulating film 22, and thereby a silicide film was formed over the conductive films 21*a* and 21*b*. Their details are described below. The conductive films 21*a* and 21*b* were exposed to plasma generated in an ammonia atmosphere while being heated at 350° C., so that oxides on the surface of conductive films 21*a* and 21*b* were reduced. Then, the conductive films 21*a* and 21*b* were exposed to silane while being heated at 220° C. As a result, copper contained in the conductive films 21*a* and 21*b* acted as a catalyst, and silane was decomposed into Si and $H_2$, and $CuSi_x$ (x>0) film was formed on the surfaces of the conductive films 21*a* and 21*b*.

Furthermore, Sample B3 including a transistor was fabricated where the oxide semiconductor film 19*a* included in the transistor of Sample B1 was changed.

A 35-nm-thick IGZO film was formed as the oxide semiconductor film 19*a* in Sample B3 by a sputtering method. A sputtering target containing In, Ga, and Zn at the atomic ratio of 1:1:1 was used. The deposition temperature was 100° C. Note that each of the conductive films 21*a* and 21*b* was a stack of a 50-nm-thick tungsten film, a 400-nm-thick aluminum film, and a 100-nm-thick titanium film.

In addition, Sample B4 was fabricated where the oxide semiconductor film 19*a* and the conductive films 21*a* and 21*b* included in Sample B3 were changed.

A 35-nm-thick IGZO film was formed as the oxide semiconductor film 19*a* in Sample B4 by a sputtering method. A sputtering target containing In, Ga, and Zn at the atomic ratio of 1:1:1.2 was used. The deposition temperature was 25° C.

In the transistor included in Sample B4, as each of the conductive films 21*a* and 21*b*, a 50-nm-thick tungsten film and a 200-nm-thick copper film were formed in this order by a sputtering method.

Note that the transistor in each Sample has a channel-etched structure. In addition, a transistor having a channel length (L) of 3 μm and a channel width (W) of 50 μm and a transistor having a channel length (L) of 6 μm and a channel width (W) of 50 μm were fabricated.

Figure 41:
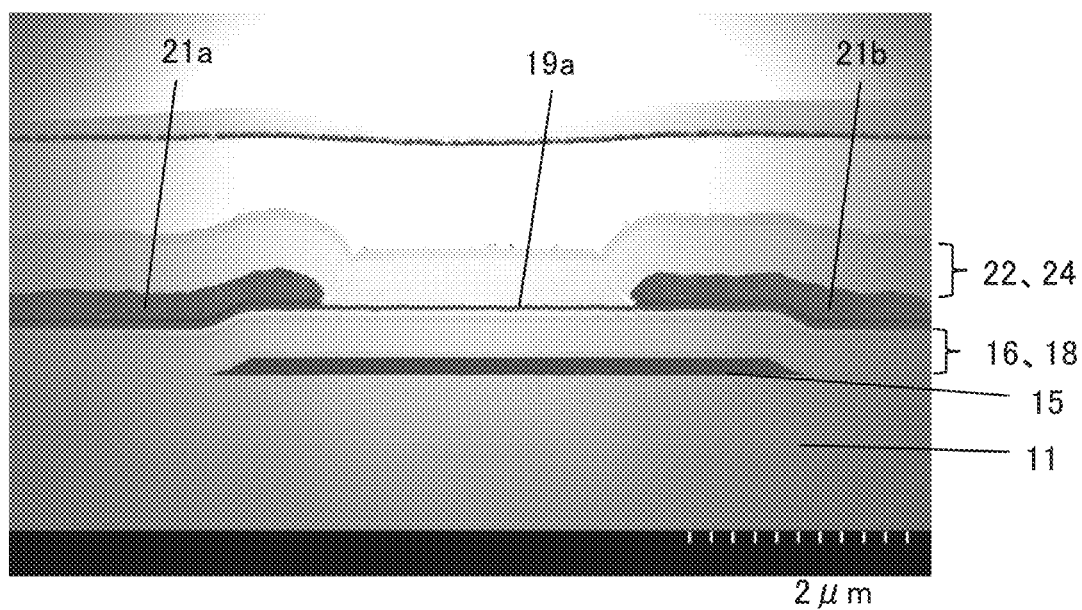
FIG. 41 is a cross-sectional STEM image of a transistor.

FIG. 41 is a cross-sectional STEM image of the transistor having a channel length (L) of 3 μm in Sample B1.

Next, initial Vg-Id characteristics of the transistors included in Sample B1 to Sample B4 were measured. Here, change in characteristics of current flowing between a source and a drain hereinafter referred to as the drain current, that is, Vg-Id characteristics were measured under the following conditions: the substrate temperature was 25° C., the potential difference between the source electrode and the drain electrode (hereinafter referred to as the drain voltage) was 1 V or 10 V, and the potential difference between the source electrode and the gate electrode (hereinafter referred to as the gate voltage) was changed from −15V to +15 V, inclusive.

Figure 42:
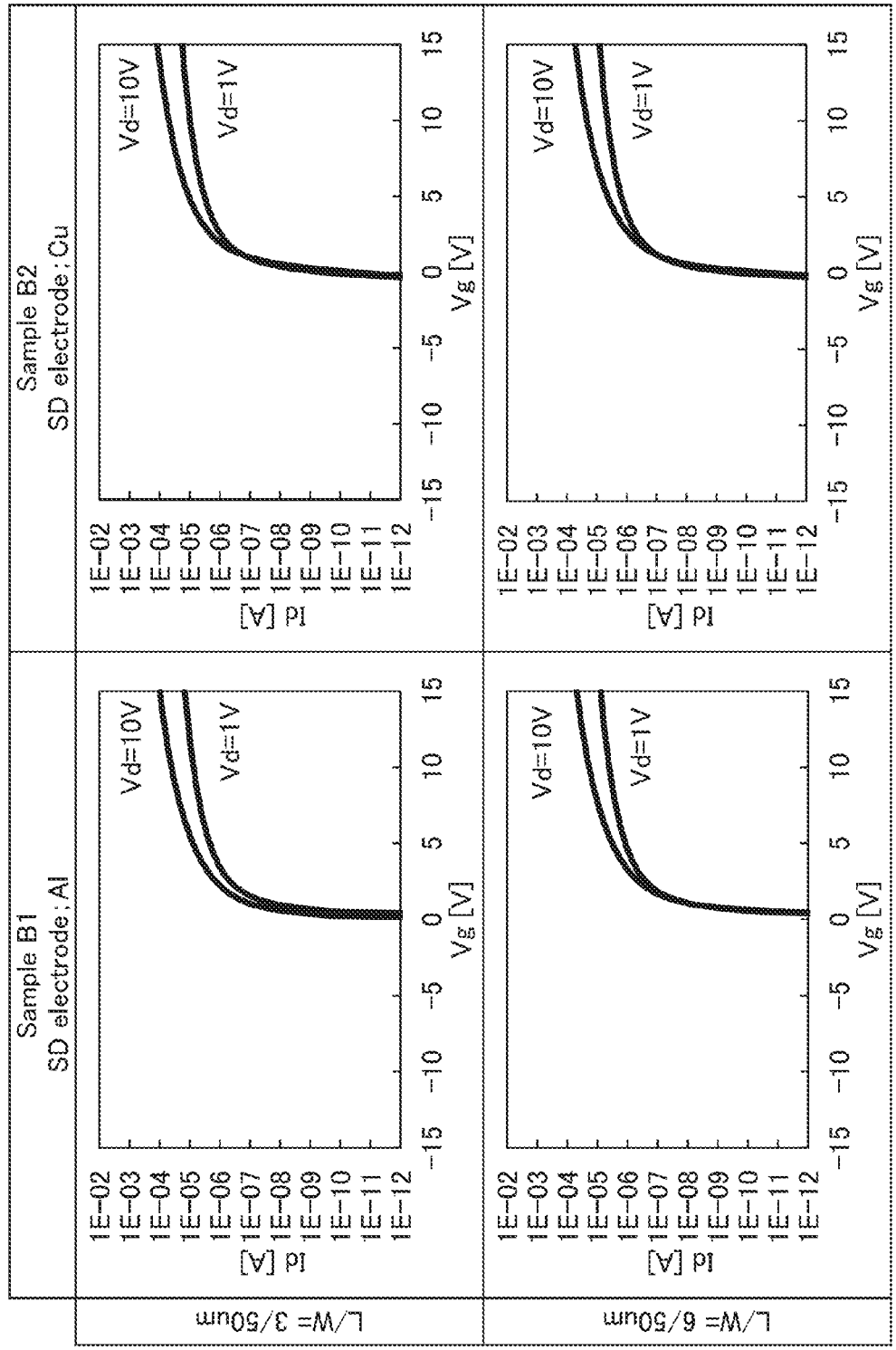
FIG. 42 shows electrical characteristics of a transistor.
Figure 43:
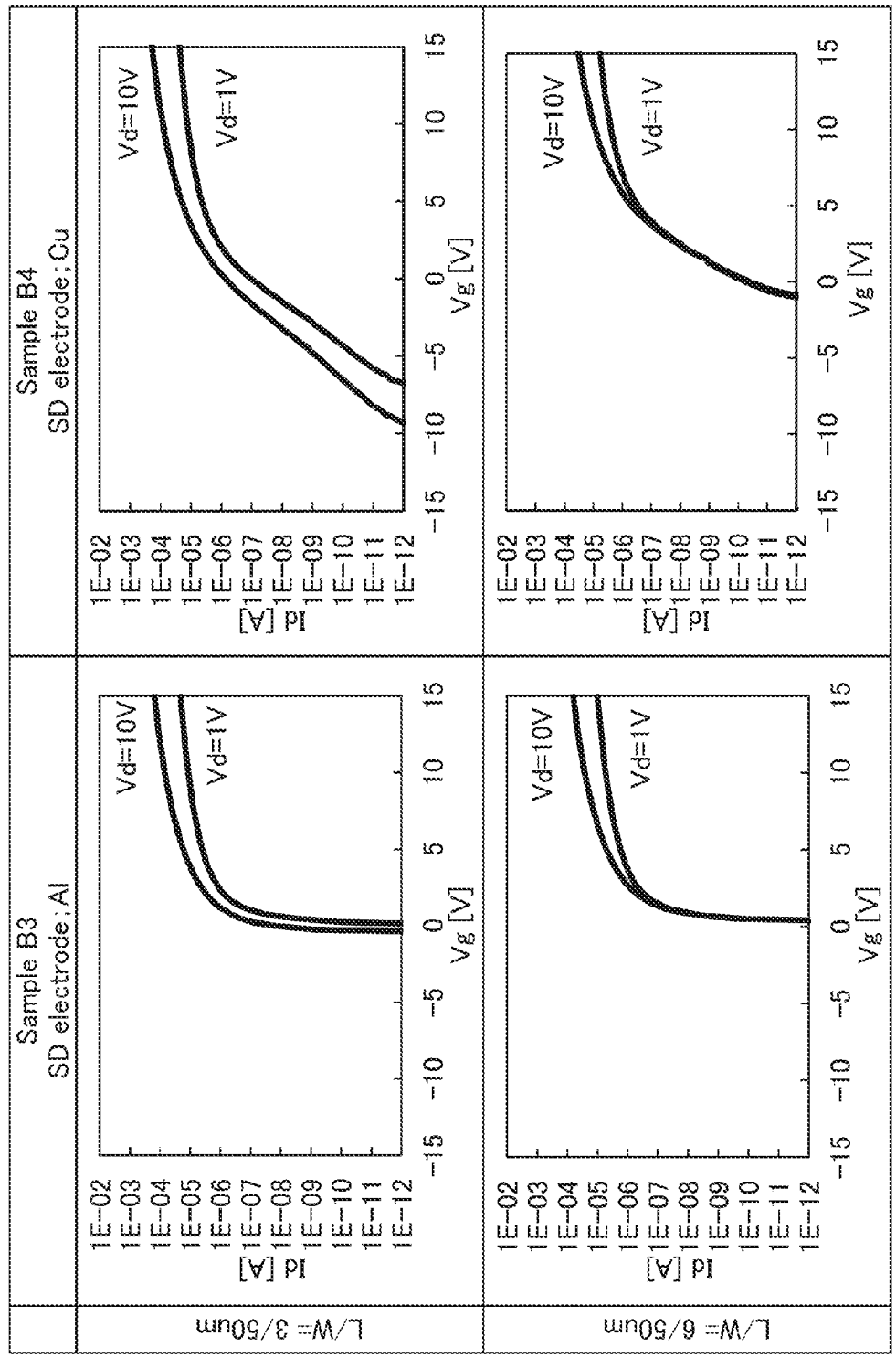
FIG. 43 shows electrical characteristics of a transistor.

FIG. 42 shows Vg-Id characteristics of the transistor included in Sample B1 and Sample B2. FIG. 43 shows Vg-Id characteristics of the transistor included in Sample B3 and Sample B4. In the graphs of FIG. 42 and FIG. 43, the horizontal axis indicates a gate voltage Vg and the vertical axis indicates a drain current Id. In addition, the solid lines show Vg-Id characteristics at 1 V and 10 V of the drain voltage Vd.

As shown in FIG. 42, the transistors included in Sample B1 and Sample B2 have superior switching characteristics. In other words, the transistors included in Sample B1 and Sample B2 exhibit superior Vg-Id characteristics, even though metal elements included in the conductive films 21*a* and 21*b* are different.

On the other hand, as shown in FIG. 43, the threshold voltage is shifted to the negative side in the Vg-Id characteristics of the transistor included in Sample B4. In addition, the drain current shows gradual rise in the vicinity of the threshold voltage. That is, the S value (subthreshold swing) becomes worse. In other words, the Vg-Id characteristics of the transistors included in Sample B3 and Sample B4 are degraded due to the metal element included in the conductive films 21*a* and 21*b*.

The structure of the IGZO films, and the film density and Vg-Id characteristics of the transistors included in Sample B2 and Sample B4 were examined. In Sample B2, the IGZO film was formed over the substrate so as to be in contact with the conductive films 21*a* and 21*b*. The sample is referred to as Sample B2a. In addition, in Sample B4, the IGZO film was formed over the substrate so as to be in contact with the conductive films 21*a* and 21*b*. The sample is referred to as Sample B4a. Then, the structure analysis of the IGZO film in each sample was conducted with a X-ray diffraction (XRD) device. In addition, the film density of the IGZO film in each sample was conducted by X-ray reflectometry (XRR).

Figure 44A:
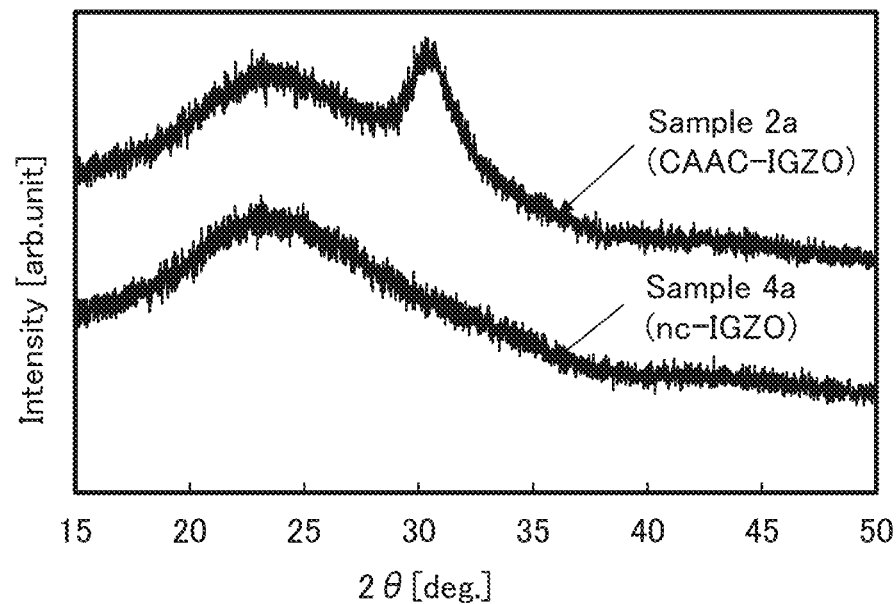
FIGS. 44A and 44B are XRD and XRR measurement results of an IGZO film.
Figure 44B:
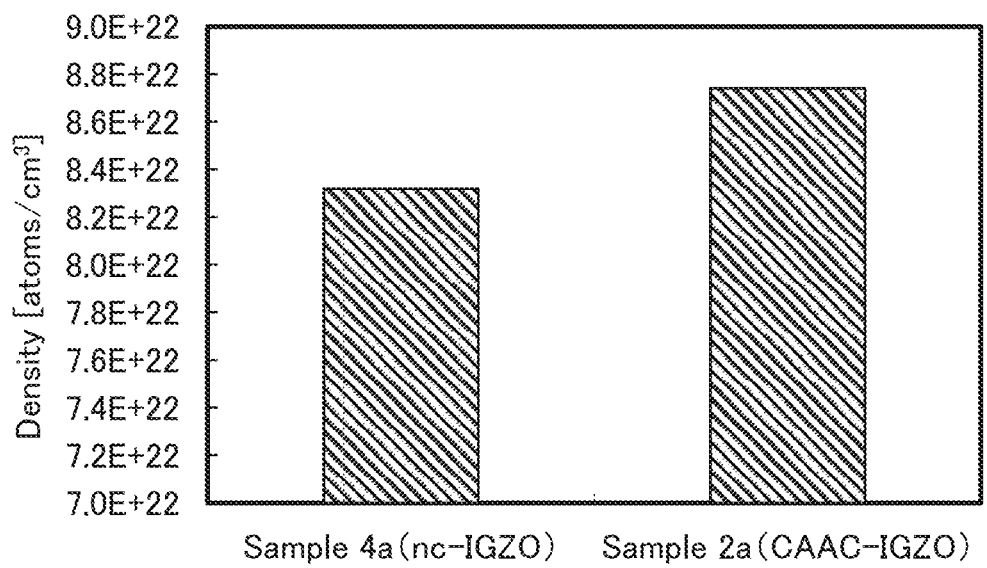

The XRD measurement results of the IGZO film included in Sample 2a and the IGZO film included in Sample 4a are shown in FIG. 44A, and the XRR measurement results of the IGZO film included in Sample 2a and the IGZO film included in Sample 4a are shown in FIG. 44B.

As shown in FIG. 44A, the IGZO film included in Sample 2a is a CAAC-IGZO film, because its diffraction angle (2θ)

has a peak at around 31°. On the other hand, the IGZO film included in Sample 4a is an nc-IGZO film because its diffraction angle (2θ) does not have a peak at around 31°.

As shown in FIG. 44B, the film density of the IGZO film included in Sample 2a is higher than that of the IGZO film included in Sample 4a.

The transistor included in Sample B4 has an nc-IGZO film as the IGZO film being in contact with the conductive films 21a and 21b. In addition, the film density of the nc-IGZO film is low. For this reason, it is thought that copper contained in the conductive films 21a and 21b is easily diffused into the interface between the oxide insulating film 16 functioning as a gate insulating film and the oxide semiconductor film 19a. Due to copper diffusion, carrier traps are formed at the interface between the oxide insulating film 16 and the oxide semiconductor film 19a. As a result, the S value (subthreshold swing) becomes worse in the Vg-d characteristics of the transistor included in Sample B4.

On the other hand, the transistor included in Sample B2 has a multilayer film and in the multilayer film, the IGZO film in contact with the conductive films 21a and 21b is a CAAC-IGZO film. The CAAC-IGZO film has a high film density, a layer structure, and no grain boundary. Thus, it is thought that the CAAC-IGZO film functions as a barrier film against copper, and copper contained in the conductive films 21a and 21b can be prevented from diffusing into the channel region. In addition, a silicide film is formed on the surface of the conductive films 21a and 21b, and thus the silicide film can prevent copper from diffusing from the conductive films 21a and 21b. As a result, the transistor included in Sample B2 exhibits superior Vg-Id characteristics, irrespective of the metal element contained in the conductive films 21a and 21b.

As described above, when copper films are used for the conductive films 21a and 21b, the CAAC-IGZO is used as the oxide semiconductor film in contact with the conductive films 21a and 21b, and thereby a transistor having superior electrical characteristics can be manufactured.

REFERENCE NUMERALS

F1a: electric field, F1b: electric field, F2a: electric field, F2b: electric field, F3: electric field, 1: substrate, 2: conductive film, 3: insulating film, 4: semiconductor film, 4a: semiconductor film, 4b: semiconductor film, 5: pixel electrode, 5a: pixel electrode, 5b: pixel electrode, 6: conductive film, 6a: conductive film, 6b: conductive film, 7: conductive film, 7a: conductive film, 7b: conductive film, 8: insulating film, 8a: insulating film, 8b: insulating film, 9: common electrode, 9a: region, 9b: region, 9c: connection portion, 9d: direction, 9e: direction, 9f: bent portion, 10: dashed-dotted line, 11: substrate, 12: conductive film, 13: conductive film, 15: nitride insulating film, 16: oxide insulating film, 17: oxide insulating film, 18: oxide semiconductor film, 19a: oxide semiconductor film, 19b: pixel electrode, 19c: oxide semiconductor film, 19f: oxide semiconductor film, 20: conductive film, 21a: conductive film, 21b: conductive film, 21b_1: region, 21b_2: region, 21c: common line, 22: oxide insulating film, 23: oxide insulating film, 24: oxide insulating film, 25: oxide insulating film, 26: oxide insulating film, 26b: insulating film, 27: nitride insulating film, 28: conductive film, 29: common electrode, 29a: common electrode, 29a_1: region, 29a_2: region, 29b: conductive film, 30: common electrode, 37a: multilayer film, 37b: multilayer film, 38a: multilayer film, 38b: multilayer film, 39a: oxide semiconductor film, 39b: oxide semiconductor film, 40: opening, 41a: opening, 42: opening, 49a: oxide semiconductor film, 49b: oxide semiconductor film, 60: insulating film, 61: substrate, 62: light-blocking film, 63: coloring film, 64: insulating film, 65: insulating film, 66: liquid crystal layer, 67: conductive film, 69: common electrode, 70: oxide semiconductor film, 71: oxide semiconductor film, 73: nitride insulating film, 75: oxide conductor film, 101: pixel portion, 102: transistor, 102a: transistor, 102b: transistor, 102c: transistor, 103: pixel, 103a: pixel, 103b: pixel, 103c: pixel, 103d: pixel, 103e: pixel, 103f: pixel, 104: scan line driver circuit, 105: capacitor, 105a: capacitor, 105b: capacitor, 105c: capacitor, 106: signal line driver circuit, 107: conductive film, 109: conductive film, 115: common line, 121: liquid crystal element, 1001: main body, 1002: housing, 1003a: display portion, 1003b: display portion, 1004: keyboard button, 1021: main body, 1022: fixing portion, 1023: display portion, 1024: operation button, 1025: external memory slot, 1030: housing, 1031: housing, 1032: display panel, 1033: speaker, 1034: microphone, 1035: operation key, 1036: pointing device, 1037: camera, 1038: external connection terminal, 1040: solar cell, 1041: external memory slot, 1050: television set, 1051: housing, 1052: storage medium recording and reproducing portion, 1053: display portion, 1054: external connection terminal, 1055: stand, 1056: external memory, 8000: display module, 8001: upper cover, 8002: lower cover, 8003: FPC, 8004: touch panel, 8005: FPC, 8006: display panel, 8007: backlight unit, 8008: light source, 8009: frame, 8010: printed board, and 8011: battery.

This application is based on Japanese Patent Application serial no. 2013-190864 filed with Japan Patent Office on Sep. 13, 2013, Japanese Patent Application serial no. 2013-249904 filed with Japan Patent Office on Dec. 3, 2013, Japanese Patent Application serial no. 2014-047241 filed with Japan Patent Office on Mar. 11, 2014, and Japanese Patent Application serial no. 2014-106477 filed with Japan Patent Office on May 22, 2014, the entire contents of which are hereby incorporated by reference.

The invention claimed is:

1. A display device comprising:
a signal line;
a scan line;
a transistor;
a pixel electrode; and
a common electrode having a zigzag shape so that the common electrode crosses the signal line,
wherein the transistor is electrically connected to the signal line, the scan line, and the pixel electrode,
wherein the common electrode comprises a first region overlapping with the signal line and a second region overlapping with the pixel electrode,
wherein an extending direction of the first region differs from an extending direction of the second region, and
wherein a connection portion of the first region and the second region is located between the signal line and the pixel electrode in a planar shape.

2. The display device according to claim 1,
wherein an inner angle formed by the first region and the second region in a planar shape has a first angle,
wherein an angle formed by the extending direction of the first region and a perpendicular of the signal line in a planar shape has a second angle,
wherein the first angle is greater than 90° and less than 180°,
wherein the second angle is greater than 0° and less than 90°, and
wherein the sum of the first angle and the second angle is greater than 135° and less than 180°.

3. The display device according to claim 1, further comprising:
a liquid crystal element, a first terminal of the liquid crystal element electrically connected to the pixel electrode, and a second terminal of the liquid crystal element electrically connected to the common electrode.

4. A display device comprising:
a first insulating film over a gate electrode;
a semiconductor film over the first insulating film, the semiconductor film overlapping with the gate electrode;
a pixel electrode over the first insulating film, the pixel electrode electrically connected to the semiconductor film;
a signal line electrically connected to the semiconductor film;
a second insulating film over the pixel electrode; and
a common electrode over the second insulating film, the common electrode having a zigzag shape so that the common electrode crosses the signal line,
wherein the common electrode comprises a first region overlapping with the signal line and a second region overlapping with the pixel electrode,
wherein an extending direction of the first region differs from an extending direction of the second region, and
wherein a connection portion of the first region and the second region is located between the signal line and the pixel electrode in a planar shape.

5. The display device according to claim 4,
wherein an inner angle formed by the first region and the second region in a planar shape has a first angle,
wherein an angle formed by the extending direction of the first region and a perpendicular of the signal line in a planar shape has a second angle,
wherein the first angle is greater than 90° and less than 180°,
wherein the second angle is greater than 0° and less than 90°, and
wherein the sum of the first angle and the second angle is greater than 135° and less than 180°.

6. The display device according to claim 4, further comprising:
a third insulating film over the semiconductor film, the pixel electrode, and the signal line; and
a liquid crystal layer over the third insulating film.

7. The display device according to claim 4, further comprising:
a scan line including the gate electrode.

8. The display device according to claim 4, further comprising:
an oxide insulating film between the semiconductor film and the second insulating film, the oxide insulating film overlapping with the semiconductor film,
wherein the oxide insulating film has an opening through which part of the pixel electrode is exposed.

9. The display device according to claim 4,
wherein the semiconductor film is in contact with a surface of the first insulating film, and
wherein the pixel electrode is in contact with the surface of the first insulating film.

10. The display device according to claim 4, wherein the semiconductor film and the pixel electrode have a multilayer structure.

11. A display device comprising:
a first insulating film over a gate electrode;
an oxide semiconductor film over the first insulating film, the oxide semiconductor film overlapping with the gate electrode;
a pixel electrode over the first insulating film, the pixel electrode electrically connected to the oxide semiconductor film;
a signal line electrically connected to the oxide semiconductor film;
a second insulating film over the pixel electrode; and
a common electrode over the second insulating film, the common electrode having a zigzag shape so that the common electrode crosses the signal line,
wherein the common electrode comprises a first region overlapping with the signal line and a second region overlapping with the pixel electrode,
wherein an extending direction of the first region differs from an extending direction of the second region, and
wherein a connection portion of the first region and the second region is located between the signal line and the pixel electrode in a planar shape.

12. The display device according to claim 11,
wherein an inner angle formed by the first region and the second region in a planar shape has a first angle,
wherein an angle formed by the extending direction of the first region and a perpendicular of the signal line in a planar shape has a second angle,
wherein the first angle is greater than 90° and less than 180°,
wherein the second angle is greater than 0° and less than 90°, and
wherein the sum of the first angle and the second angle is greater than 135° and less than 180°.

13. The display device according to claim 11, further comprising:
a third insulating film over the oxide semiconductor film, the pixel electrode, and the signal line; and
a liquid crystal layer over the third insulating film.

14. The display device according to claim 11, further comprising:
a scan line including the gate electrode.

15. The display device according to claim 11, further comprising:
an oxide insulating film between the oxide semiconductor film and the second insulating film, the oxide insulating film overlapping with the oxide semiconductor film,
wherein the oxide insulating film has an opening through which part of the pixel electrode is exposed.

16. The display device according to claim 11,
wherein the oxide semiconductor film is in contact with a surface of the first insulating film, and
wherein the pixel electrode is in contact with the surface of the first insulating film.

17. The display device according to claim 11, wherein the oxide semiconductor film and the pixel electrode have a multilayer structure.

18. The display device according to claim 11, wherein the oxide semiconductor film and the pixel electrode each comprise indium and zinc.

* * * * *